(12) United States Patent
Shinohara

(10) Patent No.: US 9,837,427 B2
(45) Date of Patent: Dec. 5, 2017

(54) SEMICONDUCTOR DEVICE AND METHOD OF MANUFACTURING THE SAME

(71) Applicant: Renesas Electronics Corporation, Tokyo (JP)

(72) Inventor: Masaaki Shinohara, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/412,465

(22) Filed: Jan. 23, 2017

(65) Prior Publication Data

US 2017/0221917 A1 Aug. 3, 2017

(30) Foreign Application Priority Data

Feb. 3, 2016 (JP) ................................. 2016-018589

(51) Int. Cl.
*H01L 21/8234* (2006.01)
*H01L 21/266* (2006.01)
(Continued)

(52) U.S. Cl.
CPC .... *H01L 27/11568* (2013.01); *G11C 16/0466* (2013.01); *G11C 16/10* (2013.01); *G11C 16/14* (2013.01); *G11C 16/26* (2013.01); *H01L 21/0217* (2013.01); *H01L 21/02164* (2013.01); *H01L 21/266* (2013.01); *H01L 21/26513* (2013.01); *H01L 21/28282* (2013.01); *H01L 21/31111* (2013.01); *H01L 21/823418* (2013.01); *H01L 21/823437* (2013.01); *H01L 21/823468* (2013.01);
(Continued)

(58) Field of Classification Search
CPC ......... H01L 27/11568; H01L 27/11573; H01L 21/02164; H01L 21/0217; H01L 21/26513; H01L 21/266; H01L 21/28282; H01L 21/31111
See application file for complete search history.

(56) References Cited

U.S. PATENT DOCUMENTS

2004/0212019 A1   10/2004   Shinohara et al.
2013/0149854 A1*  6/2013    Ishii ..................... H01L 21/82
                                                                  438/587
(Continued)

FOREIGN PATENT DOCUMENTS

JP     2004-349680 A     12/2004
JP     2014-075557 A     4/2014

*Primary Examiner* — Christine Enad
(74) *Attorney, Agent, or Firm* — Sughrue Mion, PLLC

(57) ABSTRACT

Deterioration in reliability is prevented regarding a semiconductor device. The deterioration is caused when an insulating film for formation of a sidewall is embedded between gate electrodes at the time of forming sidewalls having two kinds of different widths on a substrate. A sidewall-shaped silicon oxide film is formed over each sidewall of a gate electrode of a low breakdown voltage MISFET and a pattern including a control gate electrode and a memory gate electrode. Then, a silicon oxide film beside the gate electrode is removed, and a silicon oxide film is formed on a semiconductor substrate, and then etchback is performed. Accordingly, a sidewall, formed of a silicon nitride film and the silicon oxide film, is formed beside the gate electrode, and a sidewall, formed of the silicon nitride film and the silicon oxide films, is formed beside the pattern.

15 Claims, 55 Drawing Sheets

(51) Int. Cl.

| | |
|---|---|
| *H01L 27/11568* | (2017.01) |
| *H01L 21/311* | (2006.01) |
| *H01L 21/265* | (2006.01) |
| *H01L 29/66* | (2006.01) |
| *H01L 21/02* | (2006.01) |
| *G11C 16/10* | (2006.01) |
| *G11C 16/14* | (2006.01) |
| *G11C 16/26* | (2006.01) |
| *H01L 27/11573* | (2017.01) |
| *H01L 21/28* | (2006.01) |
| *H01L 29/792* | (2006.01) |
| *H01L 29/423* | (2006.01) |
| *G11C 16/04* | (2006.01) |

(52) U.S. Cl.
CPC .. *H01L 27/11573* (2013.01); *H01L 29/42344* (2013.01); *H01L 29/66545* (2013.01); *H01L 29/66575* (2013.01); *H01L 29/66833* (2013.01); *H01L 29/792* (2013.01)

(56) References Cited

U.S. PATENT DOCUMENTS

| | | | |
|---|---|---|---|
| 2014/0099767 A1* | 4/2014 | Maekawa | H01L 21/26513 438/305 |
| 2014/0239377 A1* | 8/2014 | Nishida | H01L 29/792 257/324 |
| 2014/0302646 A1* | 10/2014 | Hirano | H01L 21/823456 438/197 |
| 2016/0293616 A1* | 10/2016 | Nagai | H01L 27/11526 |

* cited by examiner

FIG. 30

| | OPERATION METHOD WRITING/ERASING | WRITING OPERATION VOLTAGE (V) Vmg/Vs/Vcg/Vd/Vb | ERASING OPERATION VOLTAGE (V) Vmg/Vs/Vcg/Vd/Vb | READING OPERATION VOLTAGE (V) Vmg/Vs/Vcg/Vd/Vb |
|---|---|---|---|---|
| A | SSI(WRITING)/BTBT(ERASING) | 10/5/1/0.5/0 | −6/6/0/open/0 | 0/0/1.5/1.5/0 |
| B | SSI(WRITING)/FN(ERASING) | 10/5/1/0.5/0 | 12/0/0/0/0 | 0/0/1.5/1.5/0 |
| C | FN(WRITING)/BTBT(ERASING) | −12/0/0/0/0 | −6/6/0/open/0 | 0/0/1.5/1.5/0 |
| D | FN(WRITING)/FN(ERASING) | −12/0/0/0/0 | 12/0/0/0/0 | 0/0/1.5/1.5/0 |

SEMICONDUCTOR DEVICE AND METHOD OF MANUFACTURING THE SAME

CROSS-REFERENCE TO RELATED APPLICATION

The present application claims priority from Japanese Patent Application No. 2016-018589 filed on Feb. 3, 2016, the content of which is hereby incorporated by reference into this application.

TECHNICAL FIELD OF THE INVENTION

The present invention relates to a semiconductor device and a method of manufacturing the same, and can be used for manufacture of a semiconductor device which includes a low breakdown voltage transistor and a high breakdown voltage transistor, for example.

BACKGROUND OF THE INVENTION

A metal insulator semiconductor field effect transistor (MISFET or MIS field effect transistor) has been known as a semiconductor element which is used as a switching element or the like. Examples of the MISFET include a low breakdown voltage MISFET which is used in a peripheral circuit such as a logic circuit and a high breakdown voltage MISFET which is used in a memory cell or for input and output of power, and these MISFETs are consolidated in a single semiconductor chip in some cases.

Japanese Patent Application Laid-Open Publication No. 2004-349680 (Patent Document 1) and Japanese Patent Application Laid-Open Publication No. 2014-075557 (Patent Document 2) describe techniques of forming a relatively wide sidewall that covers sidewalls of agate electrode of a transistor and a relatively narrow sidewall that covers sidewalls of a gate electrode of another transistor.

SUMMARY OF THE INVENTION

In the case of forming the low breakdown voltage MISFET and the high breakdown voltage MISFET on a semiconductor substrate, a method is considered in which a relatively wide sidewall is formed over sidewalls of gate electrodes of these MISFET's, and then, a relatively narrow sidewall is formed by reducing a width of the sidewall covering the sidewalls of the gate electrode of the low breakdown voltage MISFET using etching or the like.

However, when an interval between the gate electrodes of a plurality of the low breakdown voltage MISFET's, used in a logic circuit or the like, is reduced along with miniaturization of a semiconductor device, there is a risk that a gap between the gate electrodes is embedded by the sidewall at the time of forming the relatively wide sidewall. When the gap between the gate electrodes is embedded by the sidewall, it is difficult to reduce the width of the sidewall that covers the sidewalls of the gate electrodes of the low breakdown voltage MISFET using the etching or the like thereafter, which causes a problem that it is difficult to normally form the low breakdown voltage MISFET.

Other object and novel characteristics of the present invention will be apparent from the description of the present specification and the accompanying drawings.

The typical summary of the inventions disclosed in the present application will be briefly described as follows.

In a semiconductor device according to an embodiment, an insulating film, in contact with sidewalls of a metal gate electrode, is configured using a silicon nitride film. An insulating film, in contact with sidewalls of a charge storage film below a memory gate electrode of a split-gate type MONOS memory, is formed of a silicon oxide film.

In addition, in a method of manufacturing a semiconductor device according to another embodiment, a silicon nitride film and a first silicon oxide film are sequentially formed so as to cover each sidewall of a first gate electrode and a second gate electrode. Then, a first silicon oxide film covering the sidewall of the first gate electrode is removed. Thereafter, a second silicon oxide film covering the respective sidewalls of the first gate electrode and the second gate electrode is formed. Accordingly, a first sidewall including the silicon nitride film and the second silicon oxide film, which covers the sidewall of the first gate electrode, and a second sidewall including the silicon nitride film, the first silicon oxide film, and the second silicon oxide film, which cover the sidewall of the second gate electrode, are formed.

According to an embodiment, it is possible to improve the performance of the semiconductor device.

BRIEF DESCRIPTIONS OF THE DRAWINGS

FIG. 30 is a table illustrating an example of an application condition of a voltage to each portion of a selected memory cell during "programming", "erase" and "read";

DESCRIPTIONS OF THE PREFERRED EMBODIMENTS

Figure 1:
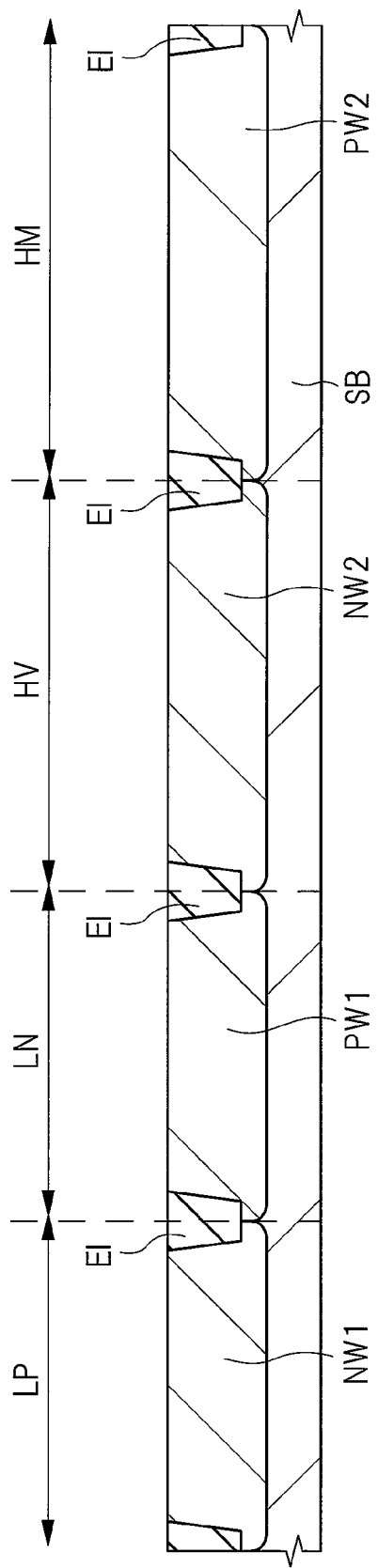
FIG. 1 is a cross-sectional view during a process of manufacturing a semiconductor device according to a first embodiment.

Hereinafter, embodiments of the present invention will be described in detail with reference to the accompanying drawings. Note that components having the same function are denoted by the same reference symbols throughout all the drawings for describing the embodiments, and the repetitive description thereof will be omitted. Also, in the following embodiments, the description of the same or similar portion is not repeated in principle unless particularly required.

(First Embodiment)

A semiconductor device according to a first embodiment is a semiconductor device which is provided with a non-volatile memory (a non-volatile memory element, a flash memory, or a non-volatile semiconductor memory device). In the first embodiment and the following embodiments, the non-volatile memory will be described assuming a memory cell based on an n-channel MISFET.

In addition, polarities (a polarity of an applied voltage and a polarity of a carrier during program, erase and read) of the memory cell in the first embodiment and the following embodiments are given to describe an operation in the case of the memory cell based on the n-channel MISFET, and it is possible to obtain the same effect in principle when the memory cell is based on a p-channel MISFET by inverting the entire polarity of an applied potential and a conductivity type of the carrier.

<Process of Manufacturing Semiconductor Device According to First Embodiment>

Hereinafter, a description will be given regarding a method of manufacturing the semiconductor device according to the first embodiment with reference to FIGS. 1 to 28. FIGS. 1 to 28 are cross-sectional views during a process of manufacturing the semiconductor device according to this embodiment. FIGS. 1 to 4, and FIGS. 6 to 19 illustrate the cross-sectional views of a logic circuit region LP, a logic circuit region LN, an I/O region HV, and a memory cell region HM in this order from the left to the right of the drawings. These regions are delimited by the broken line in the drawings, and the respective regions are separated from each other. All the logic circuit regions LP and LN, the I/O region HV, and the memory cell region HM are present on a main surface of the same semiconductor substrate, and aligned with each other in a direction along the main surface. FIG. 5 is the cross-sectional view illustrating a part of FIG. 4 in an enlarged manner.

The logic circuit regions LP and LN and the I/O region HV are regions that form a peripheral circuit region. The peripheral circuit is a circuit excluding a non-volatile memory. The peripheral circuit is, for example, an input/output circuit, a power supply circuit or the like such as a control circuit, a sense amplifier, a column decoder, a row decoder, a module, or the like inside a memory module, and is a processor such as a CPU, various analog circuits, a memory module of static random access memory (SRAM), or an external input/output circuit outside the memory module.

The logic circuit region LP is a region that includes a p-channel MISFET having a low breakdown voltage to form the control circuit or the like. The logic circuit region LN is a region that includes an n-channel MISFET having a low breakdown voltage to form the control circuit or the like. The I/O region HV is a region that includes a p-channel MISFET having a high breakdown voltage to form a circuit, which performs input and output with respect to a device outside a semiconductor chip, or the power supply circuit. Here, the case of forming the p-channel MISFET in the I/O region HV is described, but the n-channel MISFET may be formed in the I/O region HV.

The memory cell region HM is a region for formation of a split-gate type metal oxide nitride oxide semiconductor (MONOS) memory. The MONOS memory is a non-volatile semiconductor memory device which is capable of electrically performing programming and erase, and includes a memory cell which is configured of two MISFETs that share source and drain regions with each other. The MONOS memory includes a trapping insulating film below a gate electrode of the MISFET, and is configured to set a charge storage state of the trapping insulating film as memory information and perform read using this information as a threshold of the transistor. The trapping insulating film indicates an insulating film (hereinafter, referred to as a charge storage film) which is capable of storing a charge, and examples thereof may include a silicon nitride film and the like. The memory is caused to operate as a memory element by shifting the threshold of the MISFET by injecting or releasing the charge into or from the charge storage region.

The MISFET, formed in each of the logic circuit regions LP and LN, is the low breakdown voltage MISFET that is driven with a lower voltage than the MISFET which is formed in each of the I/O region HV, and the memory cell region HM.

Examples of a method of forming a gate electrode of the logic circuit regions LP and LN include a method of using a so-called gate-last process in which a dummy gate electrode is formed on a substrate, and then, the dummy gate electrode is replaced with a metal gate electrode or the like. On the contrary, a description will be given herein regarding the case of using a gate-first process in which the metal gate electrode is formed from the beginning without providing the dummy gate electrode. Incidentally, the gate-last process will be described in Modification Examples 1 and 2 of this embodiment. In addition, a first method of forming an offset spacer will be described herein.

First, a semiconductor substrate SB, which includes the logic circuit regions LP and LN, the I/O region HV, and the memory cell region HM, is prepared in the process of manufacturing the semiconductor device according to the first embodiment as illustrated in FIG. 1. The semiconductor substrate SB is, for example, a monocrystalline silicon substrate. Subsequently, an element isolation region EI, which separates the logic circuit region LP, the logic circuit region LN, the I/O region HV, and the memory cell region HM from each other, is formed. The element isolation region EI is formed using an insulating film, which is embedded inside a trench formed in a main surface of the semiconductor substrate SB, and has a shallow trench isolation (STI) structure or a local oxidation of silicon (LOCOS) structure, for example.

Subsequently, wells NW1, PW1, NW2 and PW2 are formed in the main surface of the semiconductor substrate SB using a photolithography technique and an ion implantation method. The well NW1 is formed by implanting n-type impurities (for example, phosphorus (P) or arsenic (As)) into the main surface of the semiconductor substrate SB in the logic circuit region LP. The well PW1 is formed by implanting p-type impurities (for example, boron (B)) into the main surface of the semiconductor substrate SB in the logic circuit region LN. The well NW2 is formed by implanting n-type impurities (for example, phosphorus (P) or arsenic (As)) into the main surface of the semiconductor substrate SB in the I/O region HV. The well PW2 is formed by implanting p-type impurities (for example, boron (B)) into the main surface of the semiconductor substrate SB in the memory cell region HM.

Figure 2:
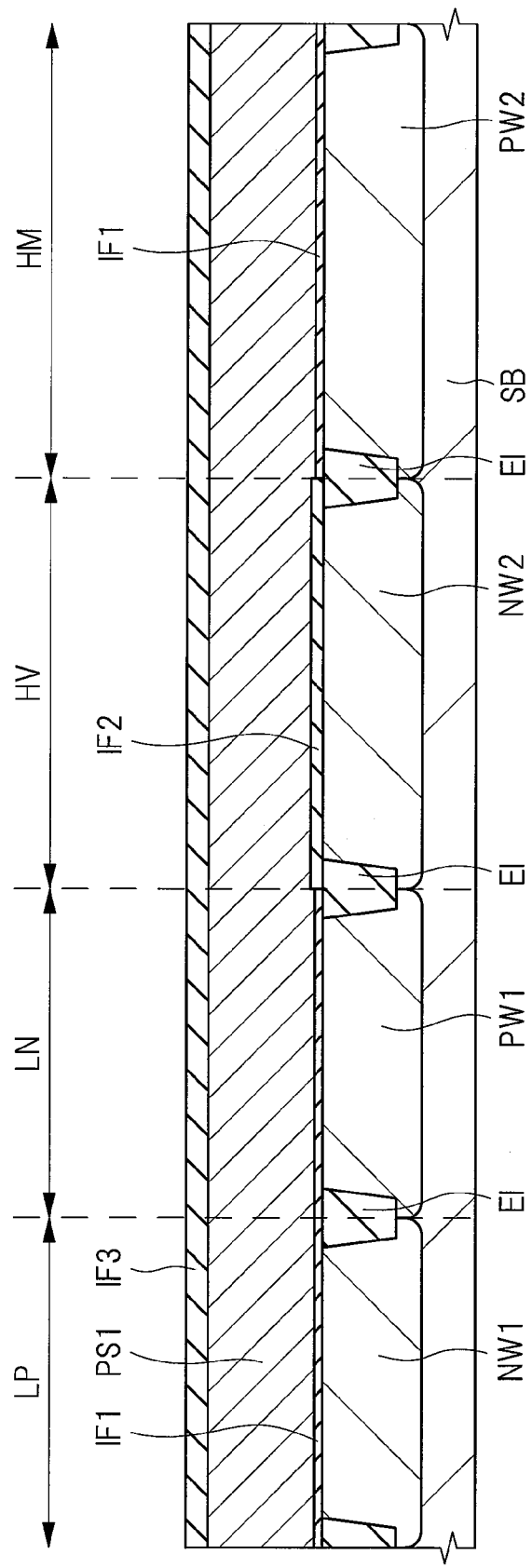
FIG. 2 is a cross-sectional view during the process of manufacturing the semiconductor device continued from FIG. 1.

Next, an insulating film IF1 is formed on the main surface of the semiconductor substrate SB in the logic circuit regions LP and LN and the memory cell region HM, and an insulating film IF2 is formed on the main surface of the semiconductor substrate SB in the I/O region HV as illustrated in FIG. 2. The insulating film IF2 has a larger film thickness than the insulating film IF1. For example, the following method is used in the case of forming the insulating films having the two kinds of film thicknesses in this manner. That is, the insulating film IF2, which is thick and made of a silicon oxide film, is formed on the semiconductor substrate SB using a chemical vapor deposition (CVD) method, and then, the insulating film IF2 except for the I/O region HV is removed by performing patterning using a photolithography technique and an etching method. Thereafter, the insulating film IF1, which is made of a silicon oxide film, is formed on the main surface of the semiconductor substrate SB in the logic circuit regions LP and LN and the memory cell region HM using, for example, a thermal oxidation method.

Although the description has been given regarding the case of forming the insulating film IF1, which has the same film thickness as the insulating film IF1 in the logic circuit regions LP and LN, in the memory cell region HM here, an insulating film, which has a different film thickness from the insulating film IF1 in the logic circuit regions LP and LN, may be formed on the main surface of the semiconductor substrate SB in the memory cell region HM.

Subsequently, a polysilicon film PS1 and an insulating film IF3 are sequentially formed on the main surface of the semiconductor substrate SB using, for example, a CVD method. The insulating film IF3 is formed of, for example, a silicon nitride film.

Figure 3:
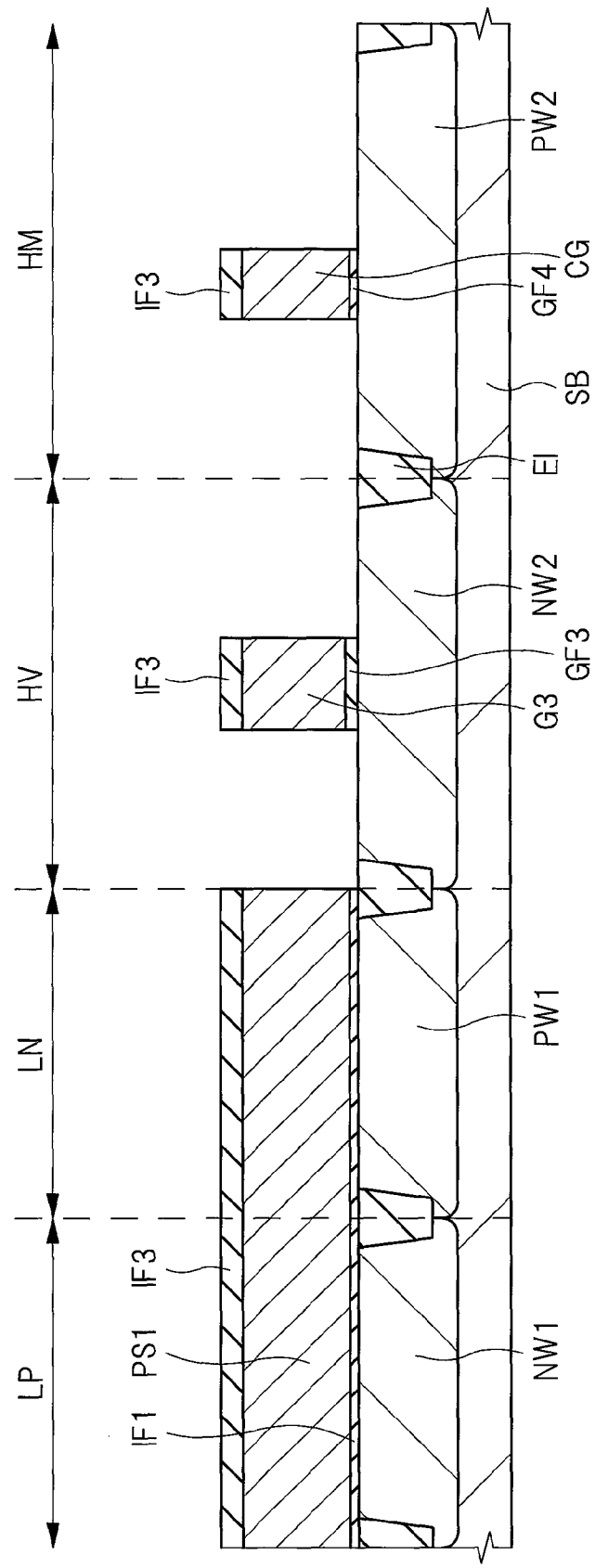
FIG. 3 is a cross-sectional view during the process of manufacturing the semiconductor device continued from FIG. 2.

Next, the insulating film IF3, the polysilicon film PS1, and the insulating films IF1 and IF2 in the I/O region HV and the memory cell region HM are patterned using a photolithography technique and a dry etching method as illustrated in FIG. 3. Accordingly, a gate insulating film GF3, formed using the insulating film IF2, and a gate electrode G3, formed using the polysilicon film PS1 on the insulating film IF2, are formed in the I/O region HV, and a gate insulating film GF4, formed using the insulating film IF1, and a control gate electrode CG, formed using the polysilicon film PS1 on the insulating film IF1, are formed in the memory cell region HM. Each upper surface of the gate electrode G3 and the control gate electrode CG is covered by the insulating film IF3. Here, the logic circuit regions LP and LN are not subjected to patterning.

Figure 4:
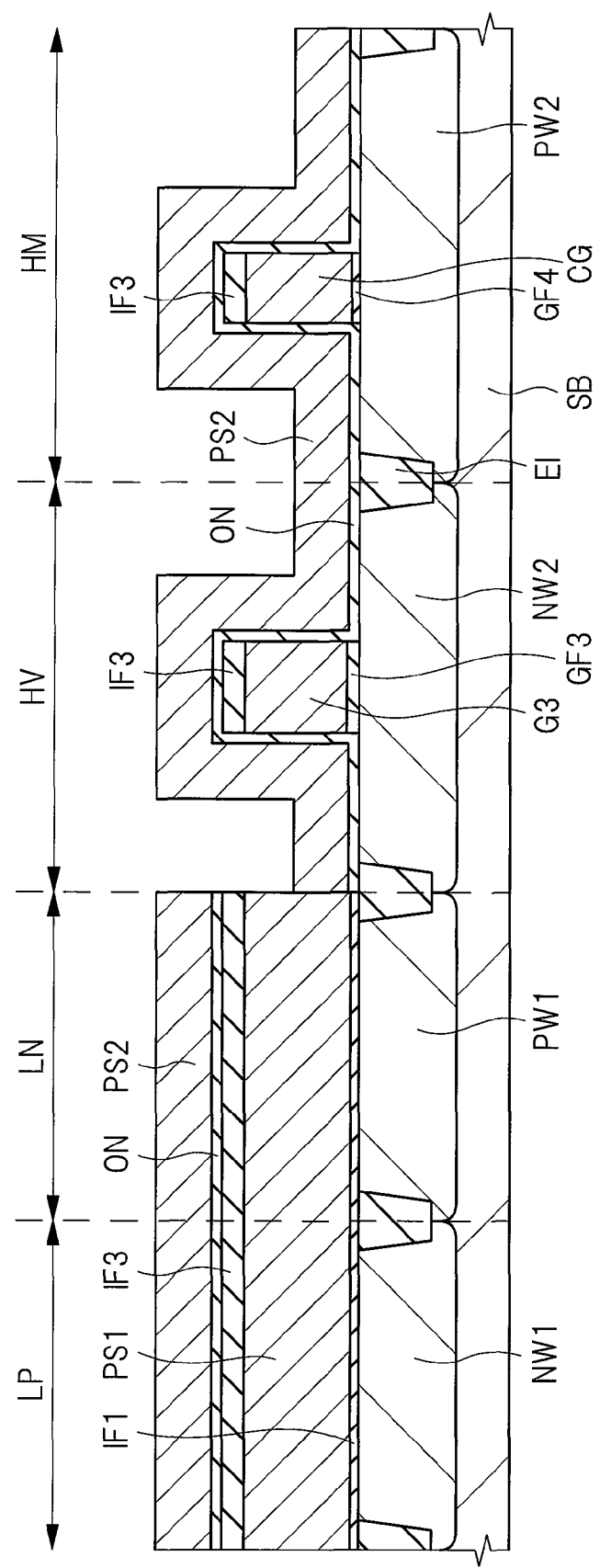
FIG. 4 is a cross-sectional view during the process of manufacturing the semiconductor device continued from FIG. 5.
Figure 5:
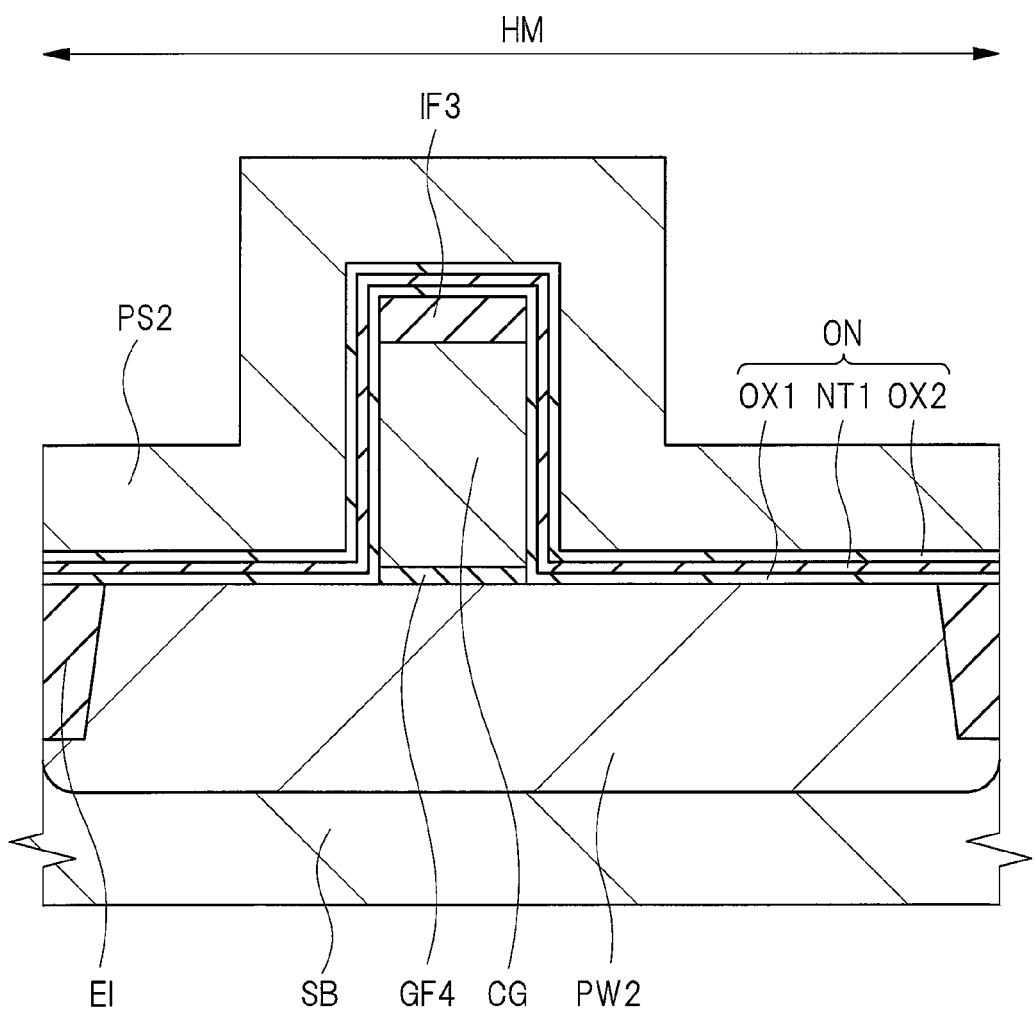
FIG. 5 is a cross-sectional view illustrating a part of FIG. 4 in an enlarged manner.

Next, an oxide nitride oxide (ONO) film ON and a polysilicon film PS2 are formed on the main surface of the semiconductor substrate SB using, for example, a CVD method as illustrated in FIG. 4. As illustrated in FIG. 5, the ONO film ON is formed of a silicon oxide film (bottom oxide film) OX1, a silicon nitride film (charge storage film) NT1, and a silicon oxide film (top oxide film) OX2 which are stacked in this order from the main surface side of the semiconductor substrate SB. The silicon oxide film OX1 is formed using, for example, a thermal oxidation method, and the silicon nitride film NT1 and the silicon oxide film OX2 are formed using, for example, a CVD method. Although FIGS. 4 and 6 to 28 illustrate the ONO film ON as a single film, the actual ONO film ON has a stacked structure as illustrated in FIG. 5.

Figure 6:
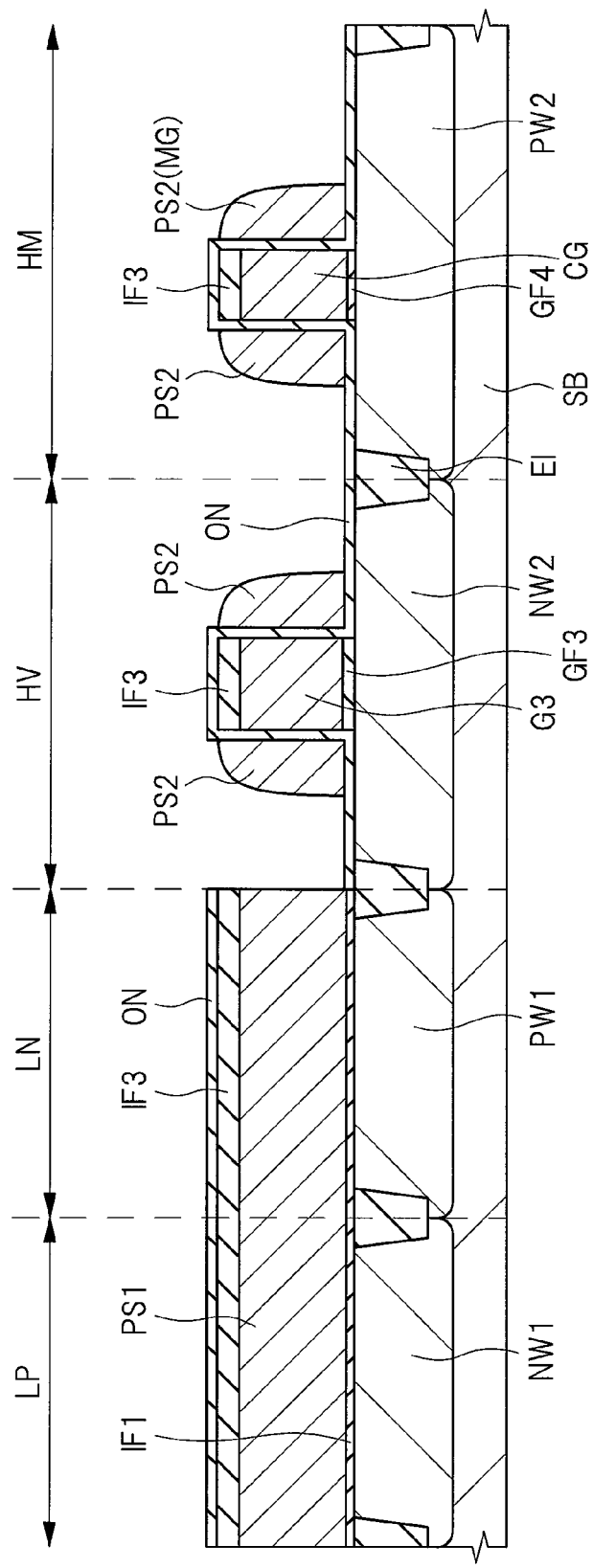
FIG. 6 is a cross-sectional view during the process of manufacturing the semiconductor device continued from FIG. 5.

Next, etchback (anisotropic etching) is performed to remove a part of the polysilicon film PS2 and to cause an upper surface of the ONO film ON to be exposed as illustrated in FIG. 6. Accordingly, the polysilicon film PS2 is left in a sidewall shape so as to cover each of sidewalls on both sides of the gate electrode G3 and sidewalls on both sides of the control gate electrode CG with the ONO film ON interposed therebetween. Incidentally, the polysilicon film PS2 that covers one sidewall of the control gate electrode CG forms a memory gate electrode MG.

Figure 7:
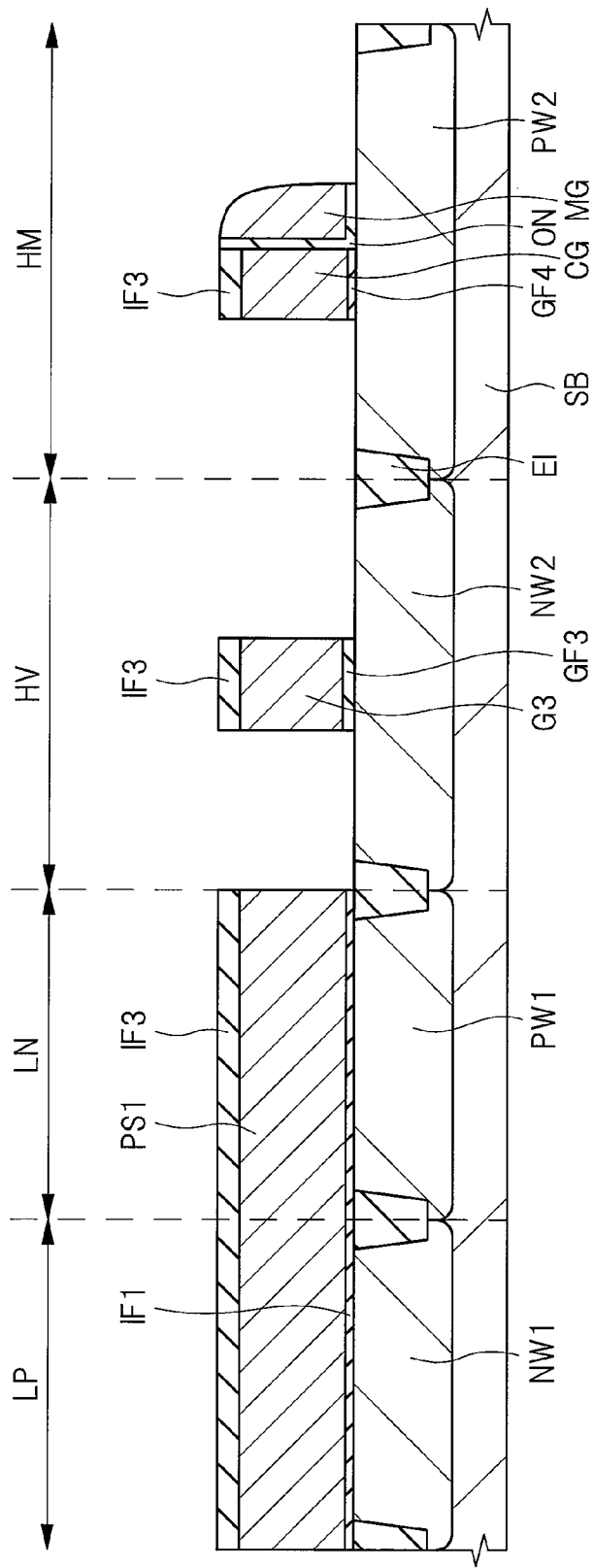
FIG. 7 is a cross-sectional view during the process of manufacturing the semiconductor device continued from FIG. 6.

Next, the polysilicon film PS2 is removed while leaving the polysilicon film PS2 that covers the one sidewall of the control gate electrode CG, that is, the memory gate electrode MG, as illustrated in FIG. 7, using a photolithography technique and a dry etching method. Subsequently, etching is performed using the memory gate electrode MG as a mask to remove the ONO film ON which is exposed from the memory gate electrode MG. Accordingly, the main surface of the semiconductor substrate SB and the surface of the insulating film IF3 are exposed.

Figure 8:
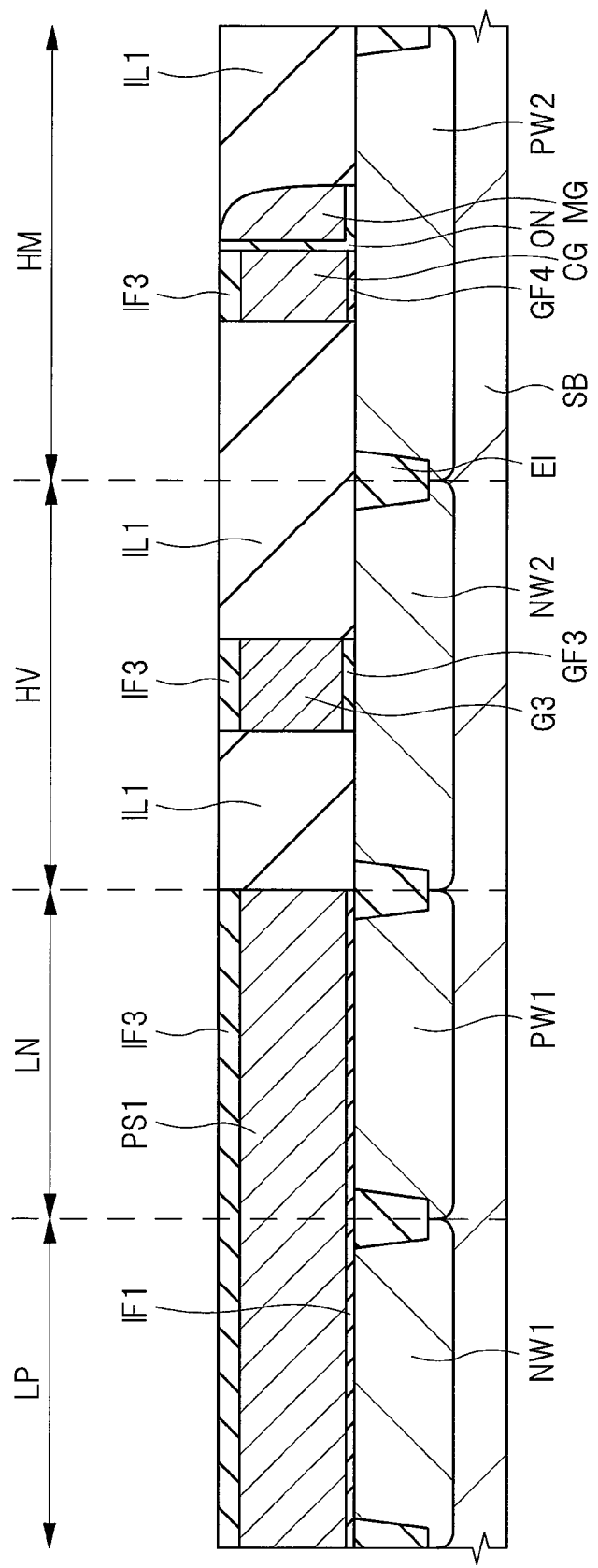
FIG. 8 is a cross-sectional view during the process of manufacturing the semiconductor device continued from FIG. 7.

Next, an interlayer insulating film IL1, made of a silicon oxide film, is formed on the main surface of the semiconductor substrate SB using, for example, a CVD method, then, an upper surface of the interlayer insulating film IL1 is polished using a chemical mechanical polishing (CMP) method, thereby causing an upper surface of the insulating film IF3 to be exposed as illustrated in FIG. 8.

Figure 9:
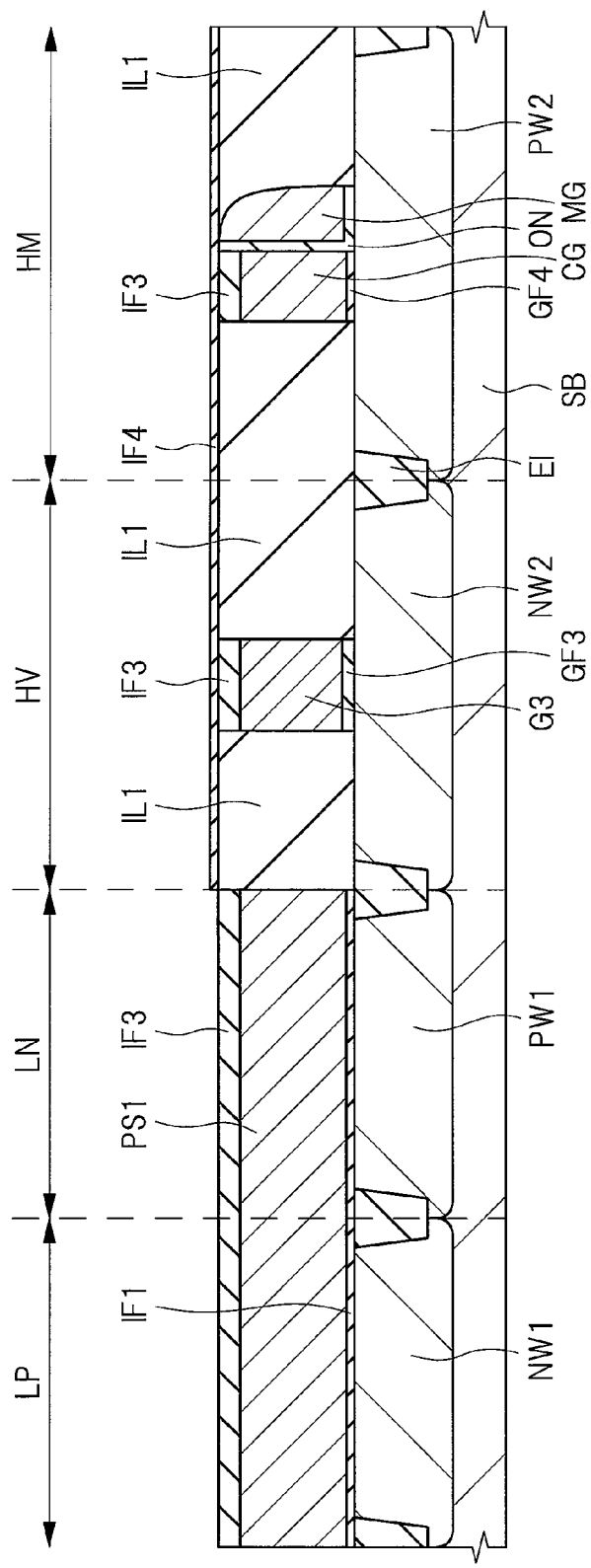
FIG. 9 is a cross-sectional view during the process of manufacturing the semiconductor device continued from FIG. 8.

Next, an insulating film IF4 is formed on the main surface of the semiconductor substrate SB using, for example, a CVD method, and then, the insulating film IF4 in the logic circuit regions LP and LN is removed using a photolithography technique and an etching method as illustrated in FIG. 9. At this time, the interlayer insulating film IL1 and the insulating film IF3 in the I/O region HV and the memory cell region HM remain in the state of being covered by the insulating film IF4. The insulating film IF4 is made of a material which is different from that of the insulating film IF3 serving as a cap insulating film, and is made of, for example, silicon oxide.

Figure 10:
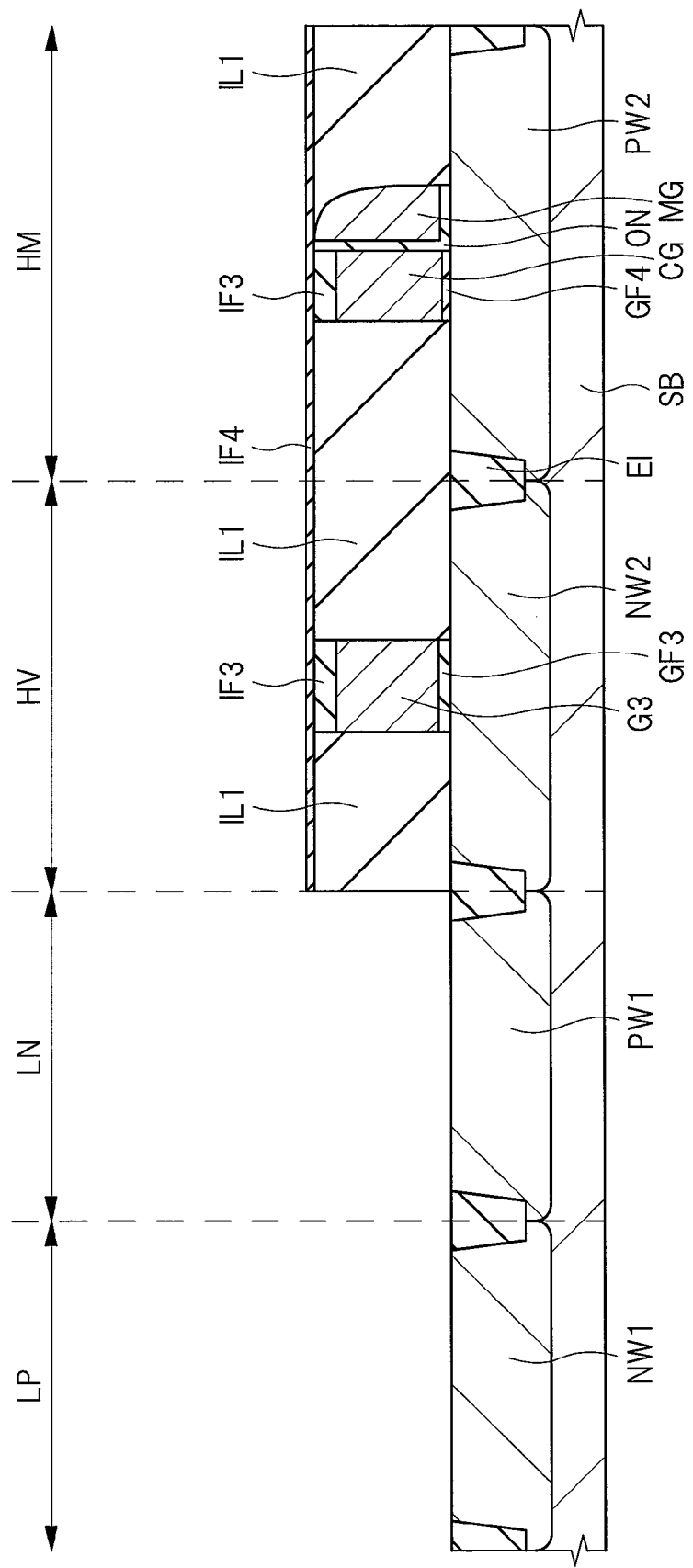
FIG. 10 is a cross-sectional view during the process of manufacturing the semiconductor device continued from FIG. 9.

Next, etching is performed using the insulating film IF4 as a mask to remove the insulating film IF3 in the logic circuit regions LP and LN, and thereafter, the polysilicon film PS1 and the insulating film IF1 in the logic circuit regions LP and LN are removed as illustrated in FIG. 10. Incidentally, the insulating film IF1 may be left without being removed. The insulating film IF3, the gate electrode G3, the control gate electrode CG, the memory gate electrode MG, and the like in the I/O region HV and the memory cell region HM are protected by the insulating film IF4, and thus, are not removed when the insulating film IF3, the polysilicon film PS1, and the insulating film IF1 in the logic circuit regions LP and LN are removed as above.

Figure 11:
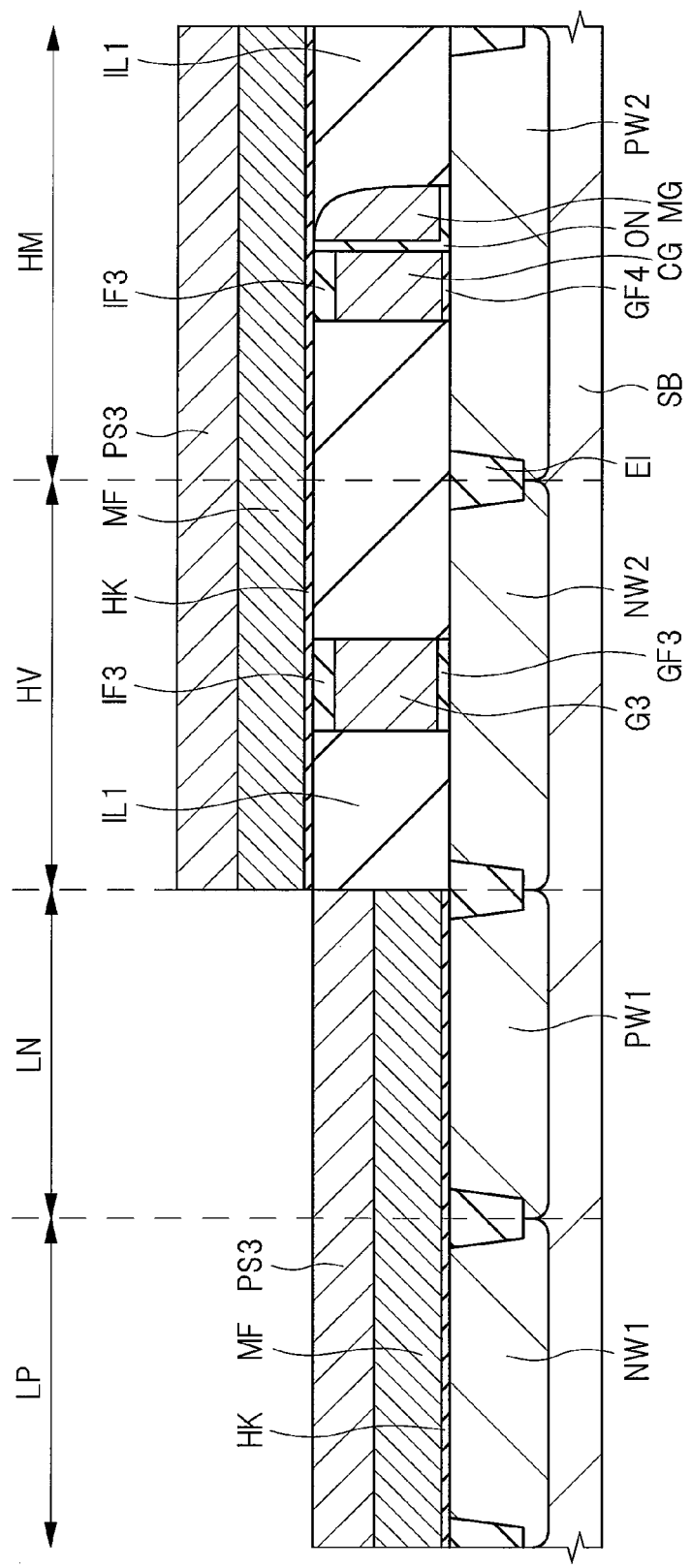
FIG. 11 is a cross-sectional view during the process of manufacturing the semiconductor device continued from FIG. 10.

Next, the insulating film IF4 in the I/O region HV and the memory cell region HM are removed as illustrated in FIG. 11. Subsequently, an insulating film HK, a metal film MF, and a polysilicon film PS3 are sequentially formed on the main surface of the semiconductor substrate SB. Incidentally, the insulating film HK, the metal film MF, and the polysilicon film PS3 may be sequentially formed after forming an insulating film, made of a silicon oxide film, for example, on the semiconductor substrate SB using an oxidation method or a CVD method when the insulating film IF1 has been removed in the process that has been described with reference to FIG. 10.

The insulating film HK is a so-called high-k film (high dielectric constant film) which is an insulating material film having a higher dielectric constant (relative dielectric constant) than silicon nitride. Examples of the insulating film HK may include metal oxide films such as a hafnium oxide film, a zirconium oxide film, an aluminum oxide film, a tantalum oxide film and a lanthanum oxide film, and further, these metal oxide films may further contain one of nitrogen (N) and silicon (Si) or the both. It is possible to increase a physical film thickness of a gate insulating film in the case of using the high dielectric constant film (herein, the insulating film HK) as the gate insulating film than the case of using a silicon oxide film, and thus, it is possible to obtain an advantage that a leakage current can be reduced. The insulating film HK and the polysilicon film PS3 can be formed using, for example, CVD.

Examples of the metal film MF may include metal films such as a titanium nitride (TiN) film, a tantalum nitride (TaN) film, a tungsten nitride (WN) film, a titanium carbide (TiC) film, a tantalum carbide (TaC) film, a tungsten carbide (WC) film, a nitride tantalum carbide (TaCN) film, a titanium (Ti) film, a tantalum (Ta) film, and a titanium aluminum (TiAl) film. Incidentally, the metal film described herein indicates a conductive film having metal conductivity, and is assumed to include not only a single metal film (pure metal film) or an alloy film but also a metal compound film (such as a metal nitride film and a metal carbide film) having metal conductivity.

The metal film MF can be formed using, for example, a sputtering method or the like. The metal film MF may have a configuration in which a plurality of metal films, made of different materials, among the above-described metal films made of various materials are stacked. For example, the metal film MF may be a stacked film in which a titanium film is stacked on a titanium nitride film.

The metal film MF forms a gate electrode of the low breakdown voltage MISFET, which will be formed in the subsequent process, and the gate electrode including the metal film MF will be referred to as a metal gate electrode, hereinafter. The MISFET using the metal gate electrode has an advantage that it is possible to suppress a depletion phenomenon of the gate electrode and eliminate a parasitic capacitance. In addition, it is also possible to obtain reduction in size of an MISFET element (reduction in thickness of the gate insulating film).

Figure 12:
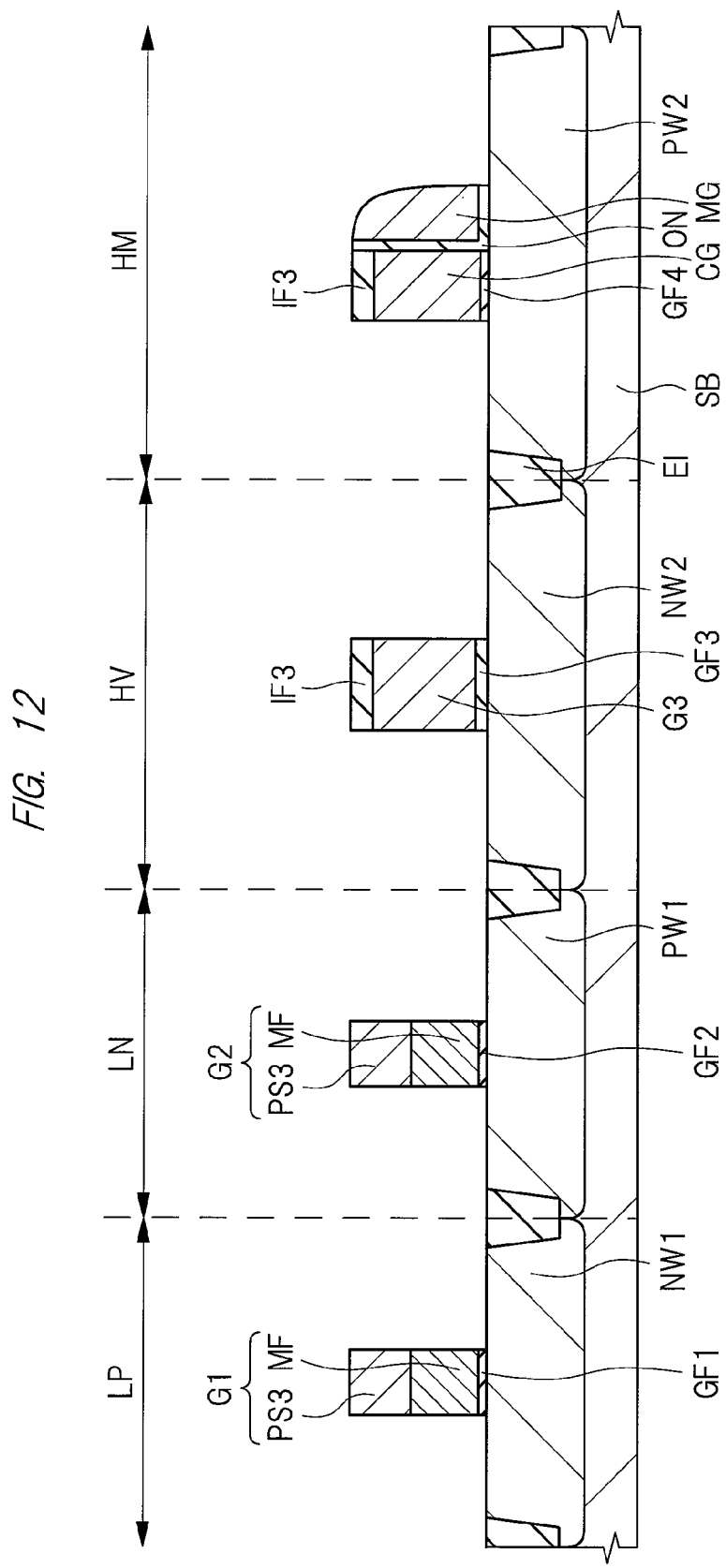
FIG. 12 is a cross-sectional view during the process of manufacturing the semiconductor device continued from FIG. 11.

Next, the polysilicon film PS3, the metal film MF, and the insulating film HK are patterned using a photolithography technique and a dry etching method as illustrated in FIG. 12. Accordingly, a gate insulating film GF1, formed using the insulating film HK, and a gate electrode G1, which is the metal gate electrode formed using the polysilicon film PS3 and the metal film MF on the insulating film HK, are formed in the logic circuit region LP, and a gate insulating film GF2, formed using the insulating film HK, and a gate electrode G2, which is the metal gate electrode formed using the polysilicon film PS3 and the metal film MF on the insulating film HK, are formed in the logic circuit region LN. In addition, the polysilicon film PS3, the metal film MF, and the insulating film HK are removed, and each upper surface of the interlayer insulating film IL1 and the insulating film IF3 are exposed in the I/O region HV and the memory cell region HM.

Subsequently, the interlayer insulating film IL1 in the I/O region HV and the memory cell region HM is removed using a wet etching method. In the above-described manner, the metal gate electrode and another gate electrode made of the polysilicon film are formed according to the gate-first process. Hereinafter, the first method of forming the offset spacer will be described with reference to FIGS. 13 to 19.

Figure 13:
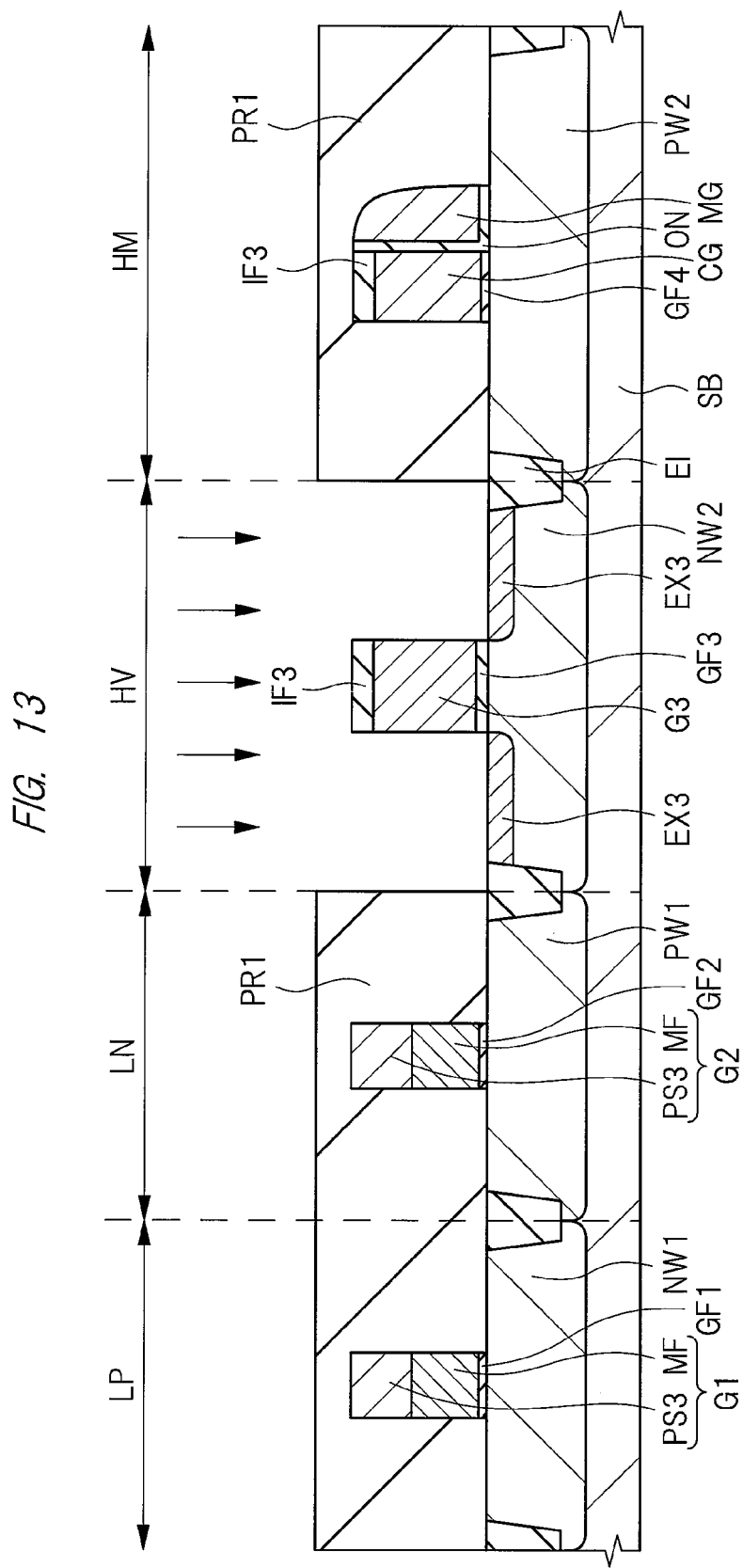
FIG. 13 is a cross-sectional view during the process of manufacturing the semiconductor device continued from FIG. 12.

Next, a photoresist film PR1 is formed on the main surface of the semiconductor substrate SB so as to cover the entire main surface thereof except for the I/O region HV, and then, a pair of extension regions EX3 is formed on the main surface of the semiconductor substrate SB in the I/O region HV by performing ion implantation using the photoresist film PR1 and the insulating film IF3 as a mask as illustrated in FIG. 13. The extension region EX3 is a p-type semiconductor region which is formed by implanting p-type impurities (for example, boron (B)) into the main surface of the semiconductor substrate SB at both lateral sides of the gate electrode G3 at a relatively low concentration.

Figure 14:
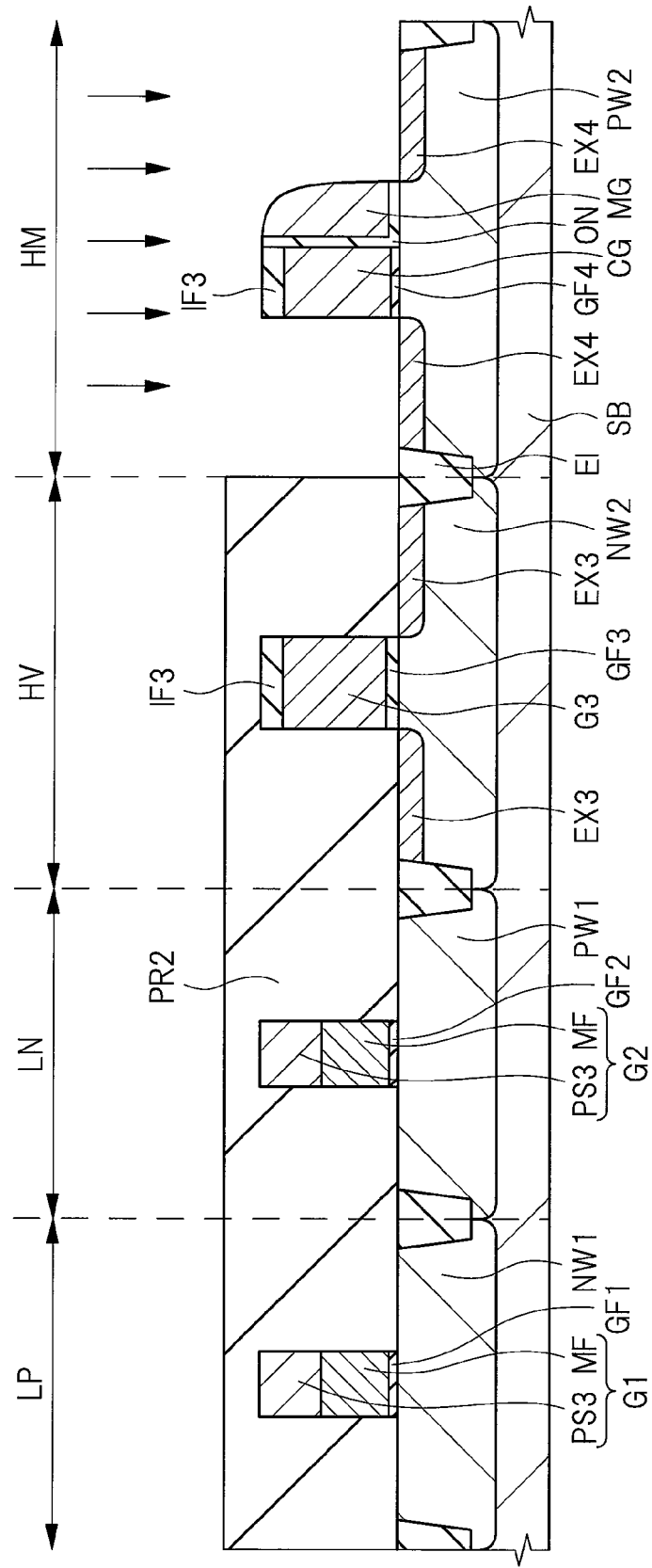
FIG. 14 is a cross-sectional view during the process of manufacturing the semiconductor device continued from FIG. 13.

Next, the photoresist film PR1 is removed, then, a photoresist film PR2 is formed on the main surface of the semiconductor substrate SB so as to cover the entire main surface thereof except for the memory cell region HM, and thereafter, a pair of extension regions EX4 is formed on the main surface of the semiconductor substrate SB in the memory cell region HM by performing ion implantation using the photoresist film PR2, the memory gate electrode MG, the ONO film ON, and the insulating film IF3 as a mask as illustrated in FIG. 14. The extension region EX4 is an n-type semiconductor region which is formed by implanting n-type impurities (for example, phosphorus (P) or arsenic (As)) into the main surface of the semiconductor substrate SB at both sides of a film pattern including the control gate electrode CG, the memory gate electrode MG, and the ONO film ON at a relatively low concentration.

Figure 15:
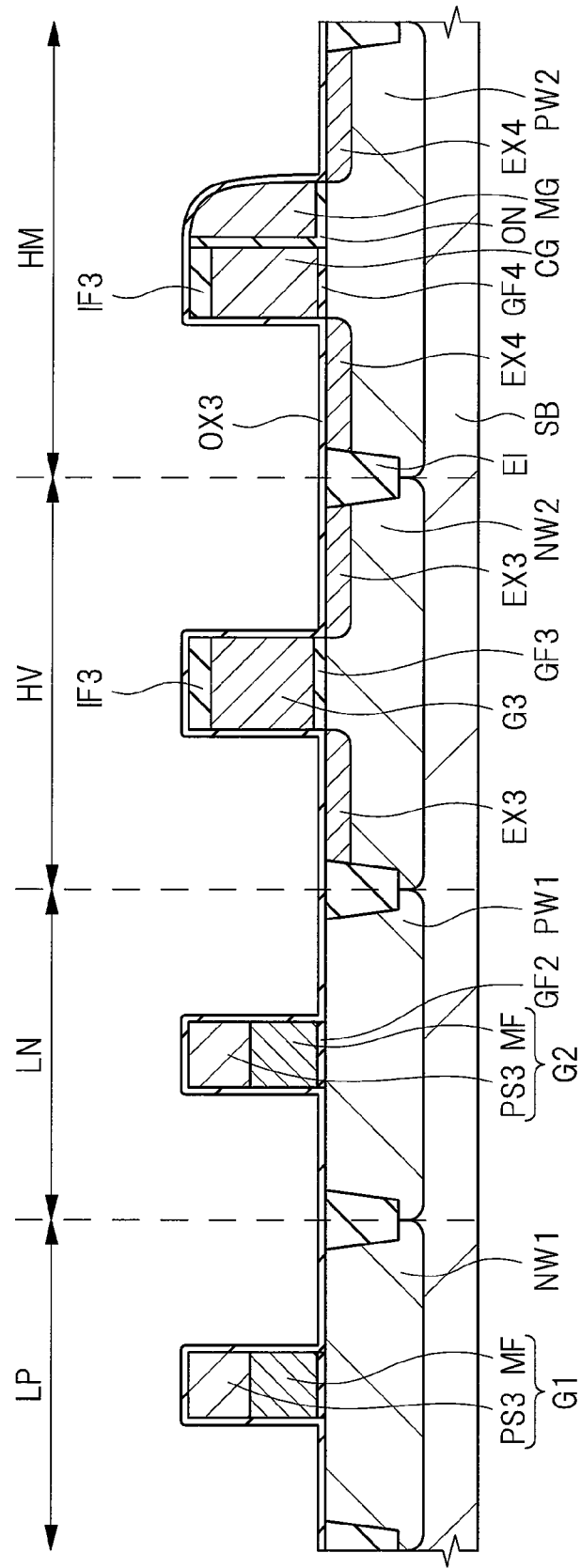
FIG. 15 is a cross-sectional view during the process of manufacturing the semiconductor device continued from FIG. 14.

Next, the photoresist film PR2 is removed, and then, a silicon oxide film OX3 is formed on the main surface of the semiconductor substrate SB using, for example, a CVD method as illustrated in FIG. 15. Accordingly, the main surface of the semiconductor substrate SB and sidewalls and upper surfaces of the gate electrodes G1 to G3 are covered by the silicon oxide film OX3. In addition, sidewalls and an upper surface of the pattern including the control gate electrode CG, the memory gate electrode MG, and the ONO film ON are also covered by the silicon oxide film OX3. A film thickness of the silicon oxide film OX3 is, for example, 5 nm. In the present application, the film thickness indicates a length of a film in a direction vertical to a base face of the deposited film. Accordingly, for example, the sidewalls of the gate electrode G3 are formed along the direction vertical to the main surface of the semiconductor substrate SB, and the film thickness of the silicon oxide film OX3 that covers the corresponding sidewalls indicates a length of the silicon oxide film OX3 in the direction vertical to the corresponding sidewalls.

Figure 16:
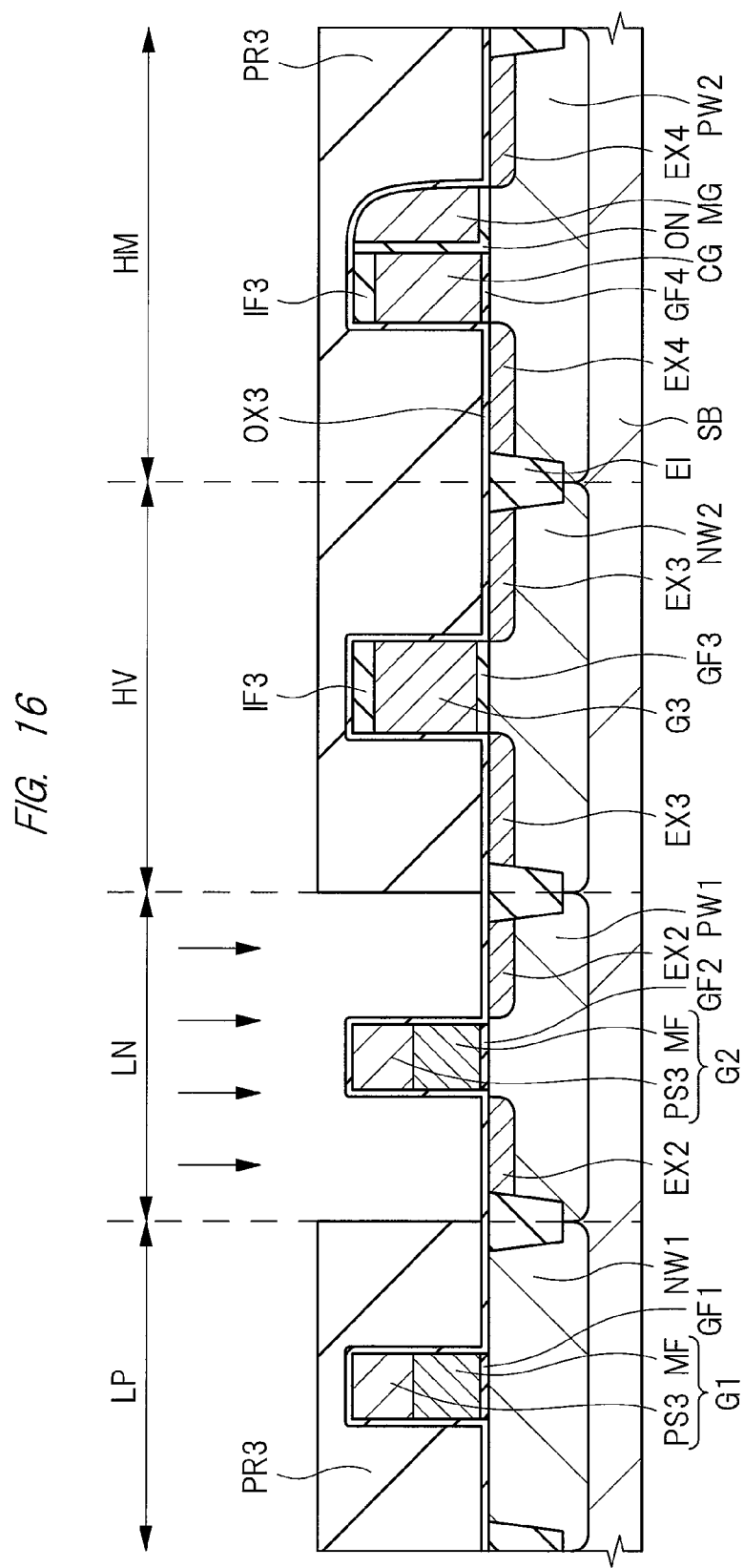
FIG. 16 is a cross-sectional view during the process of manufacturing the semiconductor device continued from FIG. 15.

Next, a photoresist film PR3 is formed so as to cover the entire main surface except for the logic circuit region LN, and then, a pair of extension regions EX2 is formed on the main surface of the semiconductor substrate SB in the logic circuit region LN by performing ion implantation using the photoresist film PR3 and the polysilicon film PS3 as a mask as illustrated in FIG. 16. The extension region EX2 is an n-type semiconductor region which is formed by implanting n-type impurities (for example, phosphorus (P) or arsenic (As)) into the main surface of the semiconductor substrate SB at both lateral sides of the gate electrode G2 at a relatively low concentration. In this ion implantation, impurity ions are implanted into the main surface of the semiconductor substrate SB penetrating the silicon oxide film OX3.

Figure 17:
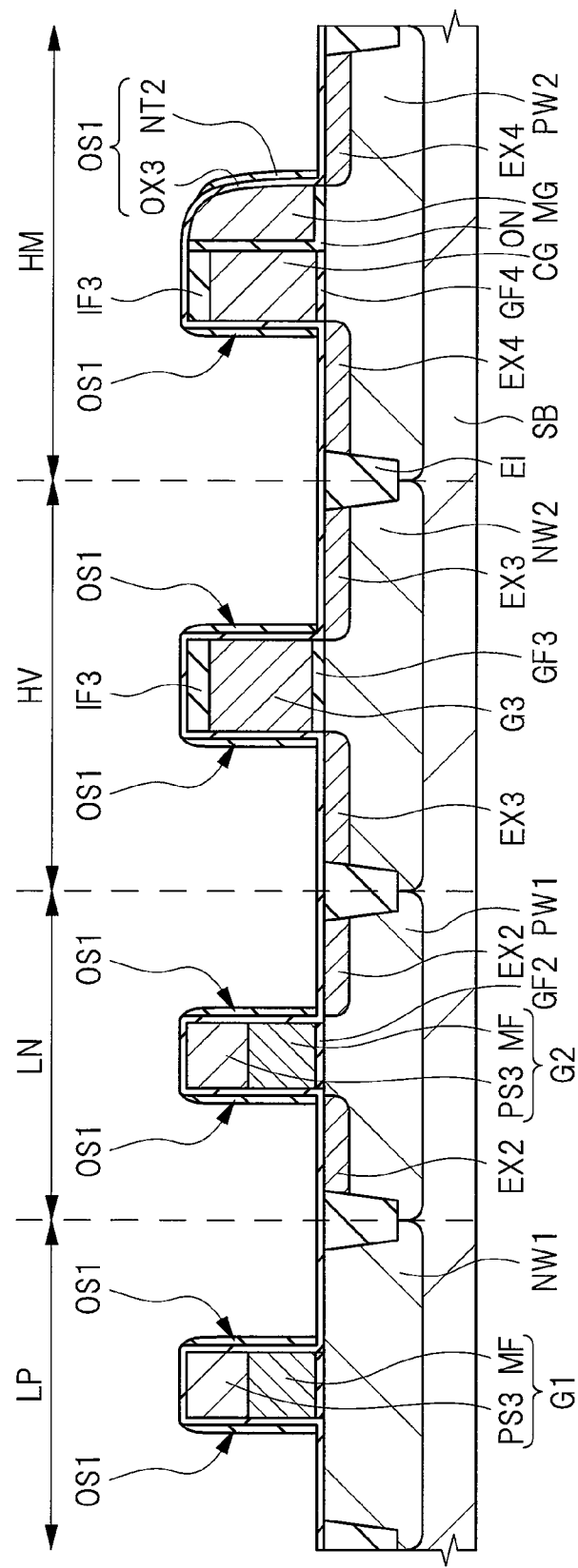
FIG. 17 is a cross-sectional view during the process of manufacturing the semiconductor device continued from FIG. 16.

Next, the photoresist film PR3 is removed, and then, a silicon nitride film NT2 is formed on the main surface of the semiconductor substrate SB using, for example, a CVD method as illustrated in FIG. 17. Accordingly, a surface of the silicon oxide film OX3 is covered by the silicon nitride film NT2. A film thickness of the silicon nitride film NT2 is, for example, 5 nm. Subsequently, etchback is selectively performed using a dry etching method to remove a part of the silicon nitride film NT2 so that a partial surface of the silicon oxide film OX3 is exposed. At this time, the silicon oxide film OX3 can be used as an etching stopper film, and thus, it is possible to perform highly accurate etching.

The silicon nitride film NT2 is left in a sidewall shape so as to cover each of the sidewalls of the gate electrodes G1 to G3, one sidewall of the control gate electrode CG, and one sidewall of the memory gate electrode MG. Accordingly, an offset spacer OS1, which is formed of the silicon oxide film OX3 and the silicon nitride film NT2, is formed.

Figure 18:
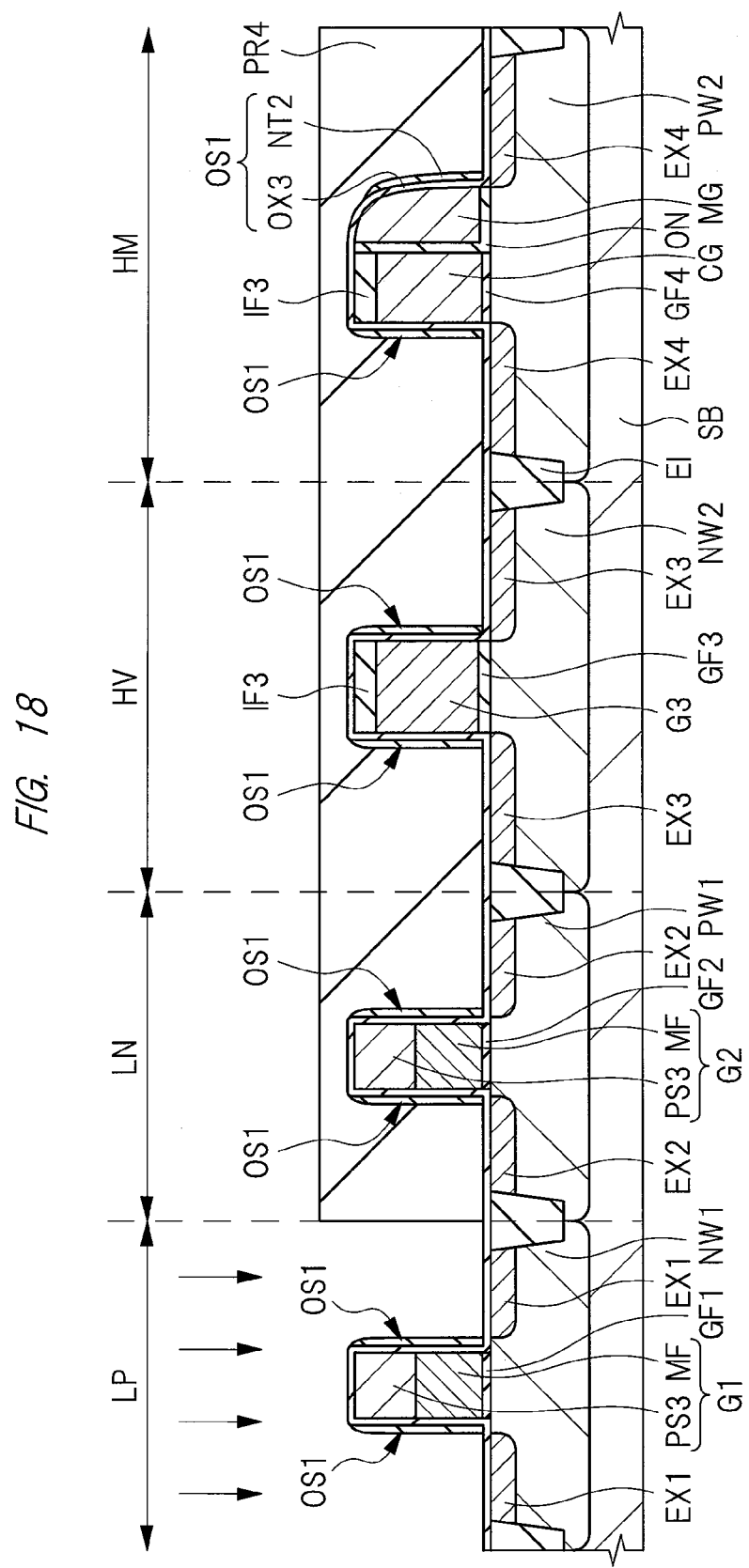
FIG. 18 is a cross-sectional view during the process of manufacturing the semiconductor device continued from FIG. 17.

Next, a photoresist film PR4 is formed so as to cover the entire main surface except for the logic circuit region LP, and then, a pair of extension regions EX1 is formed on the main surface of the semiconductor substrate SB in the logic circuit region LP by performing ion implantation using the photoresist film PR4 and the polysilicon film PS3 as a mask as illustrated in FIG. 18. The extension region EX1 is a p-type semiconductor region which is formed by implanting p-type impurities (for example, boron (B)) into the main surface of the semiconductor substrate SB at both lateral sides of the gate electrode G1 at a relatively low concentration. In this ion implantation, impurity ions are implanted into the main surface of the semiconductor substrate SB penetrating the silicon oxide film OX3.

Figure 19:
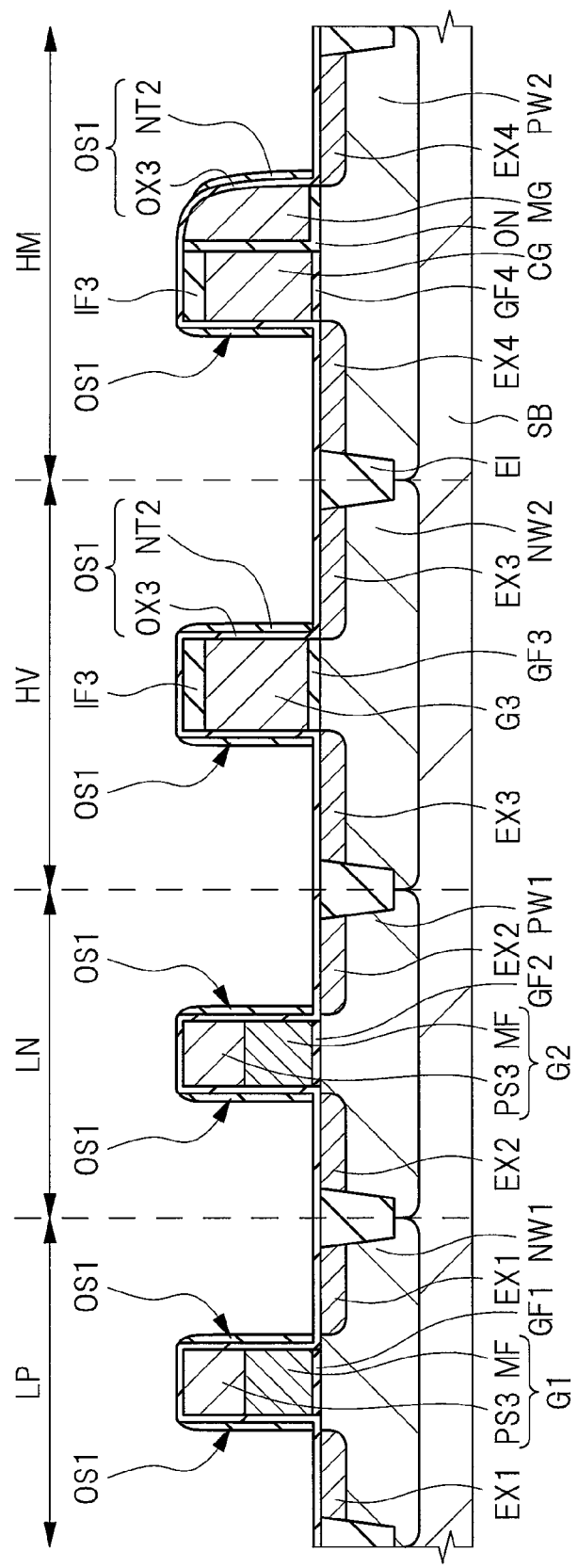
FIG. 19 is a cross-sectional view during the process of manufacturing the semiconductor device continued from FIG. 18.

Next, the photoresist film PR4 is removed as illustrated in FIG. 19.

Hereinafter, a description will be given regarding a method of forming a sidewall, which is one of the main characteristics of this embodiment, with reference to FIGS. 20 to 24. FIGS. 20 to 28 and FIG. 29, which will be used in the subsequent description, do not illustrate the above-described silicon oxide film OX3, which is formed along each upper surface of the gate electrodes and the main surface of the semiconductor substrate SB. In addition, FIGS. 20 to 28 illustrate the offset spacer OS1 as a single film in order to facilitate understanding of the drawings. That is, the silicon oxide film OX3 and the silicon nitride film NT2 which form the offset spacer OS1 are not distinguished from each other.

In addition, FIGS. 20 to 29 only illustrate the logic circuit region LN and the memory cell region HM without description regarding the manufacturing process in the logic circuit region LP and the I/O region HV. The manufacturing process in the logic circuit region LP is performed in the same manner as in the logic circuit region LN, and the manufacturing process in the I/O region HV is performed in the same manner as in the memory cell region HM. However, the p-type impurities are injected in the ion implantation process, which is performed to form a diffusion layer forming source and drain regions, in each of the manufacturing processes in the logic circuit region LP and the I/O region HV, which is different from that in the logic circuit region LN and the memory cell region HM. In addition, FIGS. 20 to 28 illustrate cross-sectional views of the case of forming two MISFETs side by side in the logic circuit region LN.

Figure 20:
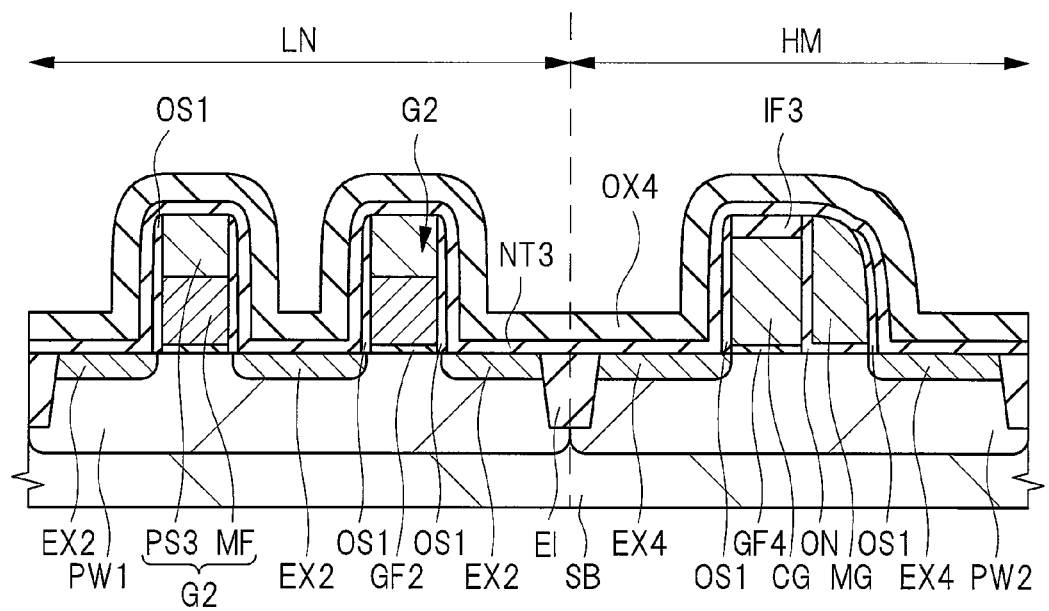
FIG. 20 is a cross-sectional view during the process of manufacturing the semiconductor device continued from FIG. 19.

Next, a silicon nitride film NT3 and a silicon oxide film OX4 are sequentially formed on the main surface of the semiconductor substrate SB using, for example, a CVD method as illustrated in FIG. 20. Here, a distance between the neighboring gate electrodes G2 in the logic circuit region LN is, for example, 90 nm in the case of ignoring a film thickness of the offset spacer OS1. A distance between the offset spacers OS1, which cover the respective opposing sidewalls of the neighboring gate electrodes G2, is 90 nm in the case of considering the film thickness of the offset spacer OS1.

In these cases, it is necessary to prevent the gap between the neighboring gate electrodes G2 from being completely embedded by the silicon nitride film NT3 and the silicon oxide film OX4 in order to prevent occurrence of failure during a process of removing the silicon nitride film NT3 and the silicon oxide film OX4, which is performed in the subsequent process. That is, a film thickness of the stacked film, formed of the silicon nitride film NT3 and the silicon oxide film OX4, needs to be smaller than a half value of 90 nm. Here, a distance between the neighboring gate electrodes G2 is greater than twice a total film thickness of the silicon nitride film NT3 and the silicon oxide film OX4. Accordingly, when a film thickness of the silicon nitride film NT3 is set as "a" and a film thickness of the silicon oxide film OX4 is set as "b", a+b<45 (nm). In other words, 2a+2b<90 (nm).

Here, the film thickness a of the silicon nitride film NT3 is, for example, 15 nm, and the film thickness b of the silicon oxide film OX4 is, for example, 20 nm. The film thickness a of the silicon nitride film NT3 needs to have a dimension at a level that does not expose the main surface of the semiconductor substrate SB in an etchback process (see FIG. 21), which is performed after processing the silicon oxide film OX4 in a sidewall shape, and thus, requires a dimension of, for example, 10 nm or larger.

Incidentally, a plurality of the patterns, each of which includes the control gate electrode CG and the memory gate electrode MG adjacent to each other, are formed in the memory cell region HM, and a distance between the patterns is larger than 90 nm. Thus, when the gap between the gate electrodes G2 in the logic circuit region LN is not completely embedded by the silicon nitride film NT3 and the silicon oxide film OX4, a gap between the above-described patterns is also not completely embedded. In addition, here, the case of being "completely embedded" indicates a casein which films that are formed, respectively, along the two sidewalls, which oppose each other, of the gate electrode are in contact with each other.

Figure 21:
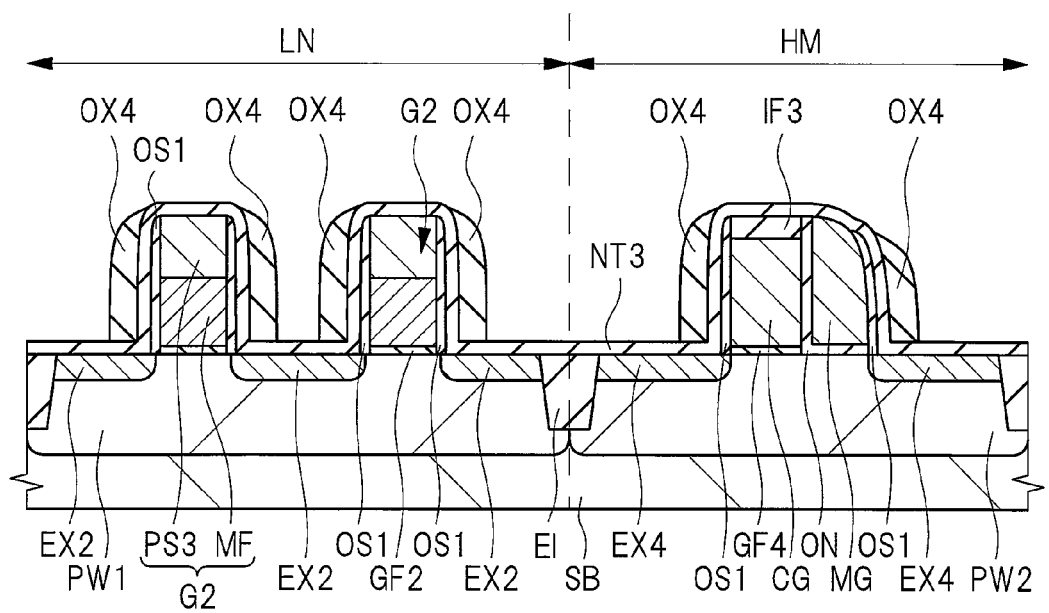
FIG. 21 is a cross-sectional view during the process of manufacturing the semiconductor device continued from FIG. 20.

Next, etchback is selectively performed using a dry etching method to remove a part of the silicon oxide film OX4 so that an upper surface of the silicon nitride film NT3 is exposed as illustrated in FIG. 21. At this time, the silicon nitride film NT3 functions as an etching stopper film. Through this the etchback process, the silicon oxide film OX4 is left in the sidewall shape.

Figure 22:
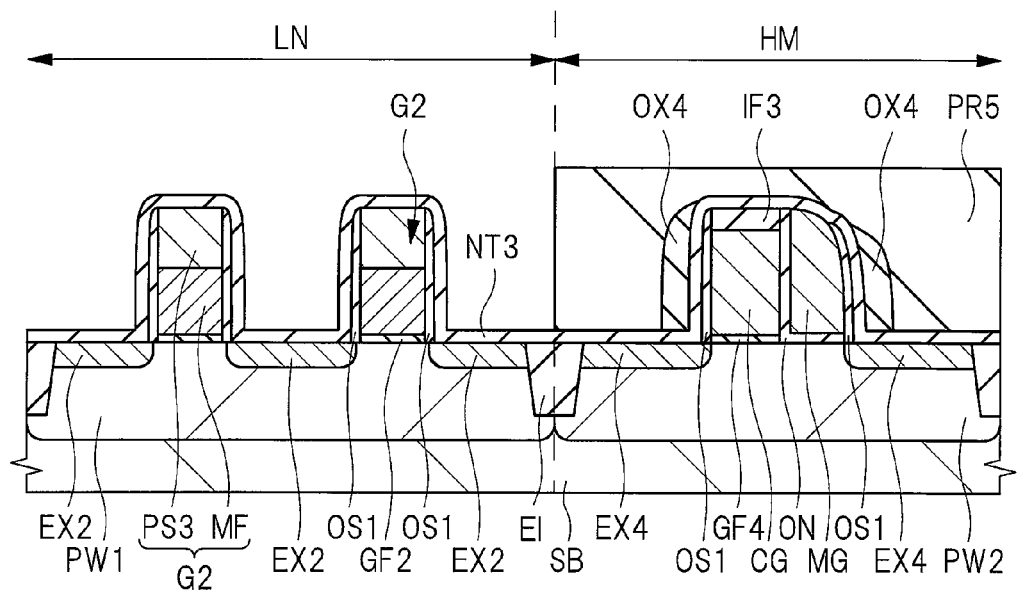
FIG. 22 is a cross-sectional view during the process of manufacturing the semiconductor device continued from FIG. 21.

Next, a photoresist film PR5 is formed to cover the memory cell region HM and to expose the logic circuit region LN, and the silicon oxide film OX4 in the logic circuit region LN is removed using wet etching as illustrated in FIG. 22.

Figure 23:
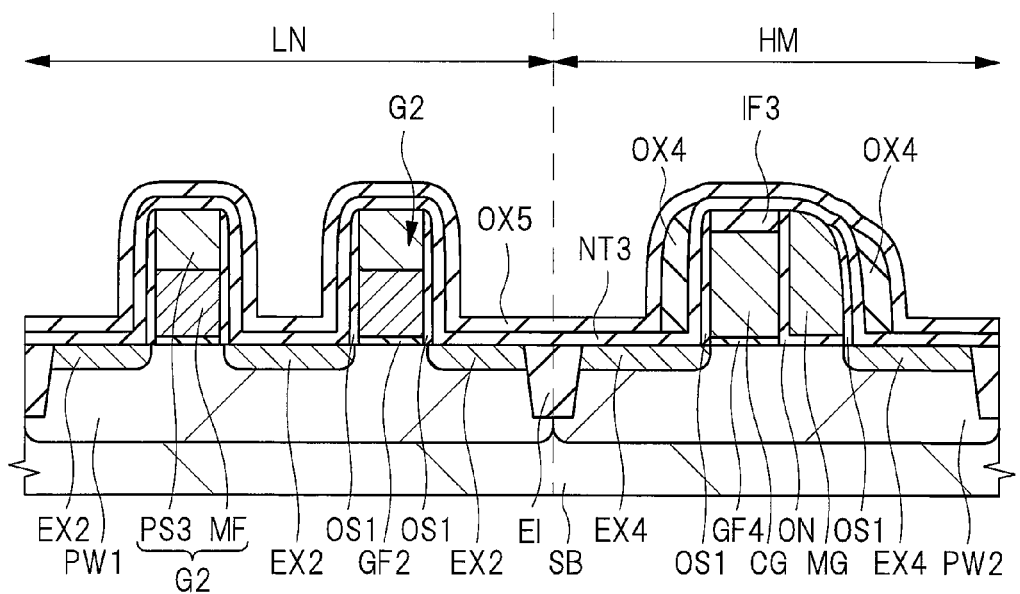
FIG. 23 is a cross-sectional view during the process of manufacturing the semiconductor device continued from FIG. 22.

Next, the photoresist film PR5 is removed, and then, a silicon oxide film OX5 is formed on the main surface of the semiconductor substrate SB using, for example, a CVD method as illustrated in FIG. 23. Here, a film thickness of the silicon oxide film OX5 is set as "c". The film thickness c of the silicon oxide film OX5 is, for example, 11 nm. Accordingly, the gap between the gate electrodes G2 is not completely embedded by the silicon nitride film NT3 and the silicon oxide film OX5. The silicon oxide film OX5 covers the gate electrode G2 and the silicon nitride film NT3 in the logic circuit region LN, and covers the control gate electrode CG, the memory gate electrode MG, the silicon nitride film NT3, and the silicon oxide film OX4 in the memory cell region HM. In addition, the silicon oxide film OX5 covers the main surface of the semiconductor substrate SB.

Figure 24:
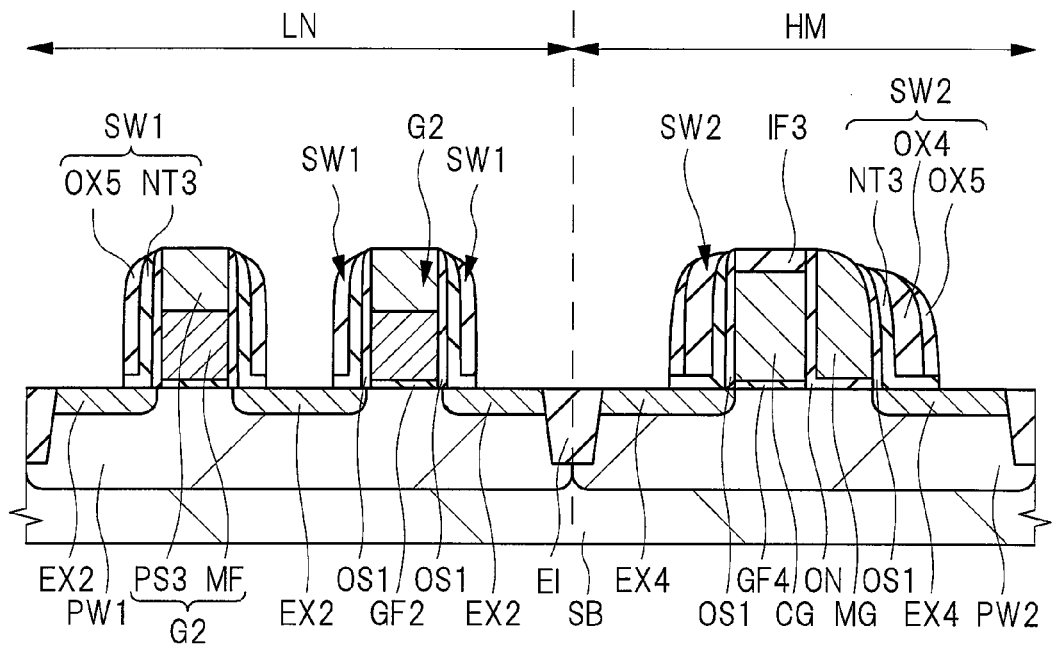
FIG. 24 is a cross-sectional view during the process of manufacturing the semiconductor device continued from FIG. 23.

Next, etchback is performed using a dry etching method to remove a part of the silicon oxide film OX5, and thereafter, the silicon nitride film NT3, which is exposed from the silicon oxide films OX4 and OX5, is removed as illustrated in FIG. 24. Accordingly, a sidewall SW1 is formed along the sidewalls of the gate electrode G2 in the logic circuit region LN with the offset spacer OS1 interposed therebetween. The sidewall SW1 is formed of the silicon nitride film NT3 and the silicon oxide film OX5. In addition, a sidewall SW2 is formed along the sidewalls of the pattern, which includes the control gate electrode CG and the memory gate electrode MG adjacent to each other, in the memory cell region HM with the offset spacer OS1 interposed therebetween the sidewall SW2. The sidewall SW2 is formed of the silicon nitride film NT3, and the silicon oxide films OX4 and OX5.

A film thickness of the sidewall SW1, that is, a width dimension in a direction along the main surface of the semiconductor substrate SB is 26 nm which is obtained by adding the film thickness a of the silicon nitride film NT3 and the film thickness c of the silicon oxide film OX5. On the other hand, a film thickness of the sidewall SW2, that is, a width dimension in a direction along the main surface of the semiconductor substrate SB is 46 nm which is obtained by adding the film thickness a of the silicon nitride film NT3, the film thickness b of the silicon oxide film OX4, and the film thickness c of the silicon oxide film OX5.

Accordingly, the width (film thickness) of the sidewall SW2 is larger than the width (film thickness) of the sidewall SW1. One of the main characteristics of the first embodiment is to separately form the plurality of sidewalls SW1 and SW2 which have different film thicknesses as above. In addition, another one of the main characteristics of the first embodiment is that the width dimension of the sidewall SW2 is equal to or larger than a half of the distance between the neighboring gate electrodes G2. Incidentally, each gap among the above-described plurality of patterns in the memory cell region HM is not completely embedded even in the case of forming the sidewall SW2 having the width of 46 nm. Incidentally, any width used in the present application indicates a length in a direction along the main surface of the semiconductor substrate SB.

One sidewall of the control gate electrode CG is covered by the sidewall SW2, and the other sidewall of the control gate electrode CG is covered by the sidewall SW2 with the memory gate electrode MG interposed therebetween. In addition, one sidewall of the memory gate electrode MG is covered by the sidewall SW2, and the other side wall of the memory gate electrode MG is covered by the sidewall SW2 with the control gate electrode CG interposed therebetween.

Figure 25:
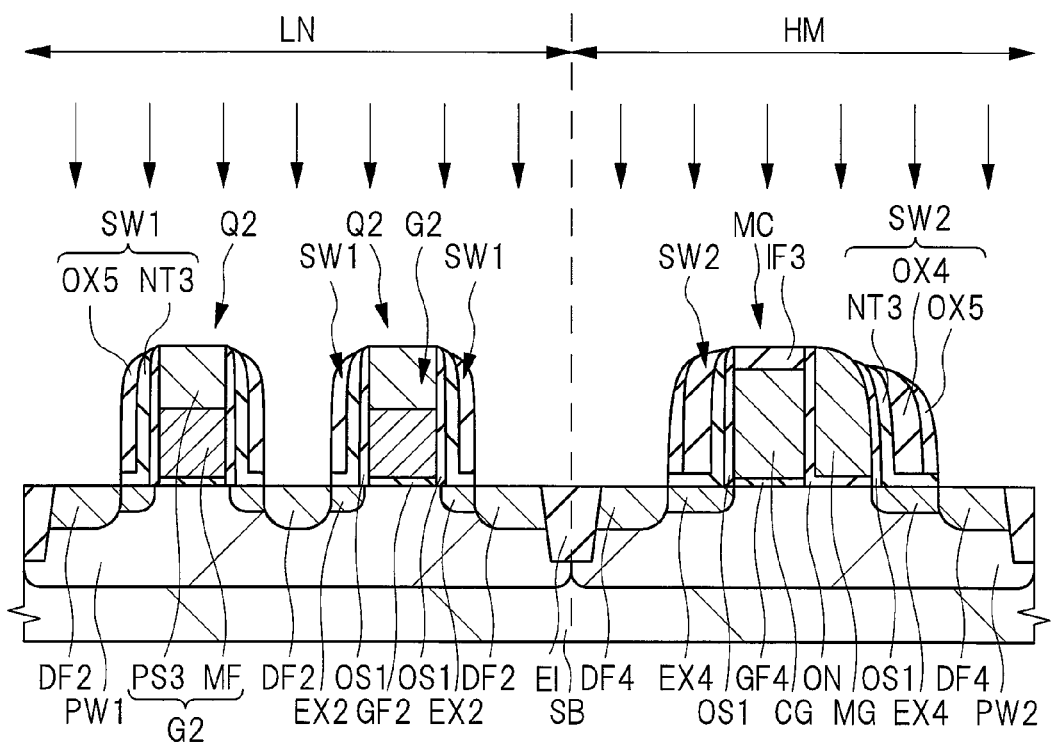
FIG. 25 is a cross-sectional view during the process of manufacturing the semiconductor device continued from FIG. 24.

Next, a diffusion layer DF2 is formed on the main surface of the semiconductor substrate SB in the logic circuit region LN, and a diffusion layer DF4 is formed on the main surface of the semiconductor substrate SB in the memory cell region HM by performing ion implantation using the sidewalls SW1 and SW2, the offset spacer OS1, the gate electrode G2, the insulating film IF3, the ONO film ON, and the memory gate electrode MG as a mask as illustrated in FIG. 25. Accordingly, a MISFET Q2, which is formed of the gate electrode G2, the extension region EX2, and the diffusion layer DF2 and includes source and drain regions, is formed in the logic circuit region LN. In addition, a memory cell MC, which is formed of the control gate electrode CG, the memory gate electrode MG, the ONO film ON, the extension region EX4, and the diffusion layer DF4, and includes source and drain regions, is formed in the memory cell region HM.

Although the description has been given here regarding the case of forming the diffusion layers DF2 and DF4 using one-time ion implantation, the diffusion layer DF2 and the diffusion layer DF4 may be formed using different ion implantation processes, and each impurity concentration of the diffusion layers may be set to be different. In addition, the diffusion layer DF4 on the source region side and the diffusion layer DF4 on the drain region side to be formed in the memory cell region HM may be formed using different ion implantation processes, and each impurity concentration of these diffusion layers DF4 may be set to be different.

In the memory cell region HM, the source and drain regions and the control gate electrode CG form a control transistor, and the source and drain regions and the memory gate electrode MG form a memory transistor. The memory cell MC is configured of the control transistor and the memory transistor. Each of the control transistor and the memory transistor is the transistor that is driven with a higher voltage than the MISFET Q2. That is, the MISFET Q2 is a low breakdown voltage MISFET, and each of the control transistor and the memory transistor is a high breakdown voltage MISFET. Incidentally, a transistor including the gate electrode G3 (see FIG. 19) formed in the I/O region HV (not illustrated) is a high breakdown voltage transistor which is driven with a higher voltage than the MISFET Q2.

The diffusion layer DF2 is an n-type semiconductor region which is formed by implanting n-type impurities (for example, phosphorus (P) or arsenic (As)) into the main surface of the semiconductor substrate SB at both lateral sides of the gate electrode G2 at a relatively high concentration. The diffusion layer DF4 is an n-type semiconductor region which is formed by implanting n-type impurities (for example, phosphorus (P) or arsenic (As)) into the main surface of the semiconductor substrate SB at both lateral sides of the above-described pattern including the control gate electrode CG and the memory gate electrode MG at a relatively high concentration.

Each of the diffusion layers DF2 and DF4 has a higher impurity concentration than the extension regions EX2 and EX4. That is, the source and drain regions formed using the extension region EX2 and the diffusion layer DF2 and the source and drain regions formed using the extension region EX4 and the diffusion layer DF4 have a structure in which a semiconductor region having a low concentration and a semiconductor region having a high concentration are adjacent to each other, that is, a lightly doped drain (LDD) structure. In addition, the diffusion layers DF2 and DF4 are formed to be deeper than the extension regions EX2 and EX4. The extension region EX2 is formed to be closer to the main surface of the semiconductor substrate SB, which is right below the gate electrode G2, that is, a region in which a channel is formed than the diffusion layer DF2. Incidentally, the diffusion layers DF2 and DF4 may be formed to be shallower than the extension regions EX2 and EX4.

Figure 26:
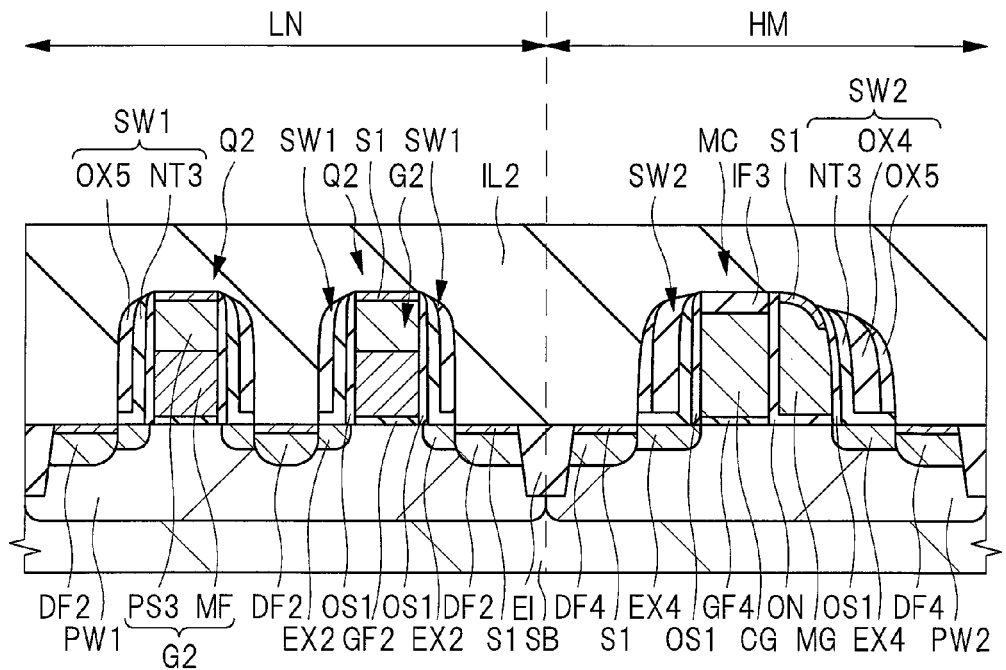
FIG. 26 is a cross-sectional view during the process of manufacturing the semiconductor device continued from FIG. 25.

Next, a silicide layer S1 is formed on a silicon surface, which is exposed on the main surface of the semiconductor substrate SB, using a known salicide technique as illustrated in FIG. 26. That is, a metal film is deposited on the main surface of the semiconductor substrate SB using, for example, a sputtering method, then, heat treatment is performed to cause reaction between the metal film and the above-described silicon so as to form the silicide layer S1, and subsequently, an unreacted part of the metal film is removed using wet etching. Accordingly, the silicide layer S1, which forms each upper surface of the diffusion layers DF2 and DF4, the gate electrode G2, and the memory gate electrode MG, is formed. Incidentally, the insulating film IF3 on the control gate electrode CG has been removed before the formation of the silicide layer S1 in a power supply portion (not illustrated) of the control gate electrode CG, and the silicide layer S1, which forms the upper surface of the control gate electrode CG, is formed in the power supply portion.

The silicide layer S1 is made of, for example, a cobalt silicide layer, a nickel silicide layer, or a nickel-platinum silicide layer. The above-described metal film is made of a cobalt (Co) film, a nickel (Ni) film, or a nickel-platinum alloy film.

Subsequently, an etching stopper film (not illustrated) and an interlayer insulating film IL2 are sequentially formed on the main surface of the semiconductor substrate SB using, for example, a CVD method to cover the MISFET Q2 and the memory cell MC. The etching stopper film is made of, for example, a silicon nitride film. The interlayer insulating film IL2 is made of, for example, a silicon oxide film, and a film thickness thereof is larger than a film thickness of a stacked film including the gate insulating film GF4, the control gate electrode CG, and the insulating film IF3. Thereafter, an upper surface of the interlayer insulating film IL2 is planarized using, for example, a CMP method.

Figure 27:
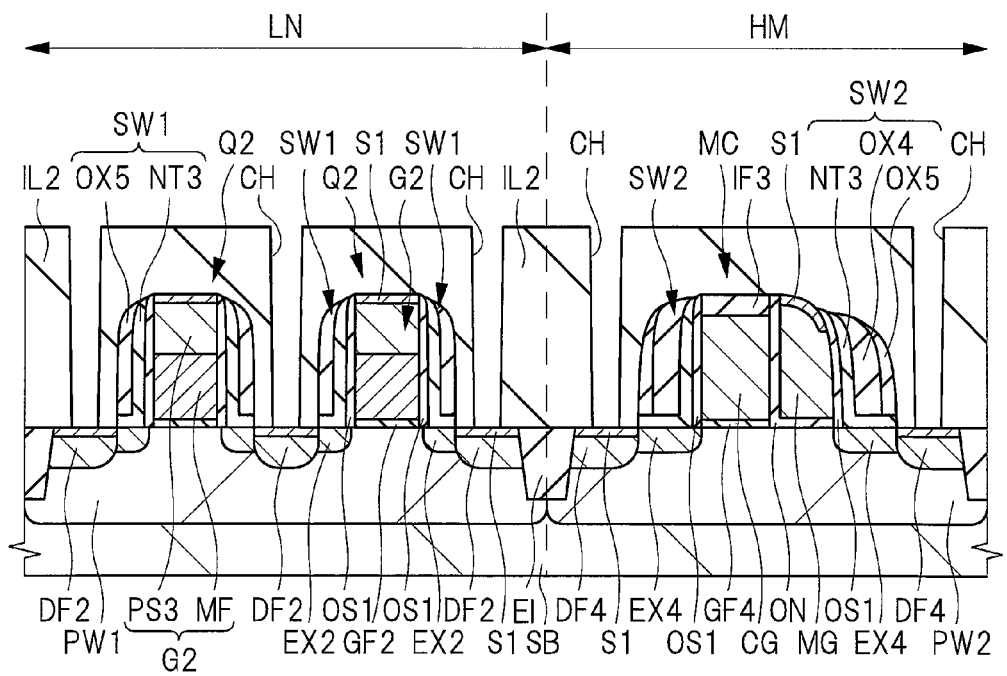
FIG. 27 is a cross-sectional view during the process of manufacturing the semiconductor device continued from FIG. 26.

Next, a plurality of contact holes CH are formed to penetrate between the upper surface and a lower surface of the interlayer insulating film IL2 using a photolithography technique and a dry etching method as illustrated in FIG. 27. An upper surface of the silicide layer S1, which covers each upper surface of the respective gate electrodes and the respective source and drain regions, is exposed on a bottom portion of the contact hole CH.

Figure 28:
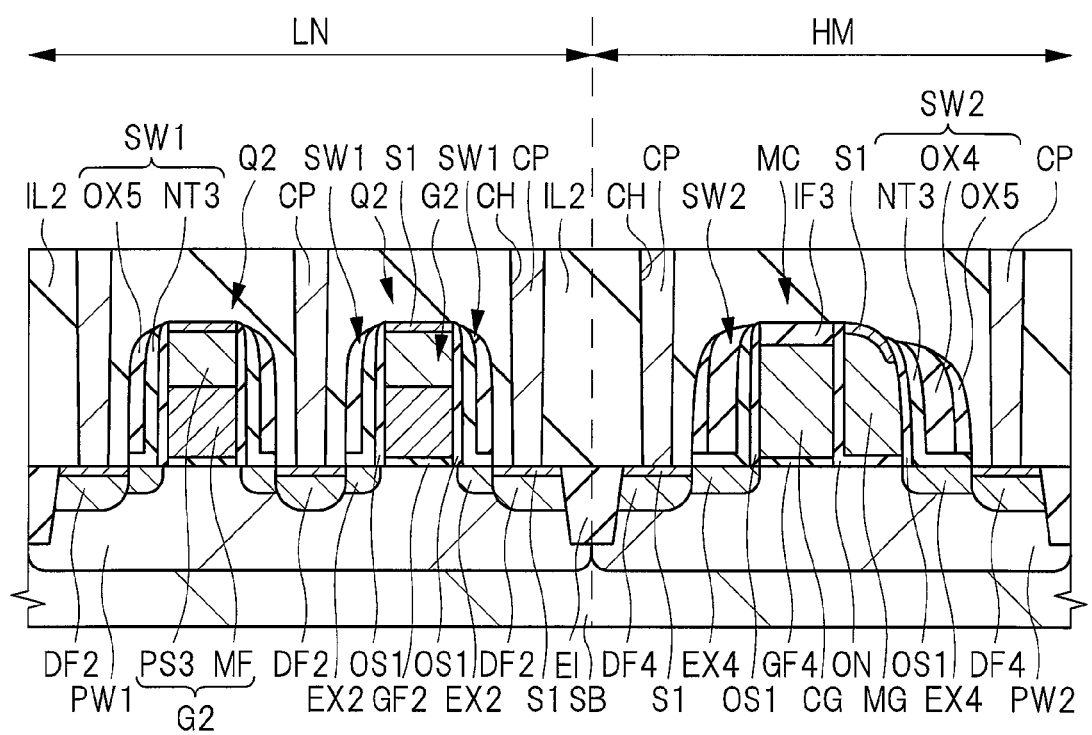
FIG. 28 is a cross-sectional view during the process of manufacturing the semiconductor device continued from FIG. 27.

Next, a contact plug (connection portion) CP is formed to be embedded inside the contact hole CH as illustrated in FIG. 28. Thereafter, a wiring layer, which includes a wiring electrically connected to the contact plug CP, is formed on the contact plug CP, although not illustrated, and accordingly, the semiconductor device according to the first embodiment is completed. The contact plug CP is made mainly of, for example, a tungsten (W) film.

When the contact plug CP is formed, for example, a barrier conductor film (not illustrated) and a main conductor film (tungsten film) are first formed sequentially on the main surface of the semiconductor substrate SB using, for example, a sputtering method so that the inside of the contact hole CH is completely embedded. Thereafter, the barrier conductor film and the main conductor film remaining on the interlayer insulating film IL2 are removed using a CMP method or the like to expose the upper surface of the interlayer insulating film IL2, thereby forming the contact plug CP which is formed of the barrier conductor film and the main conductor film that remain inside the contact hole CH. The contact plug CP is electrically connected to the respective source and drain regions, the gate electrode G1 (not illustrated), the gate electrode G2, the gate electrode G3 (not illustrated), the control gate electrode CG, or the memory gate electrode MG via the silicide layer S1.

Figure 29:
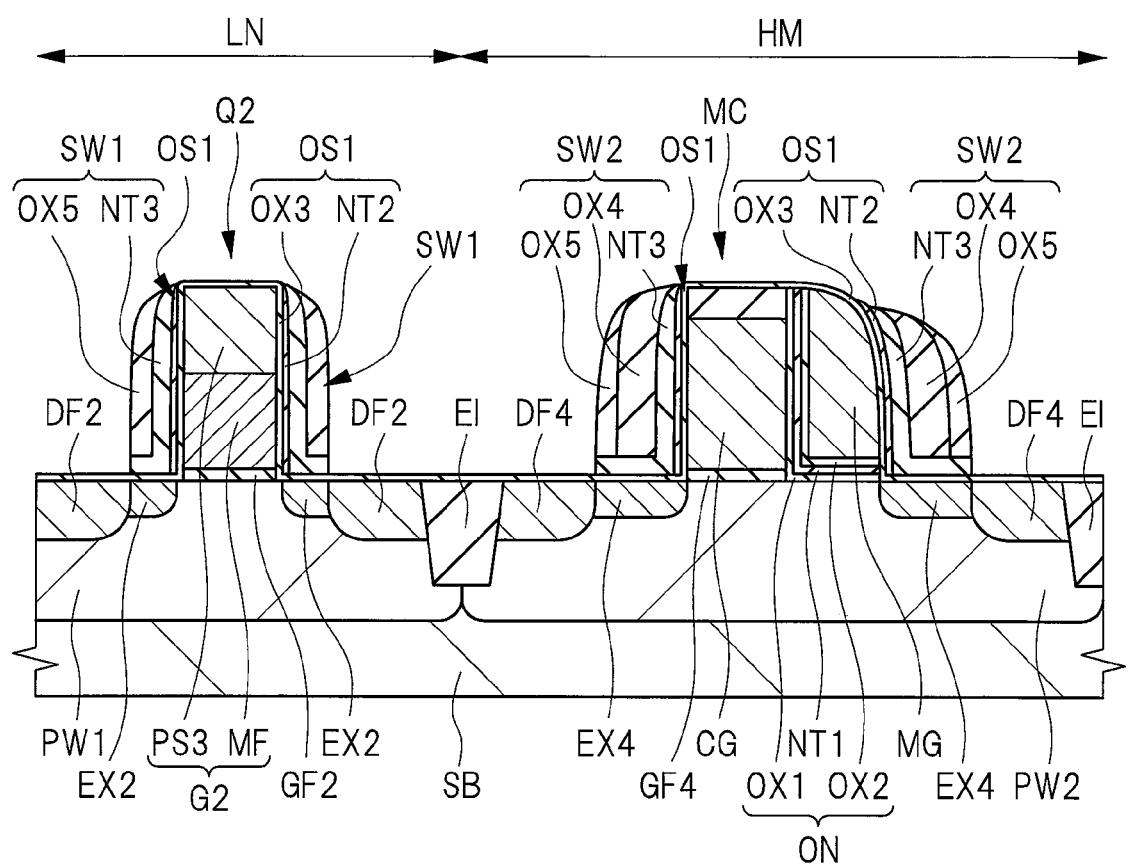
FIG. 29 is a cross-sectional view illustrating a part of FIG. 28 in an enlarged manner.

FIG. 29 illustrates a cross-sectional view of the MISFET Q2 and the memory cell MC, which are formed through the above-described manufacturing process in an enlarged manner. That is, FIG. 29 is the cross-sectional view illustrating a part of FIG. 28 in an enlarged manner. FIG. 29 illustrates the stacked structure of the ONO film ON and the stacked structure of the offset spacer OS1 in detail. In addition, FIG. 29 does not illustrate the silicide layer S1, the interlayer insulating film IL2, and the contact plug CP.

As illustrated in FIG. 29, the silicon oxide film OX3 forming the offset spacer OS1 is in contact with a sidewall of the silicon nitride film NT1 forming the ONO film ON. In addition, the ONO film ON is interposed between the control gate electrode CG and the memory gate electrode MG neighboring each other, and the corresponding ONO film ON is interposed between the memory gate electrode MG and the semiconductor substrate SB. That is, the ONO film ON has an L-like cross-sectional shape and is formed continuously from a portion between the control gate electrode CG and the memory gate electrode MG over a portion between the memory gate electrode MG and the semiconductor substrate SB.

<Regarding Operation of Non-Volatile Memory>

Next, an operation example of the non-volatile memory will be described with reference to FIG. 30.

The memory cell of the first embodiment has a MISFET structure and is configured to set a charge storage state of a trapping insulating film inside a gate electrode of the MISFET as memory information and to read the information as a threshold of the transistor. The trapping insulating film indicates an insulating film which is capable of storing a charge, and examples thereof may include a silicon nitride film and the like. The memory cell is caused to operate as a memory element by shifting the threshold of the MISFET by injecting or releasing the charge into or from such a charge storage region. Examples of the non-volatile semiconductor memory device that uses the trapping insulating film may include the split-gate type MONOS memory like the memory cell according to this embodiment.

FIG. 30 is a table illustrating an example of an application condition of a voltage to each portion of a selected memory cell during "programming", "erase" and "read" according to this embodiment. In the table of FIG. 30, a voltage Vmg to be applied to the memory gate electrode MG of the memory cell MC as illustrated in FIG. 29, a voltage Vs to be applied to the source region, a voltage Vcg to be applied to the control gate electrode CG, a voltage Vd to be applied to the drain region, and a base voltage Vb to be applied to the well PW2 in the upper surface of the semiconductor substrate SB are described each case of "programming", "erase" and "read". The selected memory cell used here indicates a memory cell which is selected as a target to perform "programming", "erase" or "read".

Incidentally, an active region on the right of the memory gate electrode MG is the source region and an active region on the left of the control gate electrode CG is the drain region in the example of the non-volatile memory illustrated in FIG. 29. In addition, the table illustrated in FIG. 30 is a preferred example of the application condition of the voltage, and the invention is not limited thereto but various modifications can be made if necessary. In addition, the injection of electrons into the silicon nitride film NT1 serving as a charge storage portion in the ONO film ON of the memory transistor is defined as "programming", and the injection of holes is defined as "erase" in this embodiment.

In addition, a field A in the table of FIG. 30 corresponds to a case in which a programming method is an SSI method and an erase method is a BTBT method, a field B corresponds to a case in which the programming method is the SSI method and the erase method is an FN method, a field C corresponds to a case in which the programming method is the FN method and the erase method is the BTBT method, and a field D corresponds to a case in which the programming method is the FN method and the erase method is the FN method.

The SSI method can be considered as an operation method in which programming of the memory cell is performed by injecting hot electrons into the silicon nitride film NT1, the BTBT method can be considered as an operation method in which erase of the memory cell is performed by injecting hot holes into the silicon nitride film NT1, and the FN method can be considered as an operation method in which programming or erase is performed using tunneling of electrons or holes. When the FN method is described in other words, programming in the FN method can be considered as an operating method in which programming of the memory cell is performed by injecting electrons into the silicon nitride film NT1 using an FN tunnel effect, erase in the FN method can be considered as an operating method in which erase of the memory cell is performed by injecting holes into the silicon nitride film NT1 using the FN tunnel effect. Hereinafter, these methods will be described in detail.

The programming method includes a programming method (hot electron injection programming method) in which programming is performed by injecting hot electrons using source side injection, that is, the so-called SSI method and a programming method (tunneling programming method) in which programming is performed using a Fowler Nordheim (FN) tunneling, that is, the so-called FN method.

During programming in the SSI method, for example, voltages (Vmg=10 V, Vs=5 V, Vcg=1 V, Vd=0.5 V, Vb=0 V) shown in "programming operation voltages" in the field A or the field B of the table of FIG. 30 are applied to each portion of the selected memory cell to which the programming is performed, and the programming is performed by injecting electrons into the silicon nitride film NT1 in the ONO film ON of the selected memory cell.

At this time, hot electrons are generated in a channel region (between the source and the drain) below the portion between the two gate electrodes (the memory gate electrode MG and the control gate electrode CG), and the hot electrons are injected into the silicon nitride film NT1 serving as the charge storage portion in the ONO film ON below the memory gate electrode MG. The injected hot electrons (electrons) are trapped in a trap level of the silicon nitride film NT1 of the ONO film ON, and as a result, a threshold voltage of the memory transistor increases. That is, the memory transistor is turned into a programming state.

During programming in the FN method, for example, voltages (Vmg=−12 V, Vs=0 V, Vcg=0 V, Vd=0 V, Vb=0 V) shown in "programming operation voltages" in the field C or the field D of the table of FIG. 30 are applied to each portion of the selected memory cell to which the programming is performed, and the programming is performed in the selected memory cell by tunneling electrons from the memory gate electrode MG and injecting the electrons into the silicon nitride film NT1 of the ONO film ON. At this time, the electrons are injected into the ONO film ON through tunneling of the silicon oxide film OX2 from the memory gate electrode MG according to the FN tunneling (FN tunnel effect), and are trapped in the trap level in the silicon nitride film NT1 of the ONO film ON, and as a result, the threshold voltage of the memory transistor increases. That is, the memory transistor is turned into the programming state.

Incidentally, it is also possible to perform programming by tunneling electrons from the semiconductor substrate SB and injecting the electrons into the silicon nitride film NT1 of the ONO film ON during the programming in the FN method. In this case, it is possible to apply programming operation voltages by inverting each polarity of "programming operation voltages" in the field C or the field D of the table of FIG. 30, for example.

The erase method includes an erase method (hot hole injection erase method) in which erase is performed by injecting hot holes using a band-to-band tunneling (BTBT) phenomenon, that is, the so-called BTBT method and an erase method (tunneling erase method) in which erase is performed using the FN tunneling, that is, the so-called FN method.

During erase in the BTBT method, the erase is performed by injecting holes, generated through the BTBT phenomenon, into the charge storage section (the silicon nitride film NT1 of the ONO film ON). For example, voltages (Vmg=−6 V, Vs=6 V, Vcg=0 V, Vd=open, Vb=0 V) shown in "erase operation voltages" in the field A or the field C of the table of FIG. 30 are applied to each portion of the selected memory cell to which the erase is performed. Accordingly, holes are generated using the BTBT phenomenon and accelerated under an electric field so that the holes are injected into the silicon nitride film NT1 in the ONO film ON of the selected memory cell, and accordingly, the threshold voltage of the memory transistor is decreased. That is, the memory transistor is turned into an erase state.

During erase in the FN method, for example, voltages (Vmg=12 V, Vs=0 V, Vcg=0 V, Vd=0 V, Vb=0 V) shown in "erase operation voltages" in the field B or the field D of the table of FIG. 30 are applied to each portion of the selected memory cell to which the erase is performed. Then, the erase is performed in the selected memory cell by tunneling holes from the memory gate electrode MG and injecting the holes into the silicon nitride film NT1 of the ONO film ON. At this time, the holes are injected into the ONO film ON through tunneling of the silicon oxide film OX2 from the memory gate electrode MG according to the FN tunneling (FN tunnel effect), and are trapped in the trap level in the silicon nitride film NT1 of the ONO film ON, and as a result, the threshold voltage of the memory transistor decreases. That is, the memory transistor is turned into the erase state.

Incidentally, it is also possible to perform the erase by tunneling holds from the semiconductor substrate SB and injecting the holes into the silicon nitride film NT1 of the ONO film ON during the erase in the FN method. In this case, it is possible to apply erase operation voltages by inverting each polarity of "erase operation voltages" in the field B or the field D of the table of FIG. 30, for example.

During read, for example, voltages shown in "read operation voltages" in the field A, the field B, the field C or the field D of the table of FIG. 30 are applied to each portion of the selected memory cell to which the read is performed.

When the voltage Vmg to be applied to the memory gate electrode MG during the read is set to be a value between the threshold voltage of the memory transistor in the programming state and the threshold voltage thereof in the erase state, it is possible to determine whether the memory transistor is in the programming state or the erase state.

<Regarding Effect of First Embodiment>

Hereinafter, a problem of a semiconductor device according to a comparative example will be described with reference to FIGS. 62 to 68, and effects of the semiconductor device according to the first embodiment and the manufacturing method thereof will be described with reference to FIG. 29 and the like. FIGS. 62 to 68 are cross-sectional views during a process of manufacturing the semiconductor device according to the comparative example, and are the cross-sectional view illustrating the logic circuit region LN and the memory cell MC similarly to FIGS. 20 to 28.

A transistor forming a logic circuit is driven with a lower voltage than a transistor to be formed in an I/O region or a memory cell region, and thus, a high breakdown voltage performance is not required. Thus, a risk that punch-through occurs between source and drain regions is lower in a low breakdown voltage MISFET forming the logic circuit than in a high breakdown voltage transistor to be formed in the I/O region or the memory cell region, and a leakage current is hardly generated between the drain region and the gate electrode. Accordingly, it is possible to realize improvement in integration degree, low power consumption and high-speed operation of elements in the low breakdown voltage MISFET in a relatively easy manner by reducing an interval between the source and drain regions.

There is a method of reducing a width of a sidewall to be used as a mask for ion implantation at the time of forming a diffusion layer forming the source and drain regions as a method of reducing of the distance between the source and drain regions in order to form such a low breakdown voltage MISFET. However, the high breakdown voltage MISFET such as a memory cell requires a higher breakdown voltage as compared to the low breakdown voltage MISFET, and thus, it is necessary to secure a large interval between the source and drain regions. Accordingly, it is necessary to form a sidewall, which is adjacent to the gate electrode (for example, a control gate electrode or the like), to have a large width. That is, it is necessary to form a plurality of kinds of sidewalls having different widths on a semiconductor substrate in order to realize a sufficient breakdown voltage performance of the high breakdown voltage MISFET and to narrow the interval between the source and drain regions of the low breakdown voltage MISFET. Hereinafter, a description will be given regarding the method of manufacturing the semiconductor device according to the comparative example in which the above-described sidewalls are formed.

Figure 62:
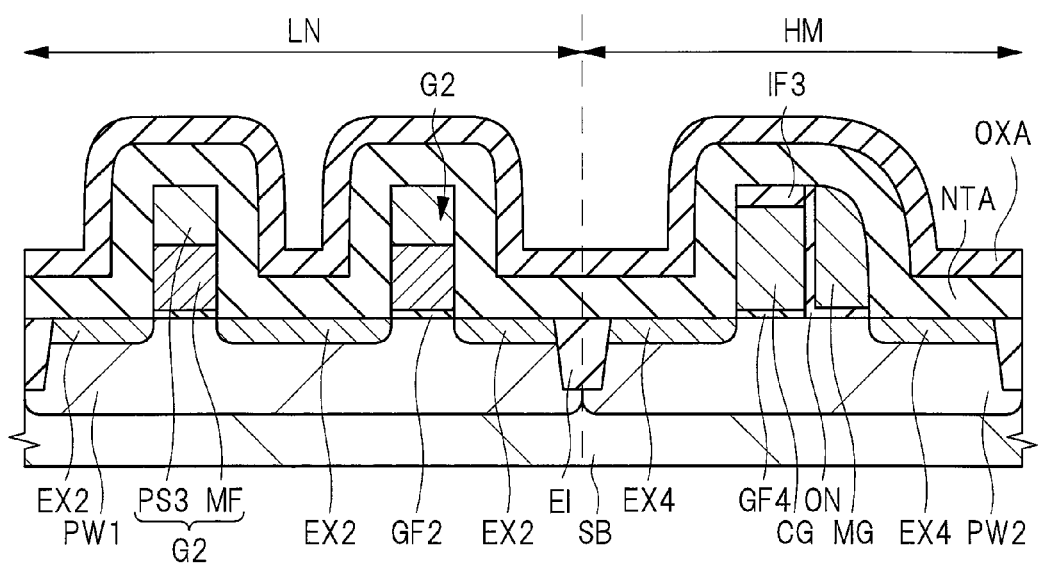
FIG. 62 is a cross-sectional view during a process of manufacturing a semiconductor device according to a Comparative Example.

First, various gate electrodes are formed by performing the same processes as the processes that have been described with reference to FIGS. 1 to 12, and then, an offset spacer (not illustrated) covering sidewalls of the various gate electrodes, and the extension regions EX2 and EX4 of the main surface of the semiconductor substrate SB are formed as illustrated in FIG. 62. Subsequently, a silicon nitride film NTA and a silicon oxide film OXA are sequentially formed on the semiconductor substrate SB using a CVD method or the like. Here, a distance between the gate electrodes G2 in the logic circuit region LN is, for example, 108 to 128 nm. In addition, a film thickness of the silicon nitride film NTA is 20 nm, and a film thickness of the silicon oxide film OXA is 26 nm. Accordingly, a gap between the gate electrode G2 is not completely embedded by forming the silicon nitride film NTA and the silicon oxide film OXA.

Figure 63:
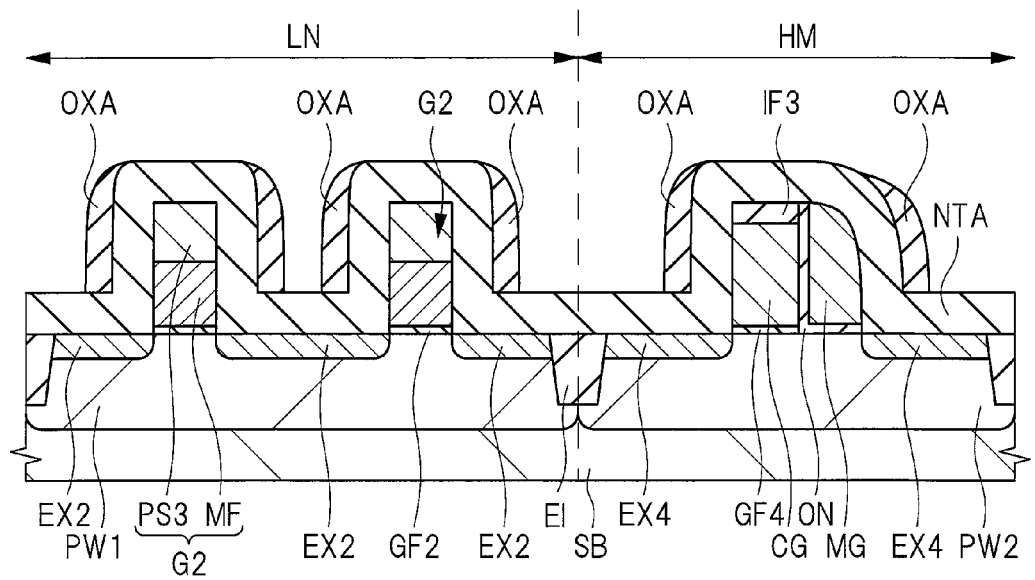
FIG. 63 is a cross-sectional view during the process of manufacturing the semiconductor device continued from FIG. 62.
Figure 64:
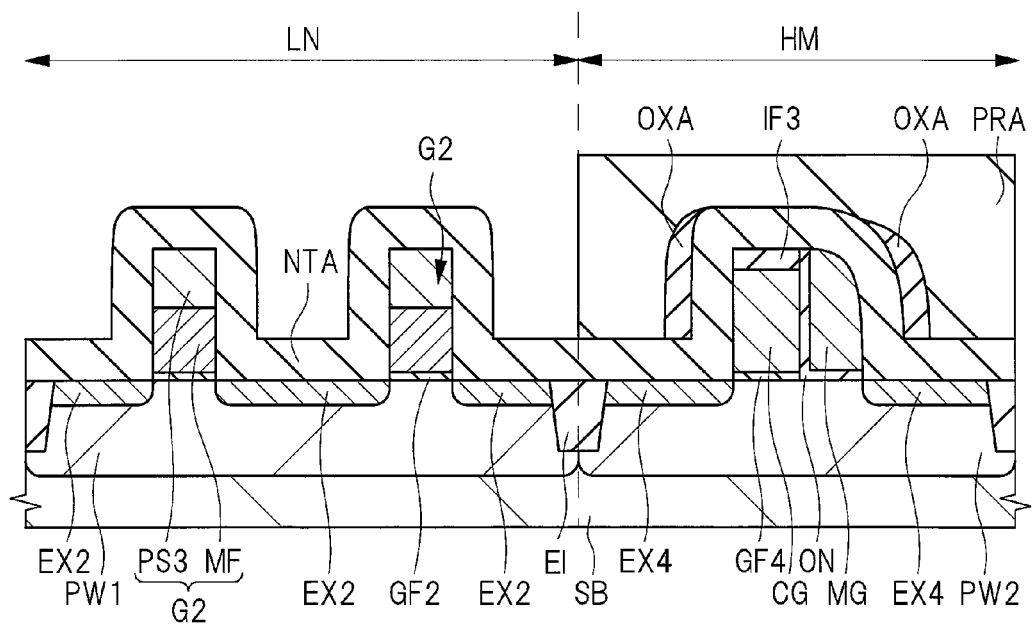
FIG. 64 is a cross-sectional view during the process of manufacturing the semiconductor device continued from FIG. 63.
Figure 65:
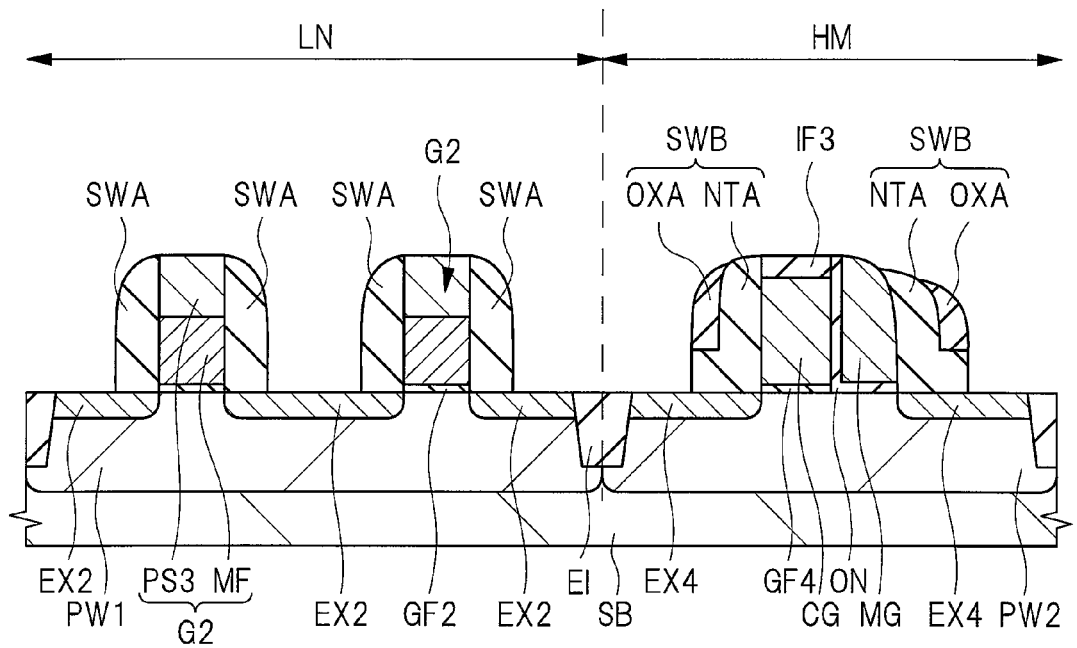
FIG. 65 is a cross-sectional view during the process of manufacturing the semiconductor device continued from FIG. 64.

Next, etchback is performed to form the silicon oxide film OXA in a sidewall shape and to expose the upper surface of the silicon nitride film NTA as illustrated in FIG. 63. Next, the memory cell region HM is covered by a photoresist film PRA, and the silicon oxide film OXA in the logic circuit region LN is removed as illustrated in FIG. 64. Next, the photoresist film PRA is removed, and then, etchback is selectively performed to remove the silicon nitride film NTA that is exposed from the silicon oxide film OXA so that the main surface of the semiconductor substrate SB is exposed as illustrated in FIG. 65.

Accordingly, a sidewall SWA, formed using the silicon nitride film NTA, is formed over the sidewalls of the gate electrode G2, and a sidewall SWB, formed using the silicon nitride film NTA and the silicon oxide film OXA, is formed over sidewalls of a pattern including the control gate electrode CG, the memory gate electrode MG, and the ONO film ON. A width of the sidewall SWA is 26 nm, which is a width of the silicon nitride film NTA, and a width of the sidewall SWB is 46 nm obtained by adding each film thickness of the silicon nitride film NTA and the silicon oxide film OXA.

In this manner, it is possible to form the sidewalls SWA and SWB having two kinds of different widths. Thereafter, a diffusion layer is formed by performing ion implantation using the sidewalls SWA and SWB and the like as a mask, and the low breakdown voltage MISFET including the gate electrode G2 and the memory cell including the control gate electrode CG and the memory gate electrode MG are formed although not illustrated.

Due to a request for miniaturization of a semiconductor device, there is a tendency that each interval among a plurality of gate electrodes of low breakdown voltage MISFET's forming the logic circuit is reduced more than each interval among a plurality of gate electrodes of high breakdown voltage transistors to be formed in the I/O region or the memory cell region. The interval between the gate electrodes of the low breakdown voltage MISFET, for which a high degree of integration is required as above, is reduced more and more along with the miniaturization of the semiconductor device. Although the description has been given in FIGS. 62 to 65 regarding the case in which the interval between the gate electrodes in the logic circuit region is relatively large, a description will be given regarding a problem that is caused when the interval between the gate electrodes in the logic circuit region is small, hereinafter, as a method of manufacturing a semiconductor device according to a comparative example. Here, a distance between the gate electrodes in the logic circuit region is 90 nm.

Figure 66:
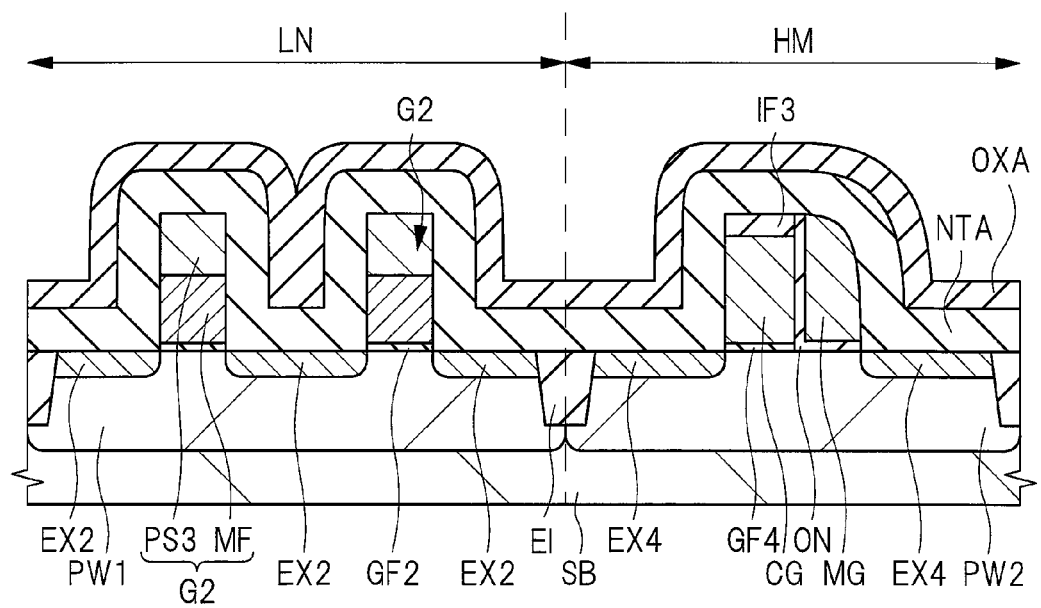
FIG. 66 is a cross-sectional view during the process of manufacturing the semiconductor device continued from FIG. 65.

In this case, when the silicon nitride film NTA and the silicon oxide film OXA that cover the gate electrode G2, the control gate electrode CG and the memory gate electrode MG are formed by performing the process that has been described with reference to FIG. 62, the gate between the gate electrodes G2 in the logic circuit region LN is completely embedded by the silicon nitride film NTA and the silicon oxide film OXA as illustrated in FIG. 66. That is, the silicon oxide films OXA, each of which is formed along each of opposing sidewalls of the gate electrode G2, are in contact with each other since a total film thickness of the silicon nitride film NTA and the silicon oxide film OXA is 46 nm, and the distance between the gate electrodes G2 is 90 nm.

Figure 67:
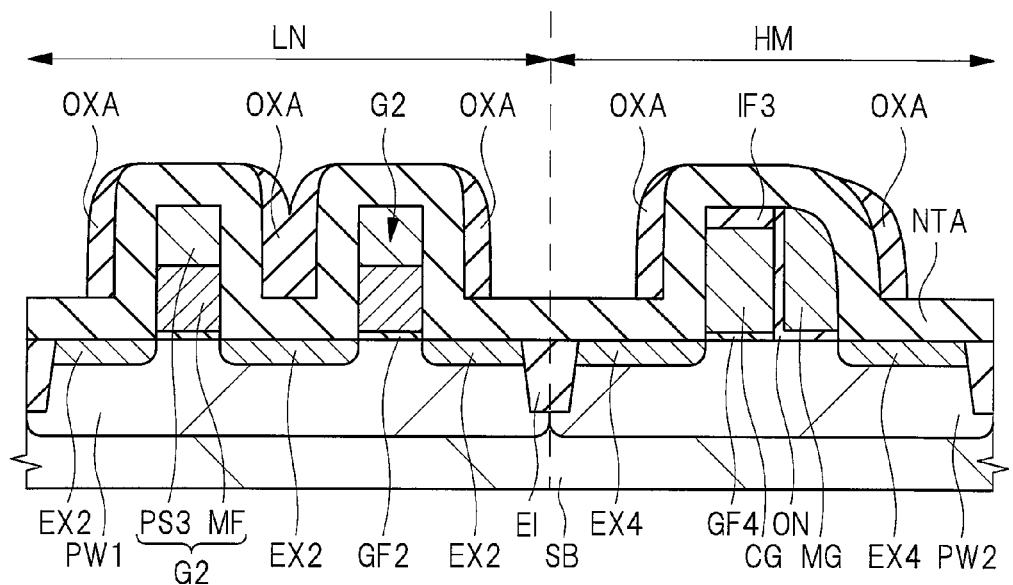
FIG. 67 is a cross-sectional view during the process of manufacturing the semiconductor device continued from FIG. 66.

Next, the silicon oxide film OXA is subjected to etchback as illustrated in FIG. 67 by performing the same process as the process that has been described with reference to FIG. 63. Subsequently, the memory cell region HM is covered by the photoresist film PRA.

Figure 68:
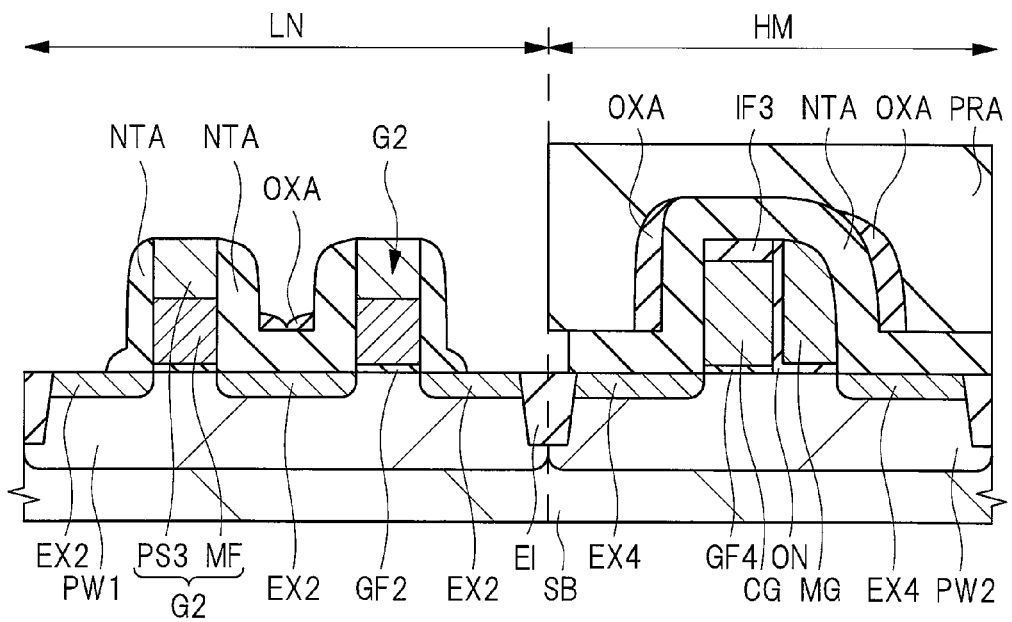
FIG. 68 is a cross-sectional view during a process of manufacturing a semiconductor device according to a Comparative Example.

Next, etching is performed using the photoresist film PRA as a mask to remove the silicon oxide film OXA in the logic circuit region LN as illustrated in FIG. 68 by performing the same process as the process that has been described with reference to FIG. 64. However, it is difficult to remove the silicon oxide film OXA embedded between the gate electrodes G2 with the etching amount at a level of removing the sidewall-shaped silicon oxide film OXA that is not embedded between the gate electrodes G2, and there is a risk that the silicon oxide film OXA remains between the gate electrodes G2.

In this case, it is difficult to remove the silicon nitride film NTA below the silicon oxide film OXA remaining between the gate electrodes G2 even when the process of removing the silicon nitride film NTA that has been described with reference to FIG. 65 is subsequently performed, and it is difficult to form a desired diffusion layer on the main surface of the semiconductor substrate SB between the gate electrodes G2 in the subsequent ion implantation process. Accordingly, there occurs a problem that the reliability of the semiconductor device deteriorates.

In addition, when the etching amount is increased in order to completely remove the silicon oxide film OXA between the gate electrodes G2, illustrated in FIG. 68, by etching, the silicon nitride film NTA, covered by the silicon oxide film OXA that is not embedded between the gate electrodes G2, is excessively etched by the etching, and the film thickness of the silicon nitride film NTA on some of the sidewalls of the gate electrode G2 is decreased. Accordingly, a variation is caused in widths of sidewalls, which are formed, respectively, on both sides of the gate electrode G2, and there occurs the problem that the reliability of the semiconductor device deteriorates.

In addition, when the etching amount is increased in order to completely remove the silicon oxide film OXA between the gate electrodes G2, illustrated in FIG. 68, by etching, the silicon nitride film NTA covered by the silicon oxide film OXA that is not embedded between the gate electrodes G2 is excessively etched by the etching, and the main surface of the semiconductor substrate SB are exposed in some cases. Thereafter, when the process of removing the silicon nitride film NTA that has been described with reference to FIG. 65 is performed, the exposed main surface of the semiconductor substrate SB is recessed, and further, the main surface is damaged. When the main surface of the semiconductor substrate SB is recessed, the punch-through between the source and drain regions is likely to occur, and there occurs a problem that the breakdown voltage of the MISFET decreases.

Such a problem occurs because the sidewall SWB (see FIG. 65) of the high breakdown voltage MISFET is formed only using the silicon nitride film NTA and the silicon oxide film OXA which are formed in the process that has been described with reference to FIG. 62. Incidentally, a film thickness (width) of the offset spacer (not illustrated) is enough small to be ignorable in the above-described problem in relation to the embodiment between the gate electrodes G2.

Thus, in this embodiment, the silicon nitride film NT3 and the silicon oxide film OX4 are formed through the process that has been described with reference to FIG. 20, then, the silicon oxide film OX4 in the logic circuit region LN is removed, and the sidewall SW2 (see FIG. 24), which includes the silicon oxide film OX5 (see FIG. 23) to be formed thereafter, the silicon oxide film OX4, and the silicon nitride film NT3, is formed. Thus, the silicon oxide films OX4 and OX5, and the silicon nitride film NT3 are not simultaneously formed between the neighboring gate electrodes G2. That is, an insulating film having a total film thickness (a+b+c) of 46 nm is not formed at the same time in the region between the gate electrodes G2 that has the width of 90 nm. Accordingly, it is possible to prevent the generation of the problem in the comparative example illustrated in FIG. 68 in which it is difficult to suitably remove the insulating film between the gate electrodes G2.

That is, the sidewall SW2 of the high breakdown voltage MISFET is not formed only using the silicon nitride film NT3 and the silicon oxide film OX4 (see FIG. 20), which are formed first in the process of forming the sidewalls SW1 and SW2, but the silicon oxide film OX4 in the logic circuit region LN is removed after depositing the silicon nitride film NT3 and the silicon oxide film OX4 in this embodiment. Further, the silicon oxide film OX5 is formed thereafter, and a required width of the sidewall SW2 is secured by the total film thickness of the three films including the silicon oxide films OX4 and OX5, and the silicon nitride film NT3.

Thus, it is unnecessary for the total film thickness of the silicon nitride film NT3 and the silicon oxide film OX4, which are formed first in the process of forming the sidewalls SW1 and SW2, to satisfy the required width of the sidewall SW2. Accordingly, it is possible to prevent the gap between the gate electrode G2 from being embedded at the time of forming the silicon nitride film NT3 and the silicon oxide film OX4 first in the process of forming the sidewalls SW1 and SW2.

Accordingly, the removal failure of the insulating film, which has been described using the comparative example of FIG. 68, does not occur, and thus, it is possible to form the desired diffusion layer in the logic circuit region LN in the ion implantation process that is performed after the process that has been described with reference to FIG. 24. In addition, it is possible to prevent the generation of the variation in width of the sidewall SW1 beside the gate electrode G2. In addition, it is possible to prevent the recess of the main surface of the semiconductor substrate SB in the process of removing the silicon nitride film NT3 (see FIG. 24) that is caused when a part of the silicon nitride film NT3 is excessively removed in the process of removing the silicon oxide film OX4 (see FIG. 22). Accordingly, it is possible to improve the reliability of the semiconductor device.

In addition, it is possible to secure the breakdown voltage of the high breakdown voltage MISFET and to narrow the interval between the source and drain regions of the low breakdown voltage MISFET by forming the sidewalls SW1 and SW2 having different widths. Thus, it is possible to realize the improvement in integration degree, the low power consumption, and the high-speed operation of the low breakdown voltage MISFET.

In addition, other effects of the first embodiment will be described hereinafter.

In this embodiment, an outer sidewall of sidewall SW2 illustrated in FIG. 29, that is, the sidewall of the sidewall SW2 at the opposite side of the sidewall on the pattern including the control gate electrode CG and the memory gate electrode MG is configured using silicon oxide. That is, the silicon oxide films OX4 and OX5 are formed on the outer sidewall side of the sidewall SW2 among the sidewalls SW2. In addition, the silicon oxide film OX5 is formed on an outer sidewall of the sidewall SW1.

The silicon oxide film is more easily shaved than the silicon nitride film in various processes after the process of forming the sidewall SW2. That is, the silicon oxide films OX5 and OX4 are shaved through, for example, the wet etching process of removing an unreacted metal film, which is performed after forming the silicide layer S1 (see FIG. 26), or a cleaning process. In particular, the silicon oxide films OX5 and OX4 damaged in the ion implantation process, which has been described with reference to FIG. 25, are likely to be shaved by the above-described wet etching process or the cleaning process.

Accordingly, each width of the sidewalls SW1 and SW2 decreases after the ion implantation process because the silicon oxide films OX5 and OX4 have been shaved. In this case, a region, which is configured to form the contact hole CH and the contact plug CP (see FIG. 28), is increased on the upper surface of the source and drain regions. Accordingly, it is possible to prevent generation of connection failure in the contact plug CP, which is caused when the contact hole is not opened at the time of forming the contact hole, even in the case of reducing each interval between the gate electrodes G2 in the logic circuit region LN and between the patterns including the control gate electrode CG and the memory gate electrode MG in the memory cell region HM. Accordingly, it is possible to miniaturize the semiconductor device.

In addition, it is possible to use the silicon nitride film NT3, which is a different type of film from the silicon oxide film OX4, as the etching stopper film in the etchback process of the silicon oxide film OX4 that has been described with reference to FIG. 21 in this embodiment, and thus, it is possible to perform the highly accurate etching. In addition, it is possible to use the silicon nitride film NT3 as the etching stopper film in the etchback process of the silicon oxide film OX5 that has been described with reference to FIG. 24, and thus, it is possible to perform the highly accurate etching. In addition, it is possible to use a part of the silicon oxide film OX3 (see FIG. 29) as the etching stopper film in the etchback process of the silicon nitride film NT3 that has been described with reference to FIG. 24, and thus, it is possible to perform the highly accurate etching.

That is, it is possible to prevent the recess of the main surface of the semiconductor substrate SB which is caused as the main surface of the semiconductor substrate SB is exposed to etching due to the excessive etching. That is, it is possible to prevent the decrease of the breakdown voltage of the MISFET.

In addition, when a part of an offset spacer is configured using a silicon nitride film, which is the same material as an ONO film, for example, it is considered a case in which sidewalls of the silicon nitride film, which is in the ONO film below a memory gate electrode, is in contact with the above-described silicon nitride film forming the offset spacer. In this case, there is a possibility that hot electrons generated during a programming operation are trapped by the offset spacer, formed using the silicon nitride film, in the vicinity of an end portion of the memory gate electrode since the above-described silicon nitride film has the charge storage function. Further, there is a risk that electrons are further stored in the offset spacer while the programming operation is repeated, and a threshold voltage in the vicinity of the end portion of the memory gate electrode increases. Such an increase of the threshold voltage leads to deterioration in mutual conductance, which is a ratio of a change in drain current in relation to a change in gate voltage, and a decrease in read current.

With respect to this, the sidewalls of the ONO film ON below the memory gate electrode MG, which forms the memory cell MC of the MONOS memory illustrated in FIG. 29, is not in contact with the silicon nitride film but is in contact with the silicon oxide film OX3 forming the offset spacer OS1. Accordingly, it is possible to prevent the threshold voltage of the MISFET, which forms the memory cell MC, from abnormally increasing due to the storage of the charge inside the offset spacer OS1 during the programming operation of the memory cell MC.

<Modification Example 1>

Hereinafter, a description will be given regarding a process of manufacturing a semiconductor device according to Modification Example 1 of the first embodiment with reference to FIGS. 31 to 43. FIGS. 31 to 43 are cross-sectional views during the process of manufacturing the semiconductor device according to Modification Example 1. FIGS. 31 to 37 are the cross-sectional views illustrating the logic circuit regions LP and LN, the I/O region HV, and the memory cell region HM similarly to FIG. 1. FIGS. 38 to 43 are cross-sectional views illustrating the logic circuit region LN and the memory cell region HM similarly to FIG. 20.

Here, the case of forming a metal gate electrode using the gate-last process will be described. In addition, a second method of forming an offset spacer will be described here with reference to FIGS. 34 to 37. FIGS. 38 to 43, used to describe processes after forming the offset spacer, illustrate the offset spacer OS2 actually having the stacked structure (see FIG. 37) as a single film in order to facilitate understanding of the drawings.

In addition, each manufacturing process in the logic circuit region LP and the I/O region HV will not be described in FIGS. 38 to 43 and only the logic circuit region LN and the memory cell region HM will be illustrated. The manufacturing process in the logic circuit region LP is performed in the same manner as in the logic circuit region LN, and the manufacturing process in the I/O region HV is performed in the same manner as in the memory cell region HM. However, p-type impurities are injected during an ion implantation process, which is performed in order to form diffusion layers forming source and drain regions, in each manufacturing process in the logic circuit region LP and the I/O region HV, which is different from the logic circuit region LN and the memory cell region HM. In addition, FIGS. 38 to 43 illustrate cross-sectional views of the case of forming two MISFETs side by side in the logic circuit region LN.

Incidentally, a distance between neighboring dummy gate electrodes DG2 in the logic circuit region LN illustrated in FIGS. 38 to 43 is 90 nm, for example, when ignoring a film thickness of the offset spacer OS2. When considering the film thickness of the offset spacer OS2, a distance between the offset spacers OS2, each of which covers each of opposing sidewalls of the neighboring dummy gate electrodes DG2, is 90 nm.

Figure 31:
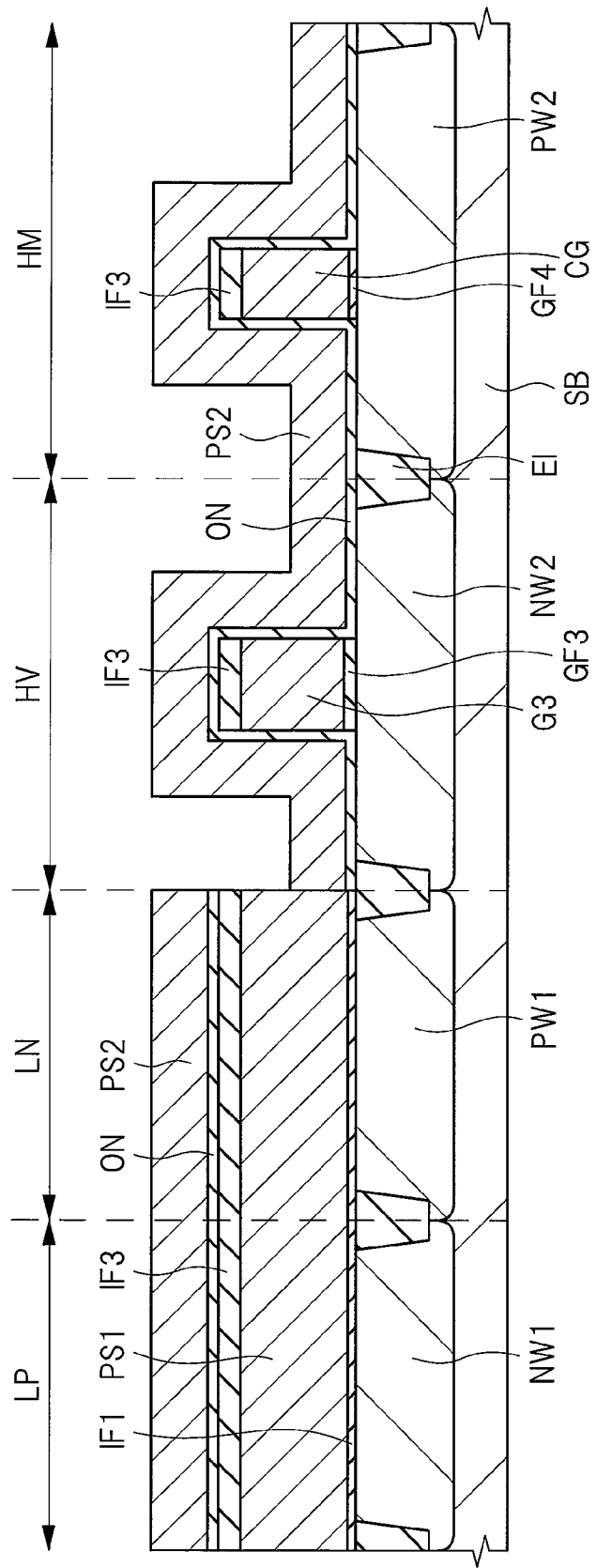
FIG. 31 is a cross-sectional view during a process of manufacturing a modification example 1 of a semiconductor device according to a first embodiment.
Figure 32:
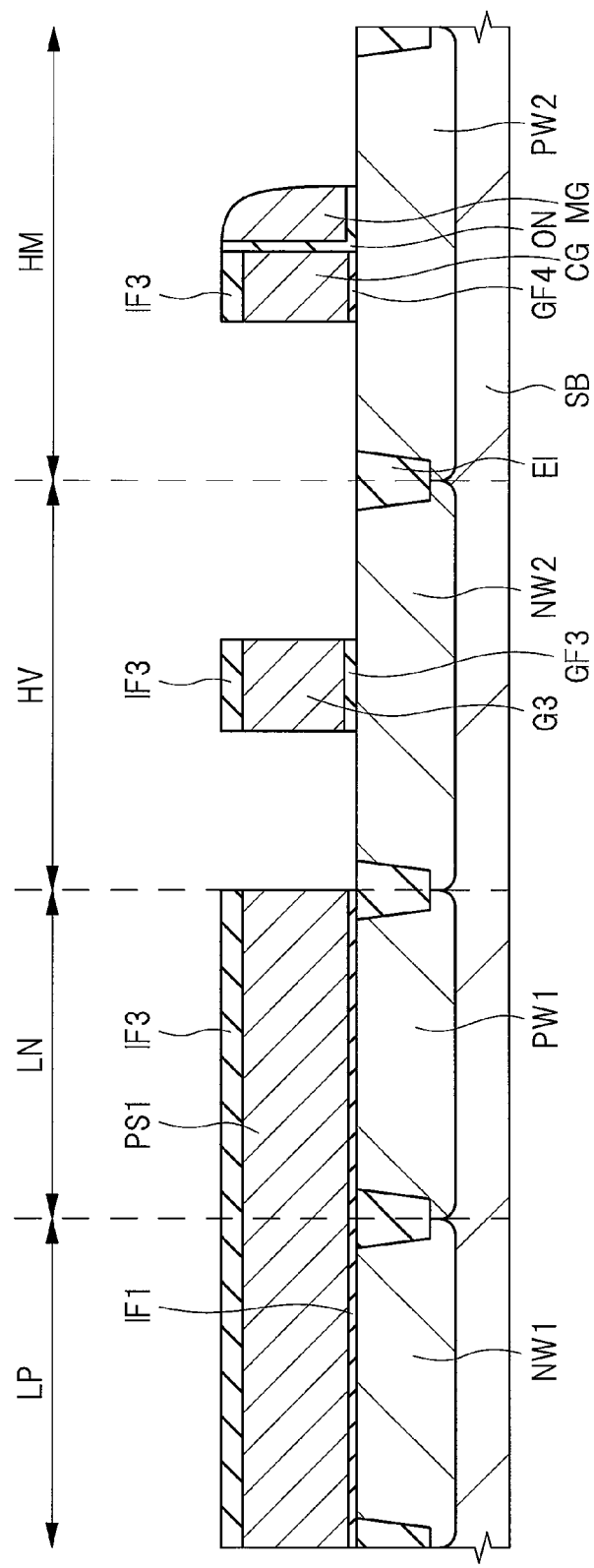
FIG. 32 is a cross-sectional view during the process of manufacturing the semiconductor device continued from FIG. 31.

First, the processes that have been described with reference to FIGS. 1 to 3 are performed, and then, the same processes as the processes that have been described with reference to FIGS. 4 and 5 are performed, thereby obtaining a structure, which is the same as the structure illustrated in FIGS. 4 and 5, as illustrated in FIG. 31. Next, the same processes as the processes that have been described with reference to FIGS. 6 and 7 are performed, thereby obtaining a structure, which is the same as the structure illustrated in FIG. 7, as illustrated in FIG. 32.

Figure 33:
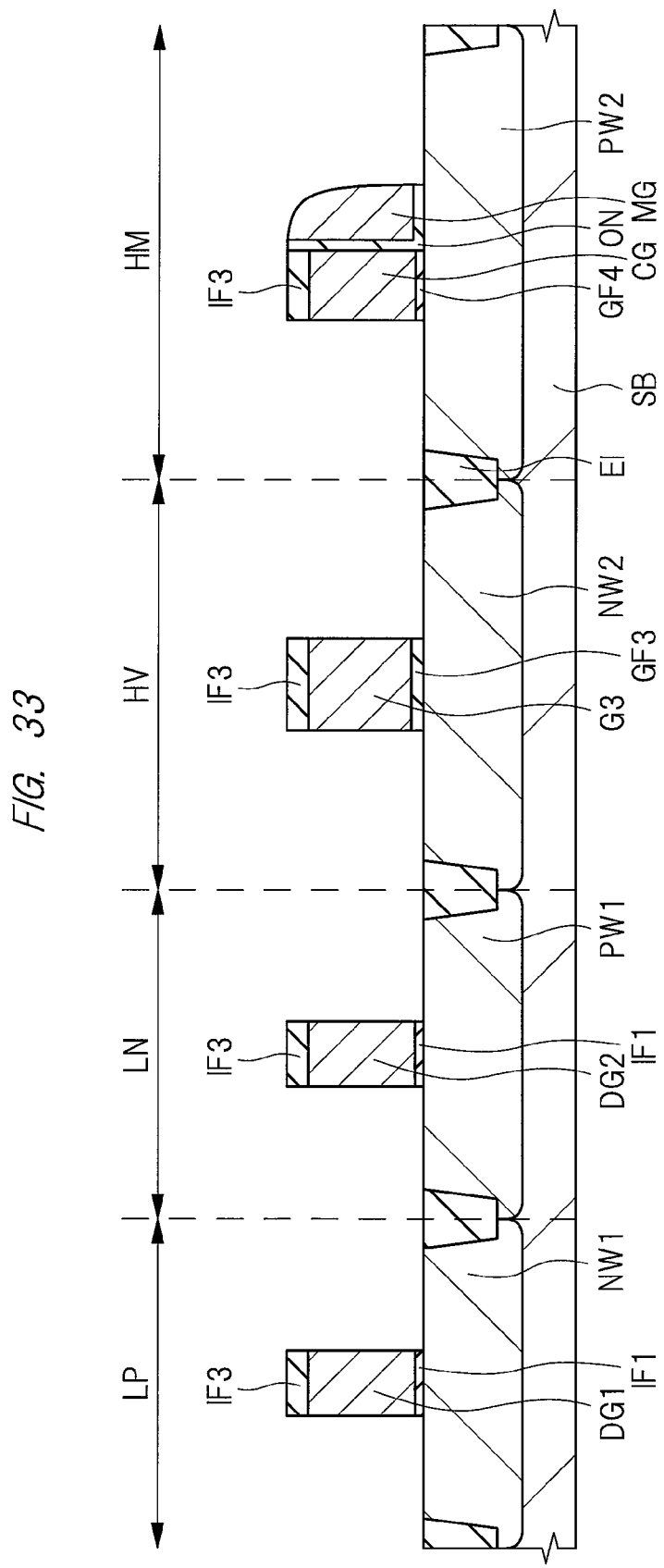
FIG. 33 is a cross-sectional view during the process of manufacturing the semiconductor device continued from FIG. 32.

Next, the insulating film IF3, the polysilicon film PS1, and the insulating film IF1 in the logic circuit regions LP and LN are patterned using a photolithography technique and a dry etching method, and a dummy gate electrode DG1, formed using the polysilicon film PS1 in the logic circuit region LP, and the dummy gate electrode DG2, formed using the polysilicon film PS1 in the logic circuit region LN, are formed as illustrated in FIG. 33. The dummy gate electrodes DG1 and DG2 are pseudo gate electrodes which will be removed and replaced with metal gate electrodes in the subsequent process.

Figure 34:
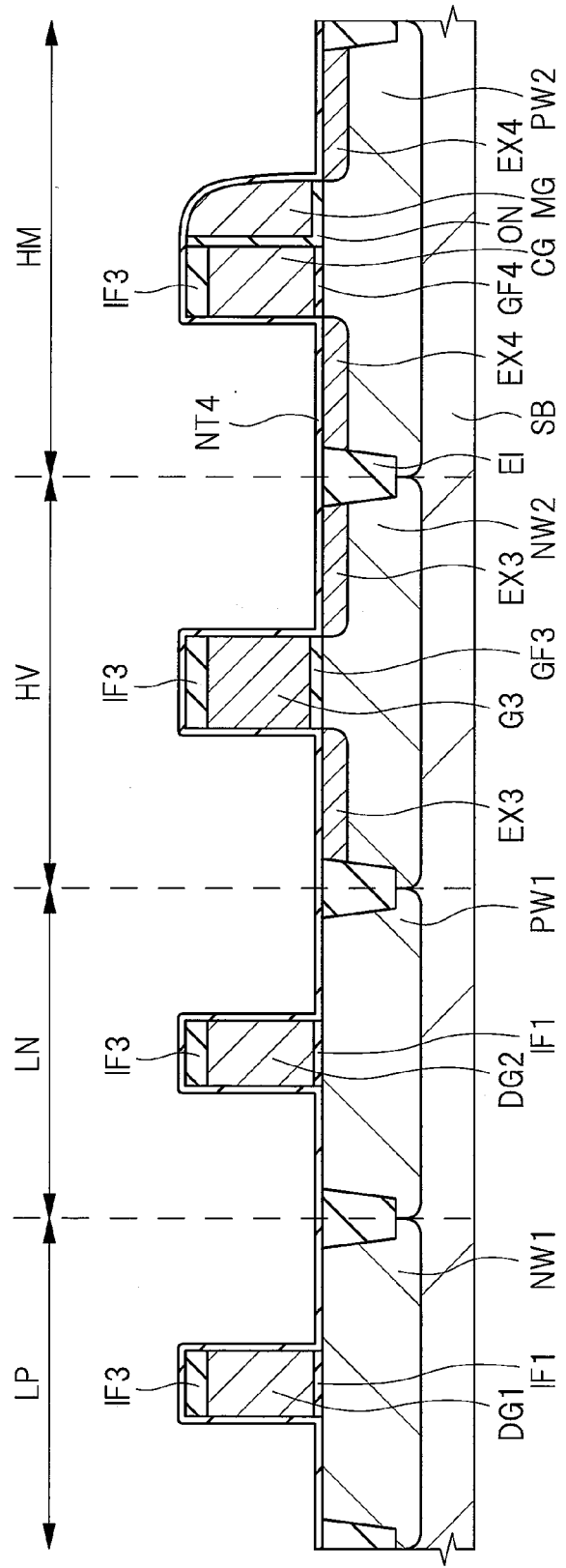
FIG. 34 is a cross-sectional view during the process of manufacturing the semiconductor device continued from FIG. 33.

Next, the same processes as the processes that have been described with reference to FIGS. 13 and 14 are performed, and subsequently, the photoresist film PR2 is removed. Thereafter, a silicon nitride film NT4 is formed on the main surface of the semiconductor substrate SB using, for example, a CVD method as illustrated in FIG. 34. A film thickness of the silicon nitride film NT4 is, for example, 5 nm.

Figure 35:
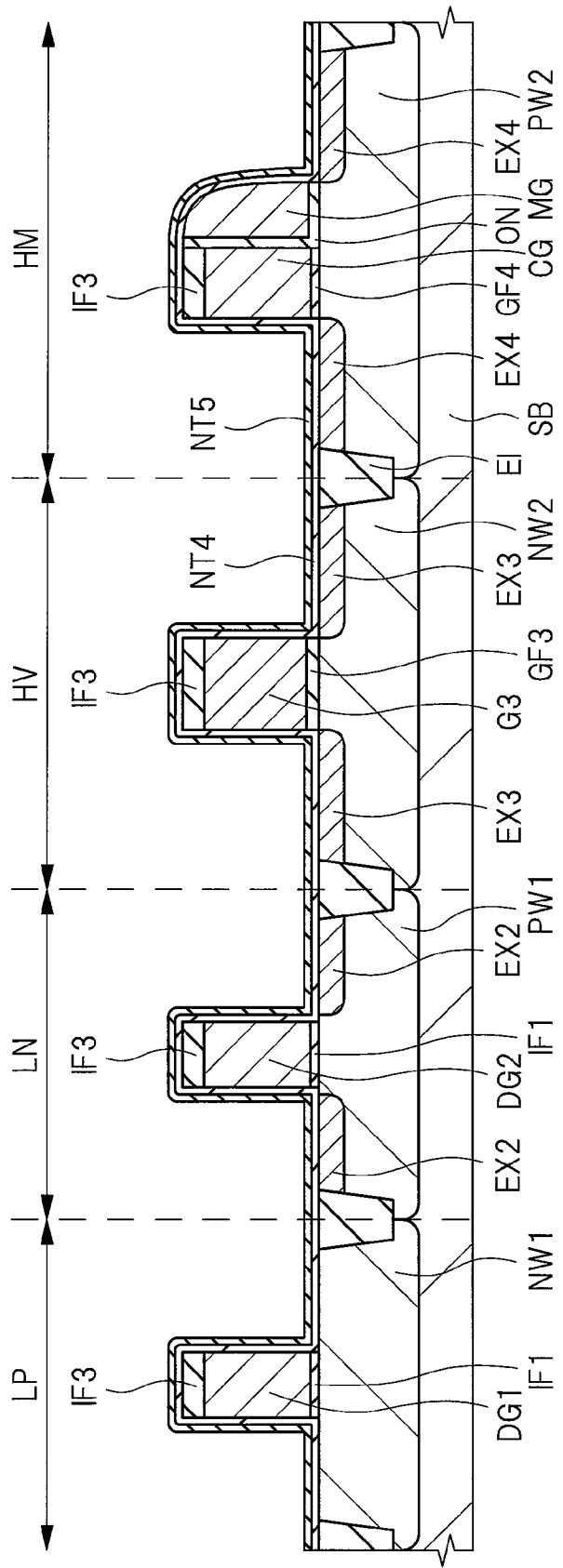
FIG. 35 is a cross-sectional view during the process of manufacturing the semiconductor device continued from FIG. 34.

Next, the same process as the process that has been described with reference to FIG. 16 is performed, and then, a silicon nitride film NT5 is formed on the silicon nitride film NT4 using, for example, a CVD method as illustrated in FIG. 35. That is, the main surface of the semiconductor substrate SB is covered by the silicon nitride films NT4 and NT5 which are sequentially formed on the main surface of the semiconductor substrate SB. A film thickness of the silicon nitride film NT5 is, for example, 5 nm.

Figure 36:
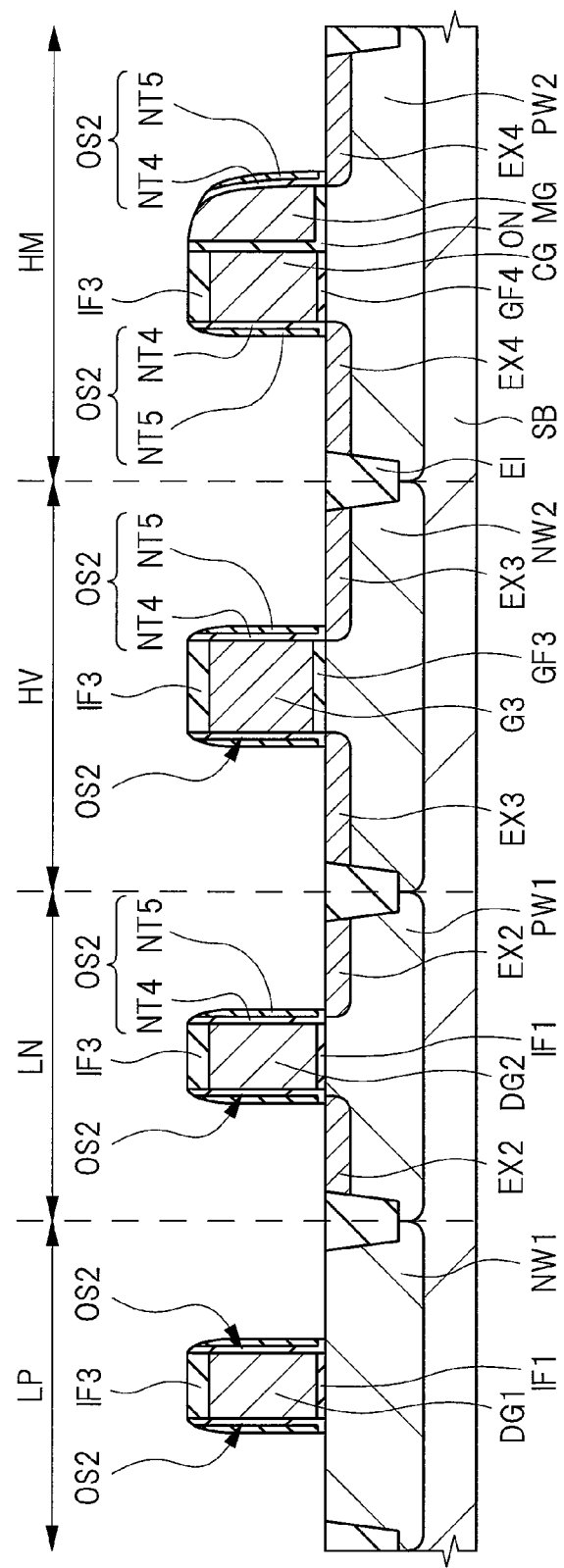
FIG. 36 is a cross-sectional view during the process of manufacturing the semiconductor device continued from FIG. 35.

Next, etchback is performed to remove apart of a stacked film, which is formed of the silicon nitride films NT4 and NT5, so that each upper surface of the main surface of the semiconductor substrate SB and the insulating film IF3 is exposed as illustrated in FIG. 36. Accordingly, the stacked films, each of which remains in a sidewall-shaped over each sidewall of the dummy gate electrodes DG1 and DG2, the gate electrode G3, and the pattern including the control gate electrode CG and the memory gate electrode MG, form the offset spacer OS2.

Figure 37:
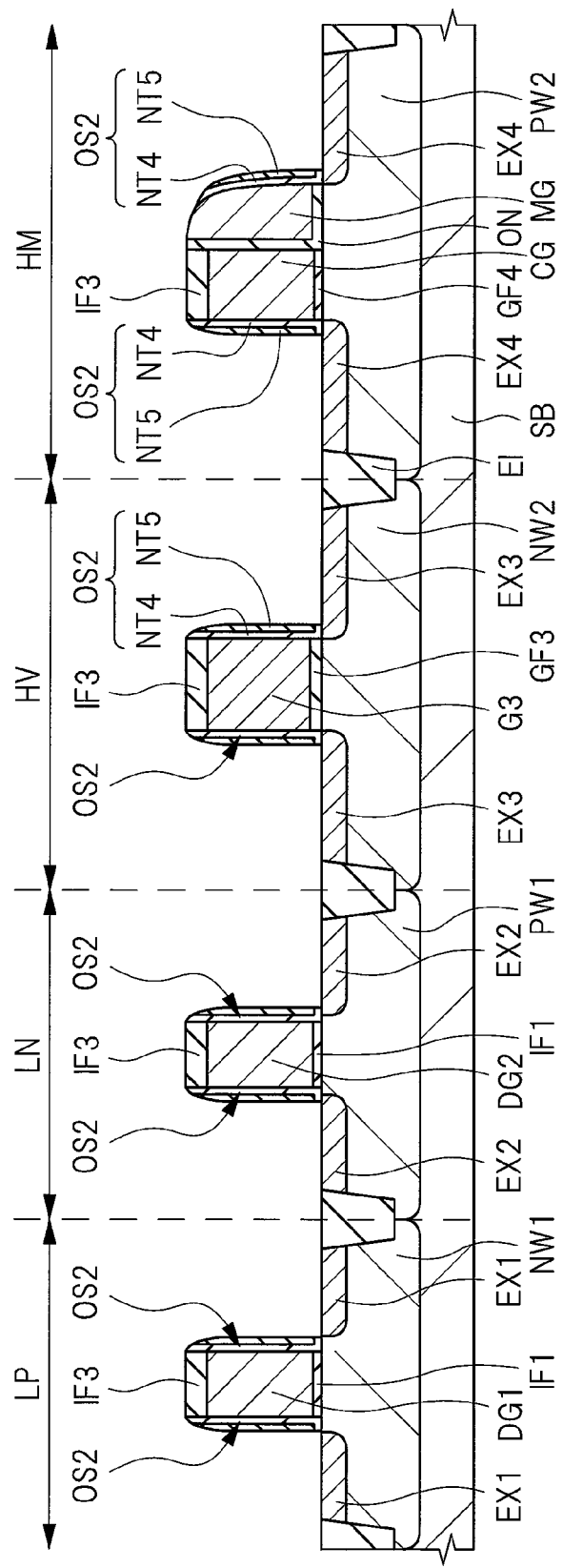
FIG. 37 is a cross-sectional view during the process of manufacturing the semiconductor device continued from FIG. 36.

Next, the same processes as the processes that have been described with reference to FIGS. 18 and 19 are performed, thereby forming the extension region EX1 as illustrated in FIG. 37.

Figure 38:
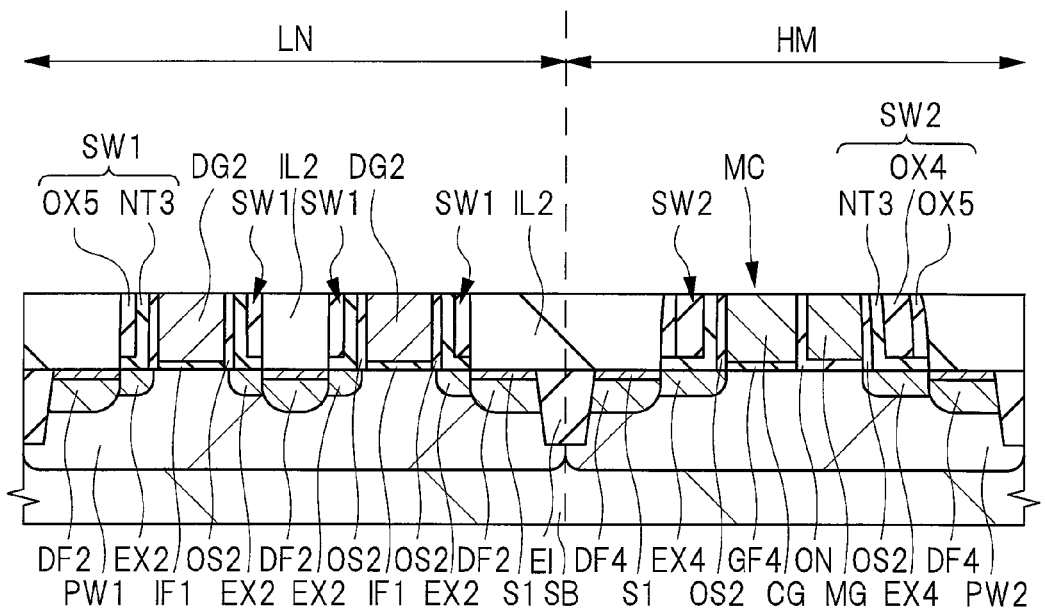
FIG. 38 is a cross-sectional view during the process of manufacturing the semiconductor device continued from FIG. 37.

Next, the same processes as the processes that have been described with reference to FIGS. 20 to 26 are performed, thereby forming source and drain regions as illustrated in FIG. 38. Meanwhile, the MISFET is not yet formed since the pseudo dummy gate electrodes DG1 (not illustrated) and DG2 are formed in the logic circuit regions LP and LN. Subsequently, the interlayer insulating film IL2, the silicide layer S1, and the insulating film IF3 are polished using, for example, a CMP method so that each upper surface of the dummy gate electrodes DG1 and DG2, the control gate electrode CG, and the memory gate electrode MG is exposed.

Figure 39:
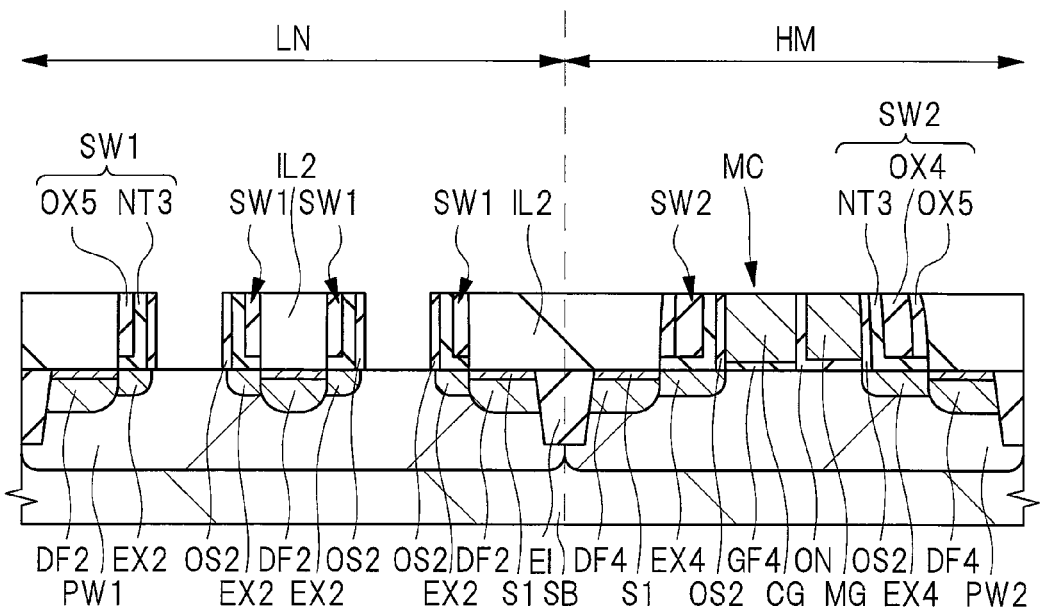
FIG. 39 is a cross-sectional view during the process of manufacturing the semiconductor device continued from FIG. 38.

Next, an insulating film (not illustrated) is formed so as to protect the gate electrode G3 (not illustrated) in the I/O region HV, and each upper surface of the control gate electrode CG and the memory gate electrode MG in the memory cell region HM, and then, the dummy gate electrodes DG1 (not illustrated) and DG2, and the insulating film IF1 are removed by performing, for example, wet etching as illustrated in FIG. 39. A trench is formed in each of regions from which the dummy gate electrodes DG1 and DG2 are removed. Here, the case of removing the insulating film IF1 has been described, but the insulating film IF1 may be left.

Figure 40:
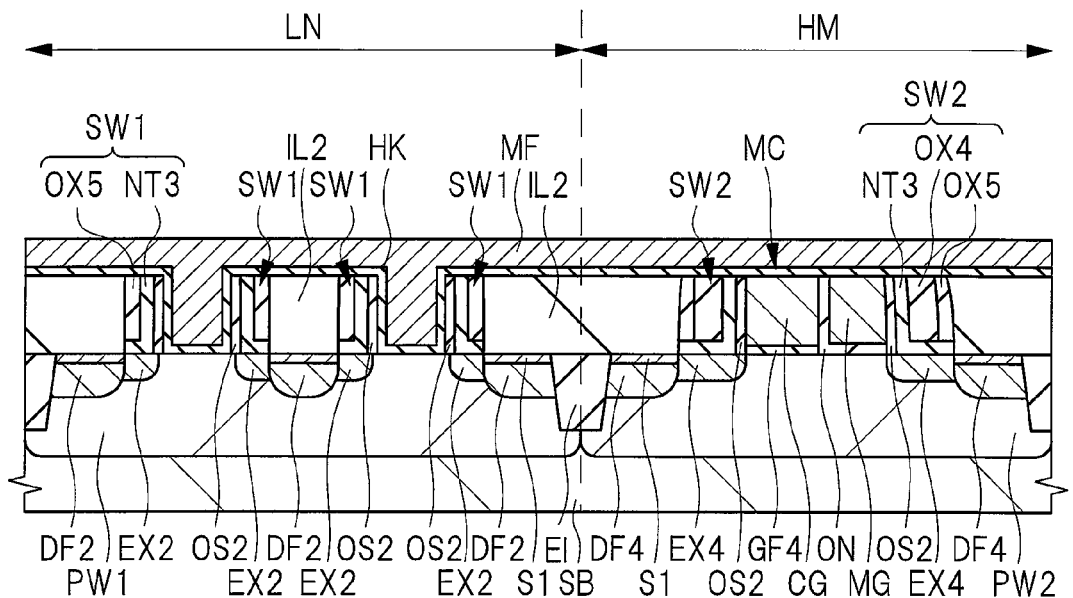
FIG. 40 is a cross-sectional view during the process of manufacturing the semiconductor device continued from FIG. 39.

Next, the insulating film HK is formed on the main surface of the semiconductor substrate SB using, for example, a CVD method, and then, the metal film MF is formed by, for example, sputtering as illustrated in FIG. 40.

The insulating film HK and the metal film MF are made of, for example, the same material as the material that has been described with reference to FIG. 11. The above-described trench is completely embedded by the insulating film HK and the metal film MF through this deposition process.

Figure 41:
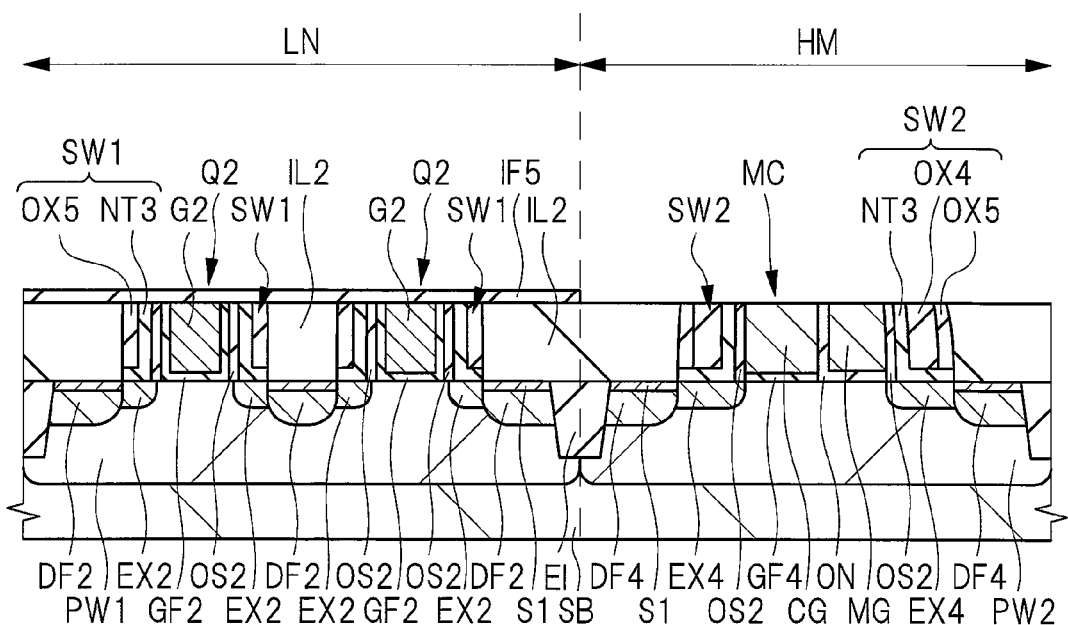
FIG. 41 is a cross-sectional view during the process of manufacturing the semiconductor device continued from FIG. 40.

Next, the insulating film HK and the metal film MF remaining on the interlayer insulating film IL2 are removed using, for example, a CMP method so that the upper surface of the interlayer insulating film IL2 is exposed as illustrated in FIG. 41. Accordingly, the gate insulating film GF2, formed using the insulating film HK remaining inside the above-described trench, is formed, and the gate electrode G2 is formed as the metal gate electrode formed using the metal film MF remaining inside the above-described trench. Subsequently, an insulating film IF5 which is made of, for example, a silicon oxide film or the like is formed on the main surface of the semiconductor substrate SB using, for example, a CVD method. Thereafter, the insulating film IF5 in the I/O region HV (not illustrated) and the memory cell region HM are removed using a photolithography technique and a dry etching method. At this time, the upper surface of the gate electrode G2 is covered by the insulating film IF5.

Figure 42:
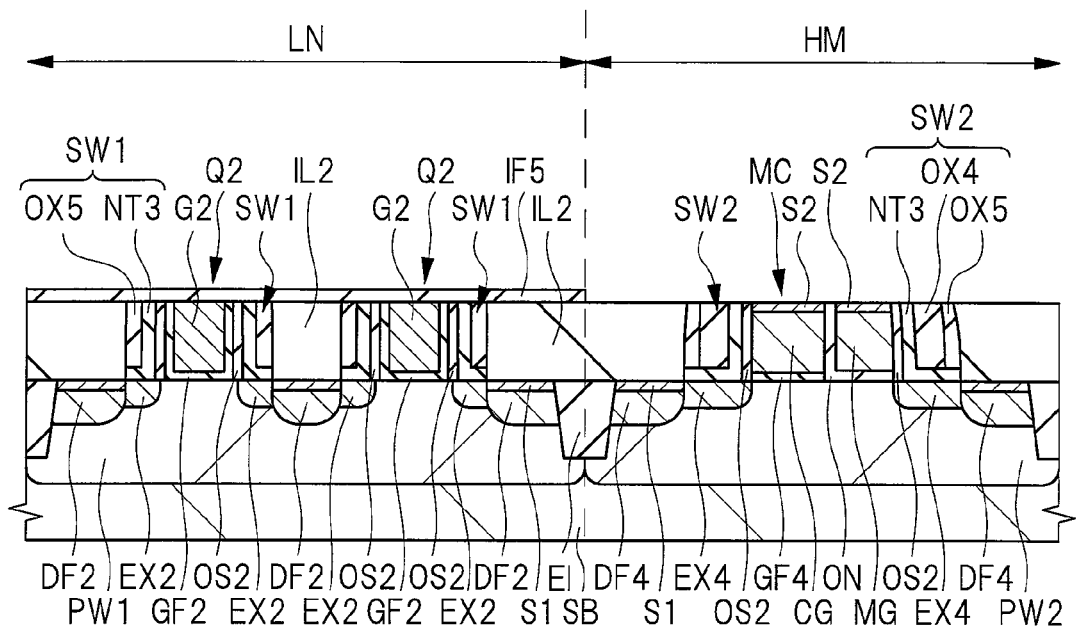
FIG. 42 is a cross-sectional view during the process of manufacturing the semiconductor device continued from FIG. 41.

Next, a silicide layer S2 is formed on each upper surface of the control gate electrode CG and the memory gate electrode MG using a known salicide process as illustrated in FIG. 42. The method of forming the silicide layer S2 is the same as the method that has been described with reference to FIG. 26. A process of removing the unreacted metal film by wet etching is performed during the salicide process. At this time, the gate electrodes G1 (not illustrated) and G2 are protected by the insulating film IF5, and thus, are not removed.

Figure 43:
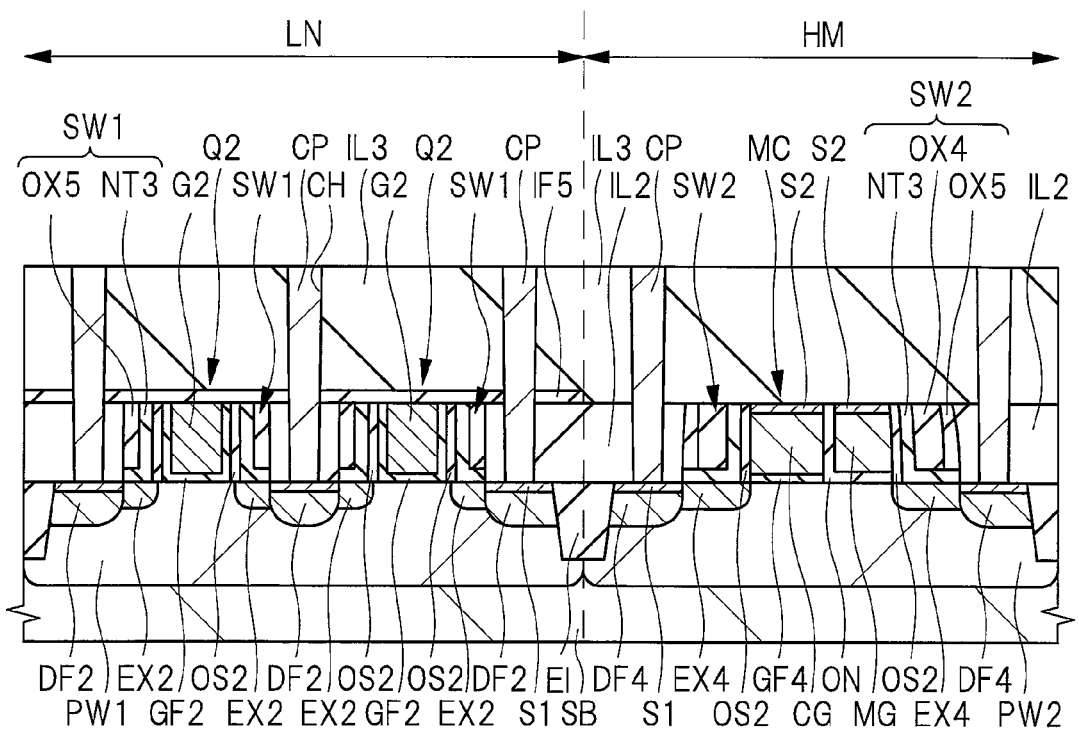
FIG. 43 is a cross-sectional view during the process of manufacturing the semiconductor device continued from FIG. 42.

Next, an interlayer insulating film IL3 which is made of, for example, a silicon oxide film is formed on the interlayer insulating film IL2 using, for example, a CVD method as illustrated in FIG. 43. Thereafter, an upper surface of the interlayer insulating film IL3 is planarized using a CMP method or the like. Subsequently, the same processes as the processes that have been described with reference to FIGS. 27 and 28 are performed so as to form the plurality of contact holes CH, which penetrate the interlayer insulating films IL2 and IL3, and the contact plugs CP that are embedded in the contact holes CH.

As above, the semiconductor device according to Modification Example 1 is completed. When the metal gate is formed using the gate-last process, it is possible to omit the processes that have been described with reference to FIGS. 8 to 12, and it is possible to simplify the process of manufacturing the semiconductor device.

Figure 44:
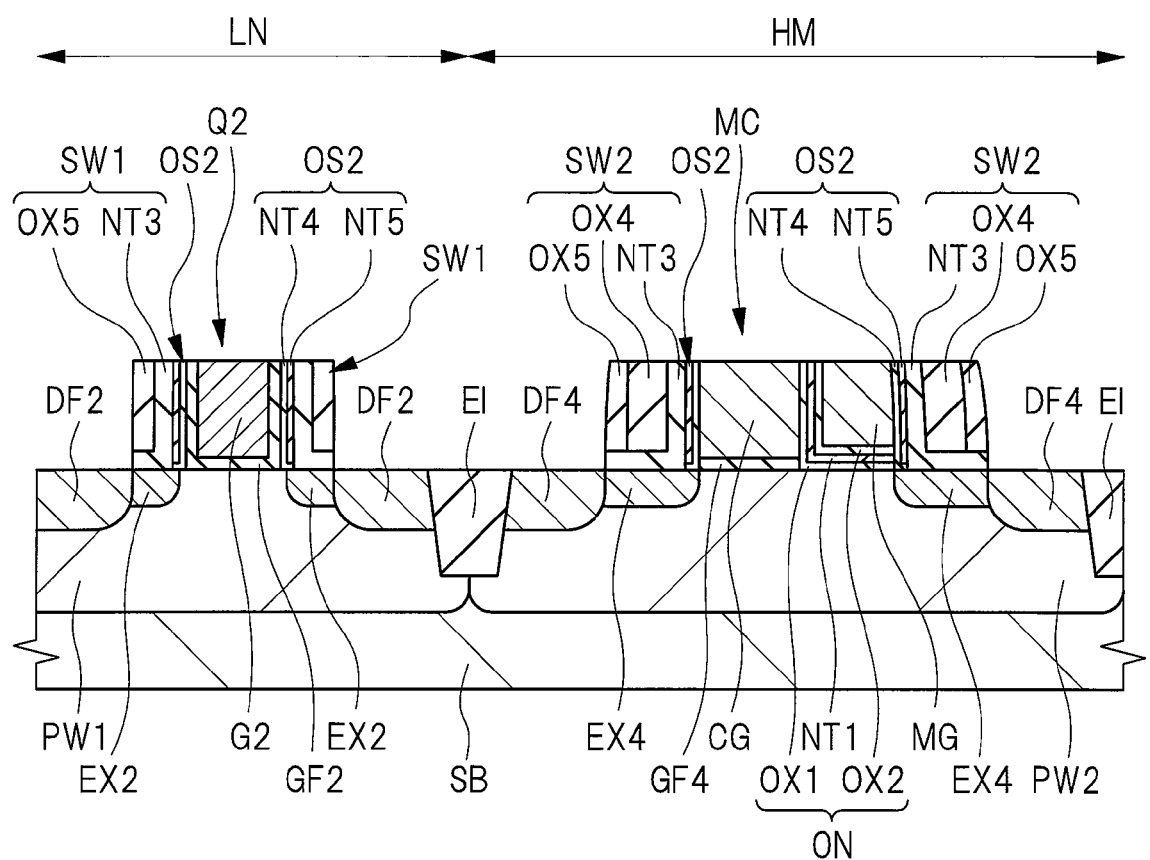
FIG. 44 is a cross-sectional view illustrating a part of FIG. 43 in an enlarged manner.

Here, the MISFET Q2 in the logic circuit region LN and the memory cell MC in the memory cell region HM are illustrated in FIG. 44 in an enlarged manner. That is, FIG. 44 is a cross-sectional view illustrating a part of FIG. 43 in an enlarged manner. FIG. 44 illustrates the stacked structure of the ONO film ON and the stacked structure of the offset spacer OS2 in detail. In addition, FIG. 44 does not illustrate the silicide layers S1 and S2, the interlayer insulating films IL2 and IL3, the contact hole CH, and the contact plug CP. As illustrated in FIG. 44, the silicon nitride film NT4 forming the offset spacer OS2 is in contact with sidewalls of the silicon nitride film NT1 forming the ONO film ON.

Hereinafter, effects of Modification Example 1 will be described. The process of forming the sidewalls SW1 and SW2 according to the first embodiment, which has been described with reference to FIGS. 20 to 24, is performed in Modification Example 1. Thus, a gap between the neighboring gate electrodes G2 is not completely embedded by the insulating film configured for formation of the sidewall SW1 during the process of forming the sidewalls SW1 and SW2.

Thus, it is possible to form a desired diffusion layer in the logic circuit region LN. In addition, it is possible to prevent generation of variation in width of the sidewall SW1 beside the gate electrode G2. In addition, it is possible to prevent the recess of the main surface of the semiconductor substrate SB in the process of removing the silicon nitride film NT3 (see FIG. 24) that is caused when a part of the silicon nitride film NT3 is excessively removed in the process of removing the silicon oxide film OX4 (see FIG. 22). Accordingly, it is possible to improve the reliability of the semiconductor device. In addition, it is possible to secure the breakdown voltage of the high breakdown voltage MISFET and to narrow the interval between the source and drain regions of the low breakdown voltage MISFET by forming the sidewalls SW1 and SW2 having different widths. Thus, it is possible to realize the improvement in integration degree, the low power consumption, and the high-speed operation of the low breakdown voltage MISFET.

In addition, here, an outer sidewall of sidewall SW1 illustrated in FIG. 44 is configured using the silicon oxide film OX5, and an outer sidewall of the sidewall SW2 is configured using the silicon oxide films OX5 and OX4.

Accordingly, the silicon oxide films OX5 and OX4 are shaved after the ion implantation process, and thus, each width of the sidewalls SW1 and SW2 decreases. In this case, a region to form the contact hole CH and the contact plug CP (see FIG. 28) on the source and drain regions increases. Accordingly, it is possible to prevent the generation of connection failure in the contact plug CP, which is caused when the contact hole is not opened at the time of forming the contact hole, even in the case of reducing each interval between the gate electrodes G2 in the logic circuit region LN and between the patterns including the control gate electrode CG and the memory gate electrode MG in the memory cell region HM. Accordingly, it is possible to miniaturize the semiconductor device.

Figure 45:
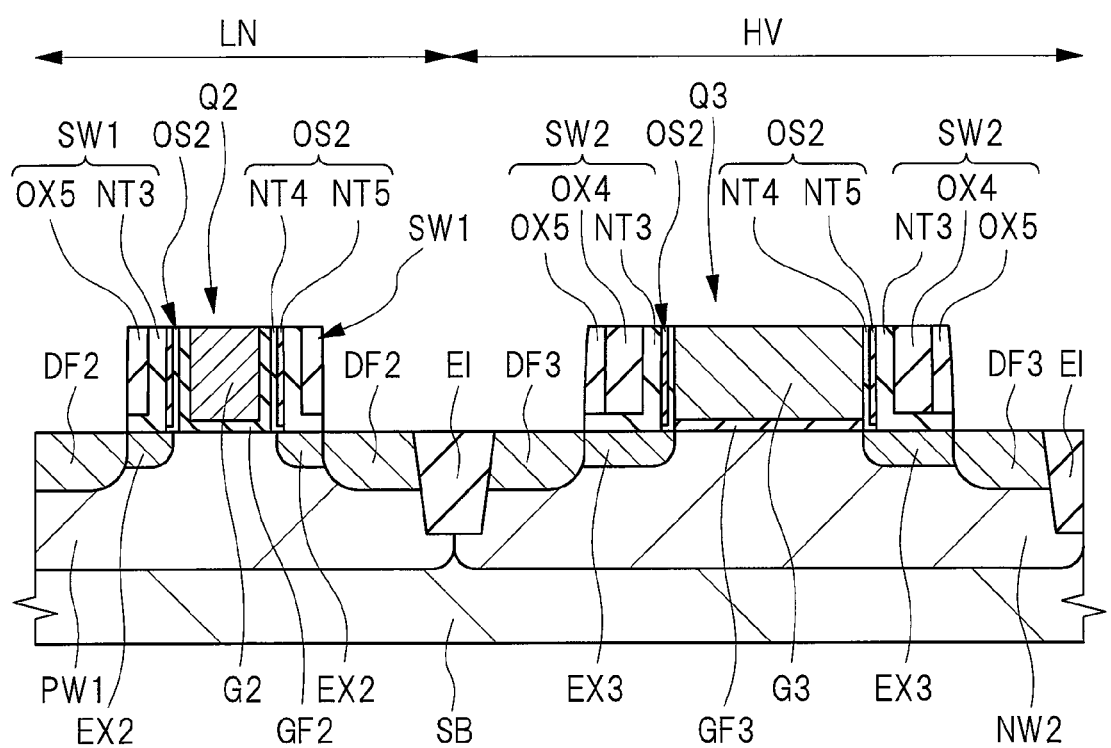
FIG. 45 is a cross-sectional view of a modification example 1 of a semiconductor device according to the first embodiment.

In addition, FIG. 45 illustrates a cross-sectional view of the semiconductor device according to Modification Example 1 in a case in which the MONOS memory is not formed. That is, the processes that have been described with reference to FIGS. 30 to 37 are performed without providing the memory cell region HM in this case. FIG. 45 illustrate the MISFET Q2 in the logic circuit region LN and a high breakdown voltage MISFET Q3 which is formed by performing the process that has been performed with respect to the memory cell region HM in the processes described with reference to FIG. 31 to FIG. 43, with respect to the I/O region HV.

As illustrated in FIG. 45, the MISFET Q3 in the I/O region HV includes the extension region EX3 and a diffusion layer DF3, which are n-type semiconductor regions, and the gate electrode G3 on the gate insulating film GF3. In addition, the sidewall SW2 is formed over sidewalls of the gate electrode G3 with the offset spacer OS2 interposed therebetween, which is similar to the film covering sidewalls of the pattern including the control gate electrode CG and the memory gate electrode MG illustrated in FIG. 44.

Since the MONOS memory cell is not present in the structure illustrated in FIG. 45, the silicon nitride film, which forms the ONO film as the charge storage film, is not in contact with the silicon nitride film NT4 forming the offset spacer OS2. Thus, there is no case in which charge is stored in the offset spacer OS2 during the programming operation of the semiconductor device. That is, Modification Example 1 in which the offset spacer OS2 is formed only of the silicon nitride films NT4 and NT5 is advantageous in terms that it is possible to prevent the malfunction of the semiconductor device when being applied to the semiconductor device in which the MONOS memory cell is not formed.

Incidentally, the method of forming the insulating film HK (see FIG. 40), which is a high-k film, after removing the dummy gate electrode during the gate-last process in which the dummy gate electrode is replaced with the metal gate electrode is used in Modification Example 1. However, the insulating film HK may be formed in the logic circuit region before forming the polysilicon film PS1 (see FIG. 31), which forms the dummy gate electrode, and the insulating film HK may be left as each part of the gate insulating films GF1 (not illustrated) and GF2 illustrated in FIG. 43. In this case, for example, it is considered a method of forming the insulating film HK on the main surface of the semiconductor substrate SB after performing the process that has been described with reference to FIG. 2, and subsequently, removing the insulating film HK in a region other than the logic circuit regions LP and LN. This is similarly applied in the following Modification Example 2 and a second embodiment and Modification Example 1 of the second embodiment to be described later.

<Modification Example 2>

Hereinafter, a description will be given regarding a process of manufacturing a semiconductor device according to Modification Example 2 of the first embodiment with reference to FIGS. 46 to 51. FIGS. 46 to 51 are cross-sectional views during the process of manufacturing the semiconductor device according to Modification Example 2. FIGS. 46 to 50 are the cross-sectional view illustrating the logic circuit regions LP and LN, the I/O region HV, and the memory cell region HM similarly to FIG. 1. FIG. 51 is the cross-sectional view illustrating the logic circuit region LN and the memory cell region HM similarly to FIG. 20.

Here, the case of forming a metal gate electrode using the gate-last process will be described. In addition, a third method of forming an offset spacer will be described here with reference to FIGS. 46 to 50. FIG. 51, used to describe processes after forming the offset spacer, illustrates each of offset spacers OS3 and OS4 actually having a stacked structure (see FIG. 50) as a single film in order to facilitate understanding of the drawings.

In addition, each manufacturing process in the logic circuit region LP and the I/O region HV will not be described in FIG. 51 and only the logic circuit region LN and the memory cell region HM will be illustrated. The manufacturing process in the logic circuit region LP is performed in the same manner as in the logic circuit region LN, and the manufacturing process in the I/O region HV is performed in the same manner as in the memory cell region HM. However, p-type impurities are injected during an ion implantation process, which is performed in order to form diffusion layers forming source and drain regions, in each manufacturing process in the logic circuit region LP and the I/O region HV, which is different from the logic circuit region LN and the memory cell region HM. In addition, FIG. 51 illustrates the cross-sectional view of the case of forming two MISFETs side by side in the logic circuit region LN.

Incidentally, a distance between the neighboring gate electrodes G2 in the logic circuit region LN illustrated in FIG. 51 is 90 nm, for example, when ignoring a film thickness of the offset spacer OS3. When considering the film thickness of the offset spacer OS3, a distance between the offset spacers OS3, each of which covers each of opposing sidewalls of the neighboring gate electrodes G2, is 90 nm.

Figure 46:
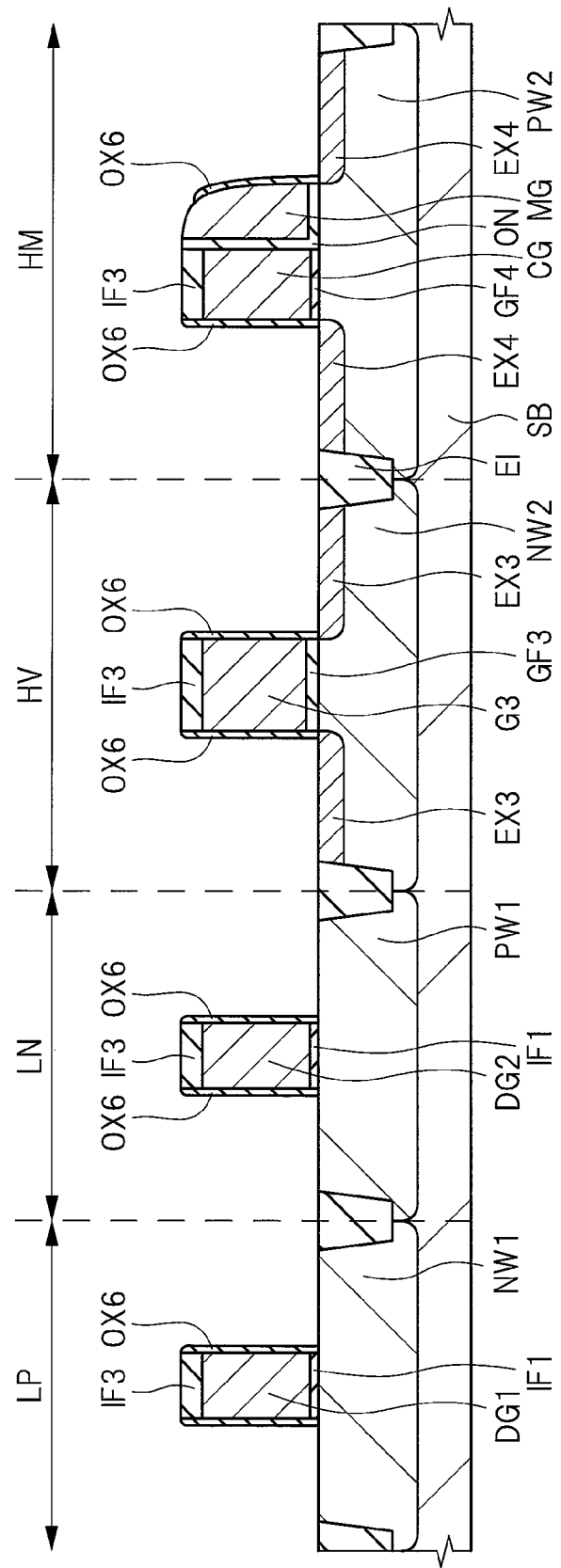
FIG. 46 is a cross-sectional view during a process of manufacturing a modification example 2 of a semiconductor device according to the first embodiment.

First, the processes that have been described with reference to FIGS. 1 to 3 and 31 to 33 are performed, and then, the same processes as the processes that have been described with reference to FIGS. 13 and 14 are performed. Subsequently, a sidewall-shaped silicon oxide film OX6 is formed over each sidewall of the dummy gate electrodes DG1 and DG2, the gate electrode G3, and the pattern including the control gate electrode CG and the memory gate electrode MG as illustrated in FIG. 46. That is, the silicon oxide film OX6 is formed on the semiconductor substrate SB using, for example, a CVD method, and then, etchback is performed to remove a part of the silicon oxide film OX6 so that each upper surface of the main surface of the semiconductor substrate SB and the insulating film IF3 is exposed. The silicon oxide film OX6 is processed in the sidewall shape through this process. A film thickness of the silicon oxide film OX6 is, for example, 5 nm.

Figure 47:
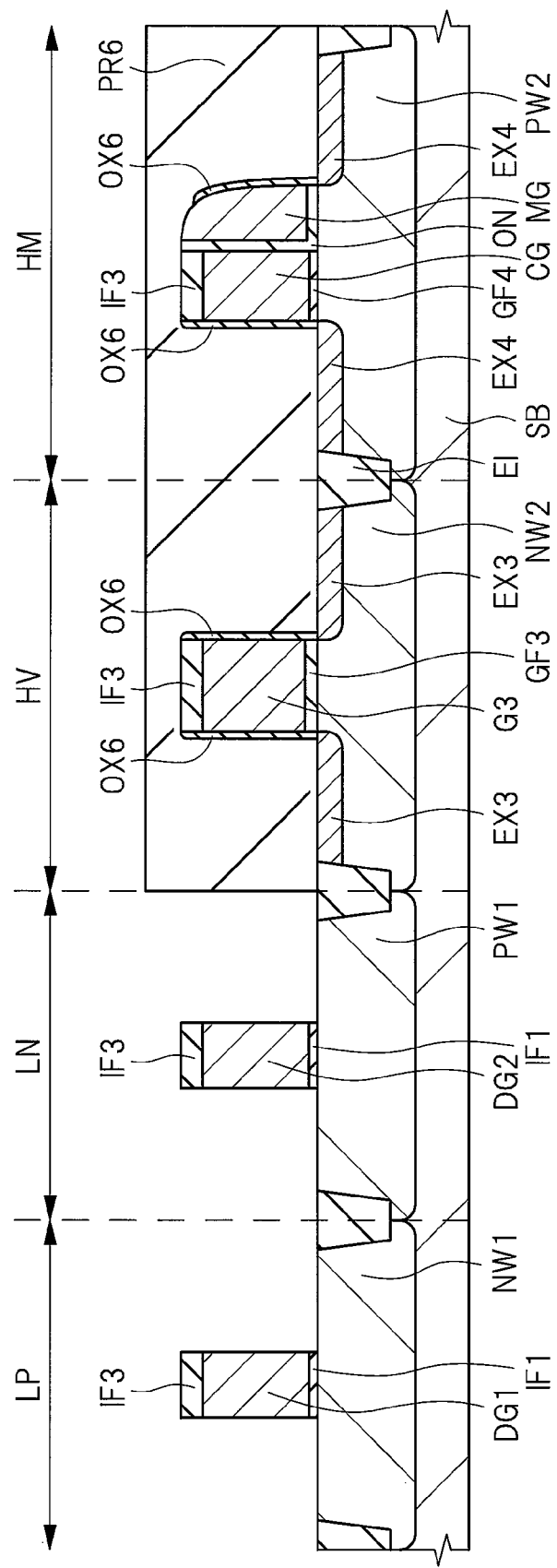
FIG. 47 is a cross-sectional view during the process of manufacturing the semiconductor device continued from FIG. 46.

Next, a photoresist film PR6 is formed to cover the I/O region HV and the memory cell region HM, and wet etching is performed to remove the silicon oxide film OX6 exposed from the photoresist film PR6 in the logic circuit regions LP and LN as illustrated in FIG. 47.

Figure 48:
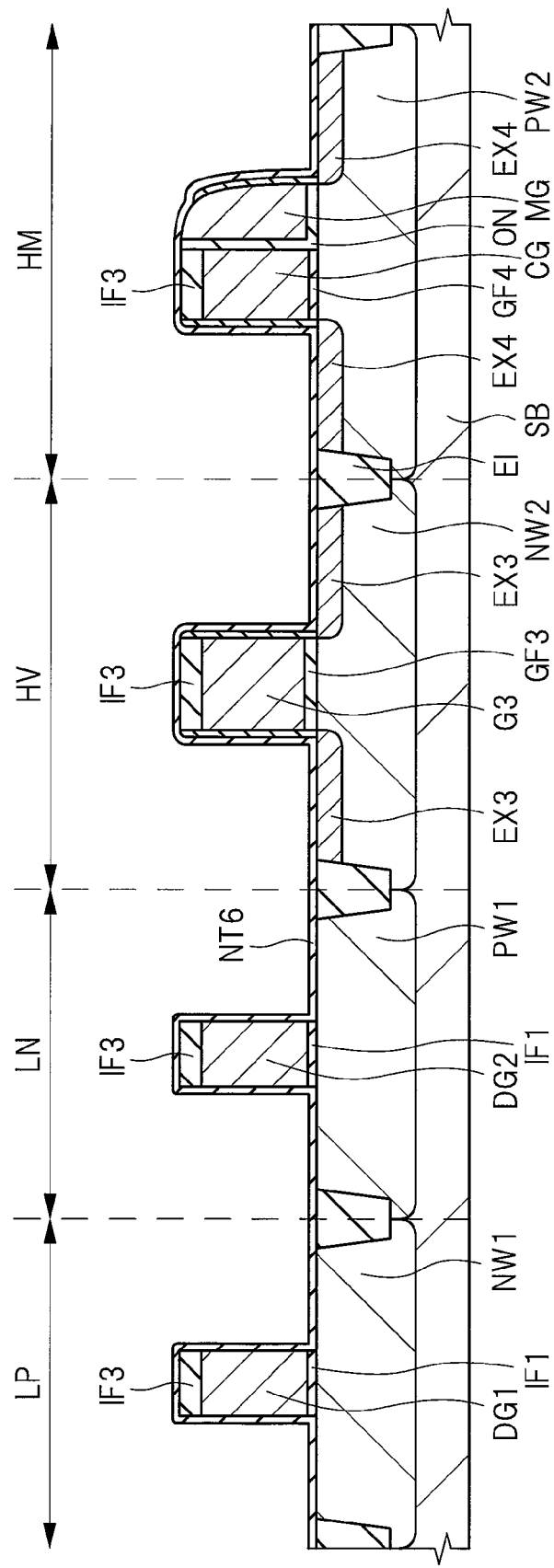
FIG. 48 is a cross-sectional view during the process of manufacturing the semiconductor device continued from FIG. 47.

Next, the photoresist film PR6 is removed, and then, a silicon nitride film NT6 is formed on the semiconductor substrate SB using, for example, a CVD method as illustrated in FIG. 48. Accordingly, the main surface of the semiconductor substrate SB, the dummy gate electrodes DG1 and DG2, the gate electrode G3, and the pattern including the control gate electrode CG and the memory gate electrode MG are covered by the silicon nitride film NT6. A film thickness of the silicon nitride film NT6 is, for example, 5 nm.

Figure 49:
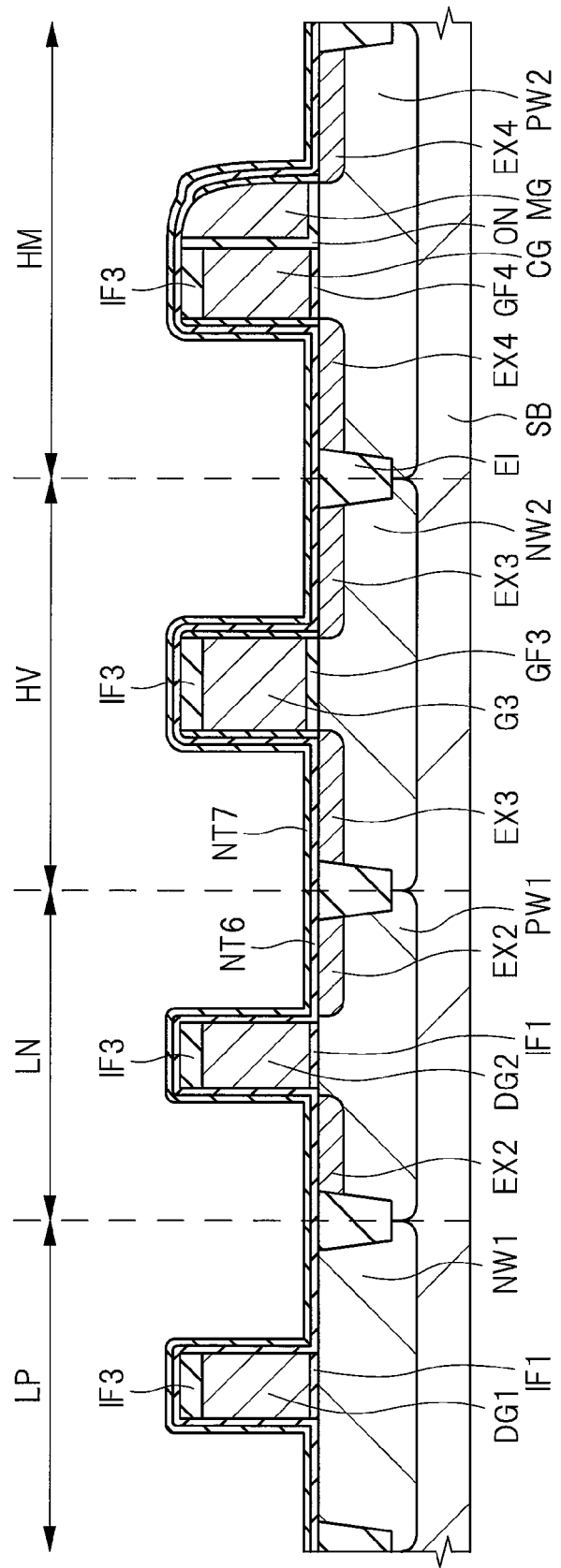
FIG. 49 is a cross-sectional view during the process of manufacturing the semiconductor device continued from FIG. 48.

Next, the process of forming the extension region EX2 which has been described with reference to FIG. 16 is performed, and then, the photoresist film PR3 (see FIG. 16) is removed. Subsequently, a silicon nitride film NT7 is formed on the semiconductor substrate SB using, for example, a CVD method as illustrated in FIG. 49. Accordingly, the silicon nitride film NT6 is covered by the silicon nitride film NT7. A film thickness of the silicon nitride film NT7 is, for example, 5 nm.

Figure 50:
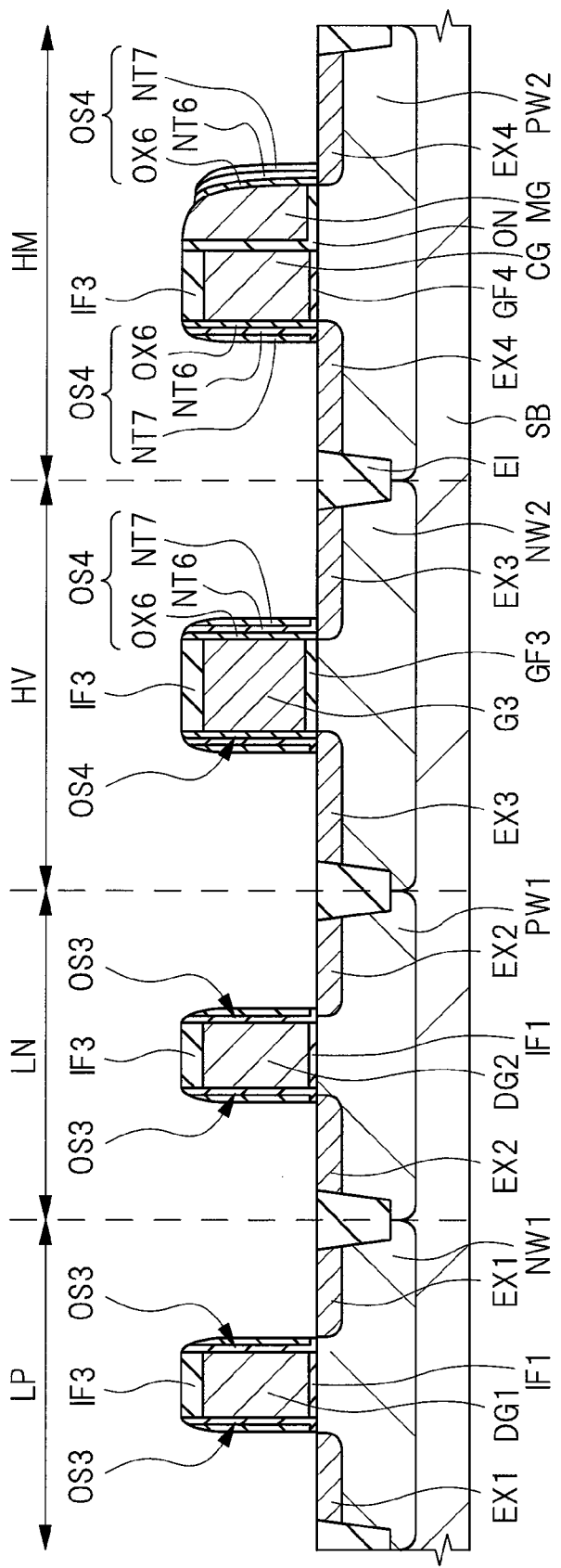
FIG. 50 is a cross-sectional view during the process of manufacturing the semiconductor device continued from FIG. 49.
Figure 51:
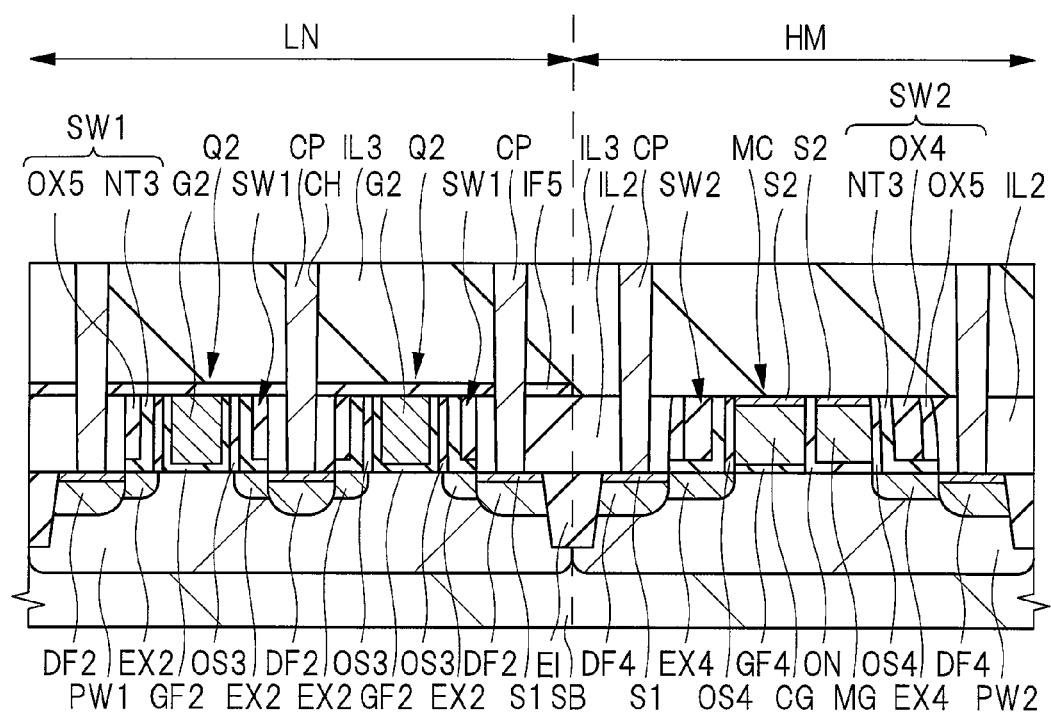
FIG. 51 is a cross-sectional view during the process of manufacturing the semiconductor device continued from FIG. 50.

Next, a stacked film formed of the silicon nitride films NT6 and NT7 is subjected to etchback so that each upper surface of the main surface of the semiconductor substrate SB and the insulating film IF3 is exposed as illustrated in FIG. 50. Accordingly, the offset spacer OS3 formed using the stacked film and the offset spacer OS4 including the stacked film and the silicon oxide film OX6 are formed.

That is, the offset spacer OS3 formed of the silicon nitride films NT6 and NT7 is formed over each sidewall of the dummy gate electrodes DG1 and DG2 in the logic circuit regions LP and LN. In addition, the offset spacer OS4 formed of the silicon oxide film OX6 and the silicon nitride films NT6 and NT7 is formed over each sidewall of the gate electrode G3 and each sidewall of the pattern, which includes the control gate electrode CG and the memory gate electrode MG in the I/O region HV and the memory cell region HM. The offset spacer OS3 does not include the silicon oxide film OX6, and thus, has a smaller width than the offset spacer OS4.

Subsequently, the process of forming the extension region EX1 that has been described with reference to FIG. 18 is performed, and then, the photoresist film PR4 (see FIG. 18) is removed as described with reference to FIG. 19. Accordingly, the structure illustrated in FIG. 50 is obtained.

Next, the semiconductor device according to Modification Example 2 is completed as illustrated in FIG. 51 by performing the same processes as the processes that have been described with reference to FIGS. 20 to 26 and 38 to 43. That is, the dummy gate electrodes DG1 and DG2 is replaced with the metal gate electrode through the gate-last process, and the MISFET Q2 including the metal gate electrode and the memory cell MC including the high breakdown voltage MISFET are formed.

Figure 52:
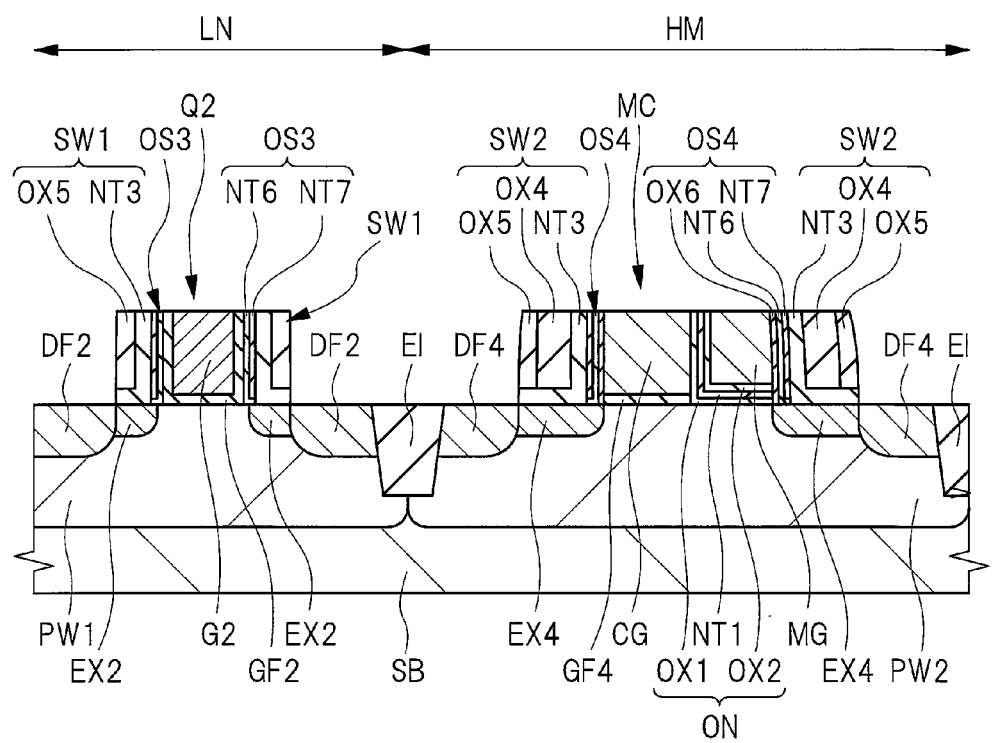
FIG. 52 is a cross-sectional view illustrating a part of FIG. 51 in an enlarged manner.

Here, FIG. 52 illustrates the MISFET Q2 and the memory cell MC of FIG. 51 in an enlarged manner. That is, FIG. 52 is the cross-sectional view illustrating a part of FIG. 51 in an enlarged manner. FIG. 52 illustrates the stacked structure of the ONO film ON and each stacked structure of the offset spacers OS3 and OS4 in detail. In addition, FIG. 52 does not illustrate the silicide layers S1 and S2, the interlayer insulating films IL2 and IL3, the contact hole CH, and the contact plug CP.

As illustrated in FIG. 52, the sidewalls of the silicon nitride film NT1 forming the ONO film ON is in contact with the silicon oxide film OX6 forming the offset spacer OS4, and is not in contact with the silicon nitride film. In addition, the offset spacer OS4 and the sidewall SW2 are sequentially formed over the sidewall of the patterns including the control gate electrode CG, the ONO film ON, and the memory gate electrode MG. In other words, the sidewall SW2 is formed over the sidewall of the pattern with the offset spacer OS4 interposed therebetween.

In Modification Example 2, it is possible to obtain the same effects as Modification Example 1 that has been described with reference to FIGS. 31 to 44. In addition, it is possible to obtain another effect as the silicon nitride film is not in contact with the ONO film. That is, it is possible to prevent the threshold voltage of the MISFET, which forms the memory cell MC, from abnormally increasing due to the storage of the charge inside the offset spacer OS4 in the vicinity of the ONO film ON during the programming operation of the memory cell MC since the sidewall of the silicon nitride film NT1 forming the ONO film ON is in contact only with the silicon oxide film OX6 covering the sidewall.

(Second Embodiment)

Figure 53:
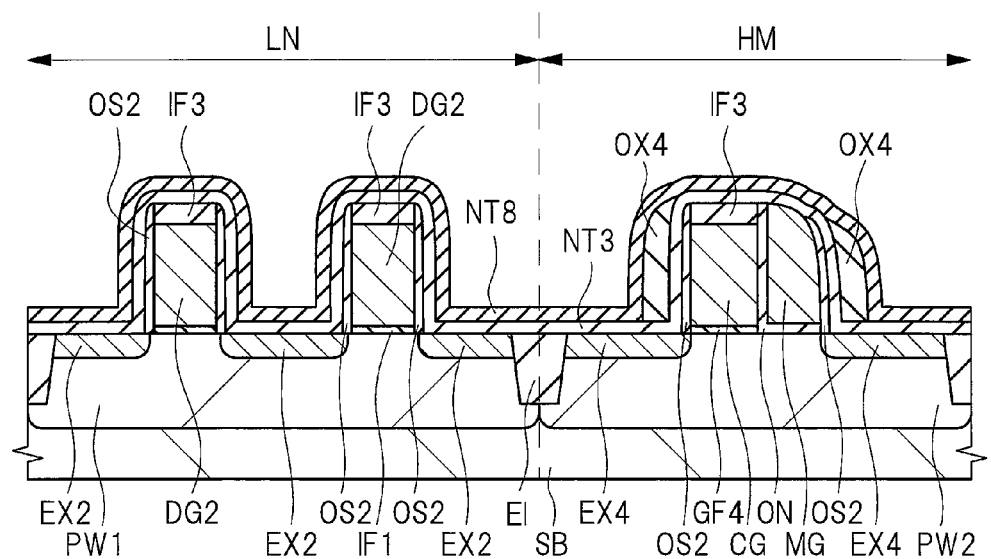
FIG. 53 is a cross-sectional view during a process of manufacturing a semiconductor device according to a second embodiment.
Figure 54:
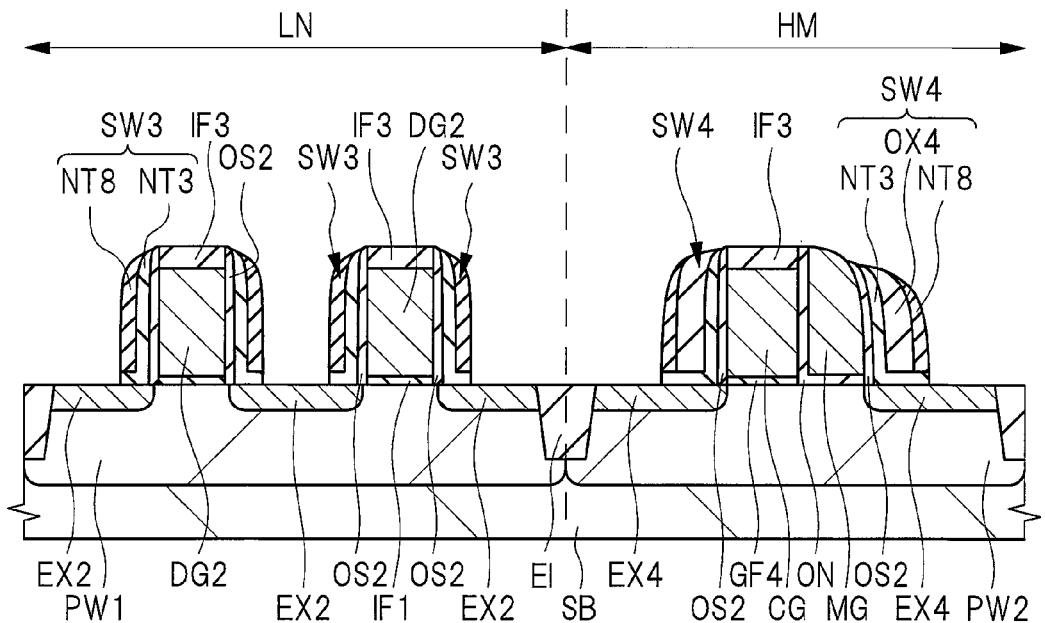
FIG. 54 is a cross-sectional view during the process of manufacturing the semiconductor device continued from FIG. 53.
Figure 55:
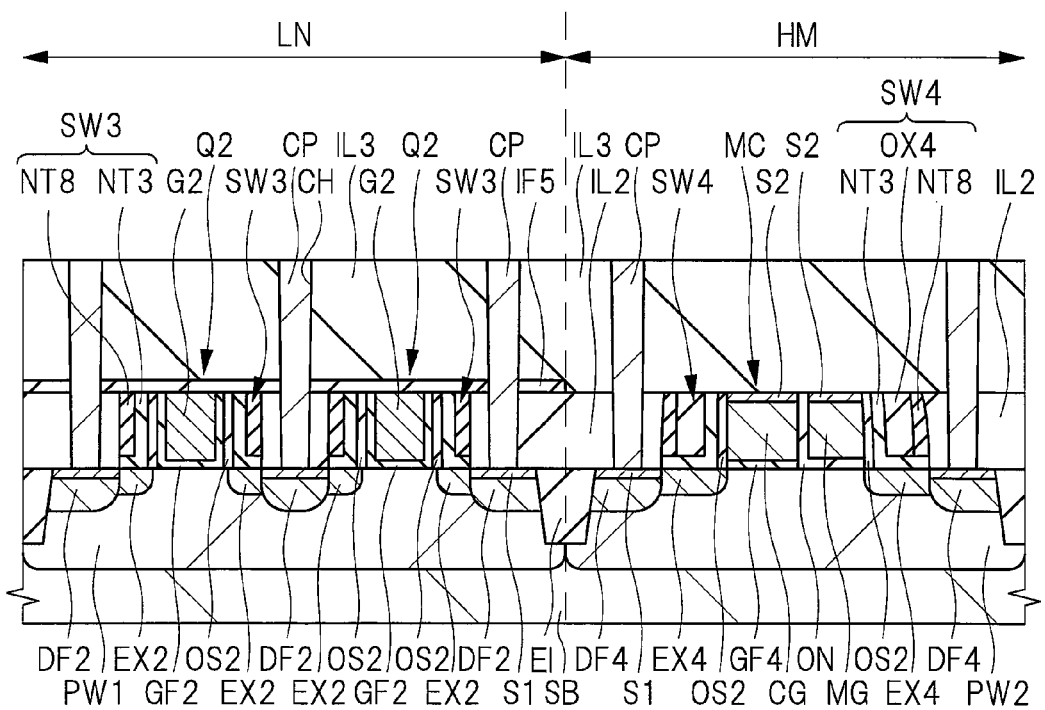
FIG. 55 is a cross-sectional view during the process of manufacturing the semiconductor device continued from FIG. 54.

Hereinafter, a description will be given regarding a method of manufacturing a semiconductor device according to the second embodiment with reference to FIGS. 53 to 55. Here, a description will be given regarding the case of forming an outer portion as a part of a sidewall using a silicon nitride film when the second method, which has been described with reference to FIGS. 34 to 37, is used to form the offset spacer. FIGS. 53 to 55 illustrate the offset spacer OS2 as a single film in order to facilitate understanding of the drawings. The main difference of the second embodiment from Modification Example 1 of the first embodiment is that the silicon nitride film is formed instead of the silicon oxide film OX5 (see FIG. 23).

Each manufacturing process in the logic circuit region LP and the I/O region HV will not be described in FIGS. 53 to 55 and only the logic circuit region LN and the memory cell region HM will be illustrated. The manufacturing process in the logic circuit region LP is performed in the same manner as in the logic circuit region LN, and the manufacturing process in the I/O region HV is performed in the same manner as in the memory cell region HM. However, p-type impurities are injected during an ion implantation process, which is performed in order to form diffusion layers forming source and drain regions, in each manufacturing process in the logic circuit region LP and the I/O region HV, which is different from the logic circuit region LN and the memory cell region HM. In addition, FIGS. 53 to 55 illustrate the cross-sectional views of the case of forming two MISFETs side by side in the logic circuit region LN.

Incidentally, a distance between the neighboring dummy gate electrodes DG2 in the logic circuit region LN is 90 nm, for example, when ignoring a film thickness of the offset spacer OS2. When considering the film thickness of the offset spacer OS2, a distance between the offset spacers OS2, each of which covers each of opposing sidewalls of the neighboring dummy gate electrodes DG2, is 90 nm.

In the second embodiment, first, the same process as the processes as the processes that have been described with reference to FIGS. 1 to 3 and 31 to 37 are performed, thereby forming the dummy gate electrodes DG1 and DG2, the gate electrode G3, the control gate electrode CG, the memory gate electrode MG, and the offset spacer OS2 as illustrated in FIG. 53. Thereafter, the same processes as the processes that have been described with reference to FIGS. 20 to 22 are performed, thereby forming the silicon nitride film NT3 and the sidewall-shaped silicon oxide film OX4. Thereafter, the photoresist film PR5 (see FIG. 22) is removed, and then, a silicon nitride film NT8 is formed on the main surface of the semiconductor substrate SB using, for example, a CVD method. Accordingly, the silicon nitride film NT3 and the silicon oxide film OX4 are covered by the silicon nitride film NT8.

Here, a film thickness a of the silicon nitride film NT3 is, for example, 10 nm, a film thickness b of the silicon oxide film OX4 is, for example, 20 nm, and a film thickness c of the silicon nitride film NT8 is, for example, 16 nm. Accordingly, silicon nitride film NT3 and the silicon oxide film OX4 are formed in the process that has been described with reference to FIG. 20, a region having a width of 90 nm between the neighboring dummy gate electrodes DG2 is not completely embedded since a total film thickness of the silicon nitride film NT3 and the silicon oxide film OX4 is 30 nm.

Next, etchback is performed to remove each part of the silicon nitride films NT8 and NT3 as illustrated in FIG. 54. Accordingly, the main surface of the semiconductor substrate SB and the upper surface of the insulating film IF3 are exposed. Through this etchback, a sidewall SW3, which is formed of the silicon nitride films NT3 and NT8 and covers the sidewall of the dummy gate electrode DG2, is formed in the logic circuit region LN. In addition, a sidewall SW4, which is formed of the silicon nitride film NT3, the silicon oxide film OX4, and the silicon nitride film NT8, and covers the sidewall of the pattern including the control gate electrode CG, the ONO film ON, and the memory gate electrode MG, is formed in the memory cell region HM through the etchback.

A width of the sidewall SW3 has the same dimension as a total film thickness of the silicon nitride films NT3 and NT8, that is, 26 nm. A width of the sidewall SW4 has the same dimension as a total film thickness of the silicon nitride film NT3, the silicon oxide film OX4, and the silicon nitride film NT8 that is, 46 nm. In this manner, it is possible to form the sidewalls SW3 and SW4 having two kinds of different widths.

Next, the semiconductor device according to the second embodiment is completed by performing the processes that have been described with reference to FIGS. 25, 26 and 38 to 43 as illustrated in FIG. 55. In the second embodiment, it is possible to prevent the gap between the dummy gate electrodes DG2 from being completely embedded at the time of forming the silicon nitride film NT3 and the silicon oxide film OX4 by performing the same process as the process that has been described with reference to FIG. 22. Accordingly, the removal failure of the insulating film, which has been described using the comparative example in FIG. 68, does not occur, and thus, it is possible to form a desired diffusion layer in the logic circuit region LN in an ion implantation process which is performed after the process that has been described with reference to FIG. 54.

In addition, it is possible to prevent generation of variation in width of the sidewall SW3 beside the gate electrode G2. In addition, it is possible to prevent the recess of the main surface of the semiconductor substrate SB in the process of removing the silicon nitride film NT3 (see FIG. 54) that is caused when a part of the silicon nitride film NT3 is excessively removed in the process of removing the silicon oxide film OX4 (see FIG. 22). Accordingly, it is possible to improve the reliability of the semiconductor device.

In addition, it is possible to secure the breakdown voltage of the high breakdown voltage MISFET and to narrow the interval between the source and drain regions of the low breakdown voltage MISFET by forming the sidewalls SW3 and SW4 having different widths. Thus, it is possible to realize the improvement in integration degree, the low power consumption, and the high-speed operation of the low breakdown voltage MISFET.

Figure 56:
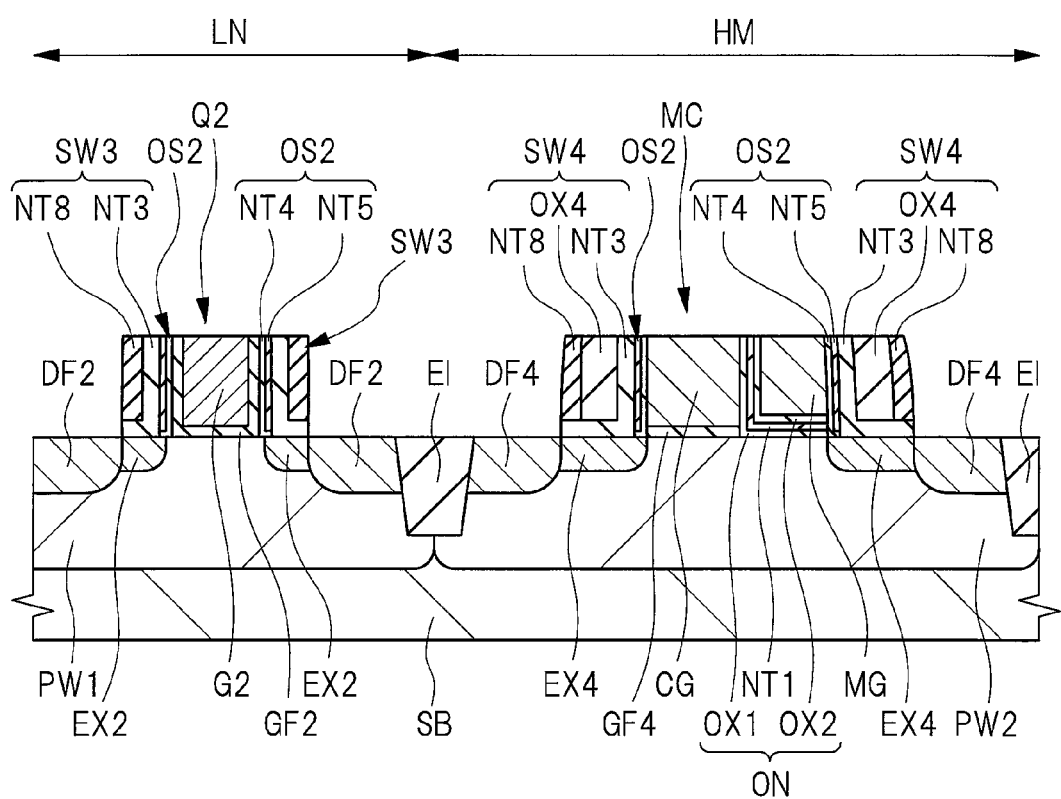
FIG. 56 is a cross-sectional view illustrating a part of FIG. 55 in an enlarged manner.

Here, FIG. 56 illustrates a cross-sectional view of the MISFET Q2 and the memory cell MC formed through the above-described manufacturing process in an enlarged manner. That is, FIG. 56 is the cross-sectional view illustrating a part of FIG. 55 in an enlarged manner. FIG. 56 illustrates the stacked structure of the ONO film ON and the stacked structure of the offset spacer OS2 in detail. In addition, FIG. 56 does not illustrate the silicide layers S1 and S2, the interlayer insulating films IL2 and IL3, and the contact plug CP. As illustrated in FIG. 56, the sidewall SW3, formed of the silicon nitride films NT3 and NT8, is formed over sidewalls of the stacked film including the insulating film HK and the metal film MF with the offset spacer OS2, formed of the silicon nitride films NT4 and NT5, interposed therebetween in the logic circuit region LN.

For example, when a gate insulating film of a MISFET of a low breakdown voltage formed in a logic circuit region includes a high-k film, or, when the gate electrode of the MISFET is a metal gate electrode, the following problem occurs. That is, when an offset spacer or a sidewall including a silicon oxide film is formed in the vicinity of the high-k film or the metal gate electrode, oxygen inside the silicon oxide film moves to the high-k film or the metal gate electrode and cause reaction with a material of the high-k film or the metal gate electrode. Accordingly, properties of the MISFET are changed, and there occurs a problem that the reliability of the element deteriorates.

With respect to this, the offset spacer OS2, which is adjacent to the insulating film HK serving as the high-k film and the metal film MF forming the metal gate electrode, is formed only of the silicon nitride films NT4 and NT5 in the second embodiment as illustrated in FIG. 56. In addition, the sidewall SW3, which covers the sidewall of the stacked film formed of the insulating film HK and the metal film MF, is formed only of the silicon nitride films NT3 and NT8. That is, the offset spacer OS2 and the sidewall SW3 do not include the silicon oxide film. Thus, it is possible to prevent oxygen from intruding into the insulating film HK and the metal film MF from the offset spacer OS2 and the sidewall SW3, and thus, it is possible to prevent the change in properties of the element due to the reaction between the oxygen and the insulating film HK or the metal film MF. Accordingly, it is possible to improve the reliability of the semiconductor device.

Figure 57:
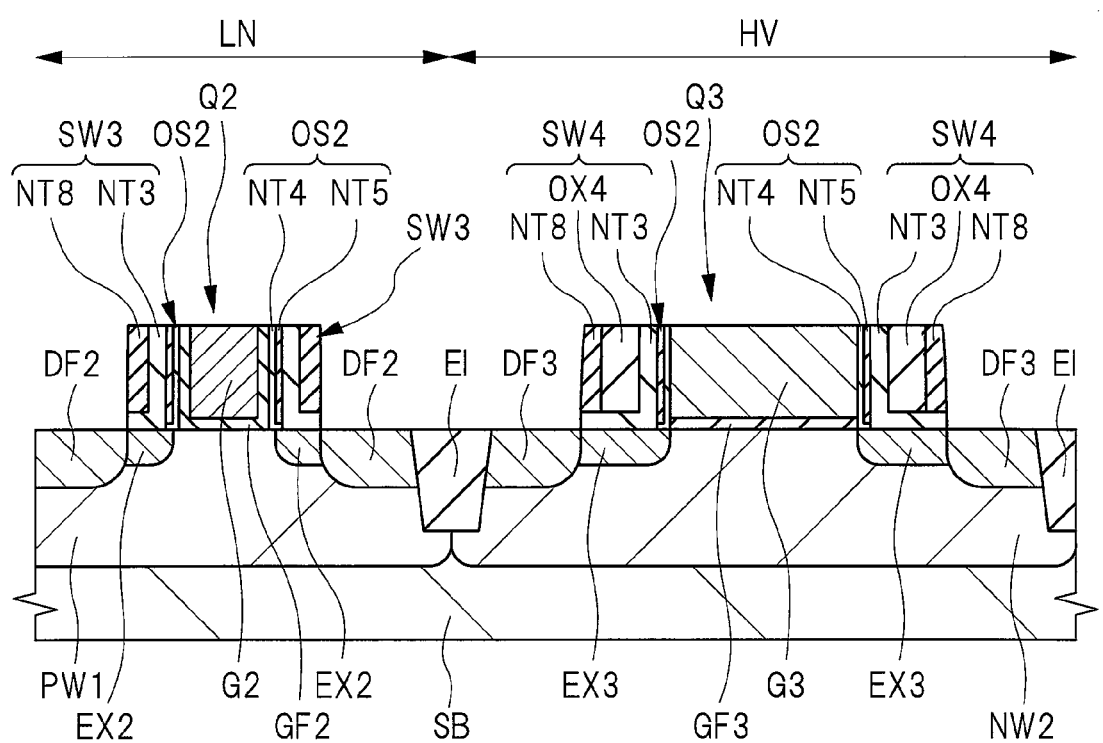
FIG. 57 is a cross-sectional view of the semiconductor device according to the second embodiment.

In addition, FIG. 57 illustrates a cross-sectional view of the semiconductor device according to the second embodiment in a case in which a MONOS memory is not formed. That is, the processes that have been described with reference to FIGS. 53 to 55 are performed without providing the memory cell region HM in this case. FIG. 57 illustrates the MISFET Q2 in the logic circuit region LN and the high breakdown voltage MISFET Q3 which is formed by performing the process that has been performed with respect to the memory cell region HM in the processes described with reference to FIGS. 53 to 55, with respect to the I/O region HV. The sidewall SW4 is formed over sidewalls of the gate electrode G3 illustrated in FIG. 57 with the offset spacer OS2 interposed therebetween similarly to a film covering sidewalls of the pattern, which includes the control gate electrode CG and the memory gate electrode MG, illustrated in FIG. 56.

In this case, similarly to the structure that has been described with reference to FIG. 45, it is obtained the advantage that it is possible to prevent the malfunction of the semiconductor device, which is caused when the offset spacer OS2 formed only of the silicon nitride films NT4 and NT5 is formed, since the MONOS memory cell is not present.

<Modification Example 1>

Figure 58:
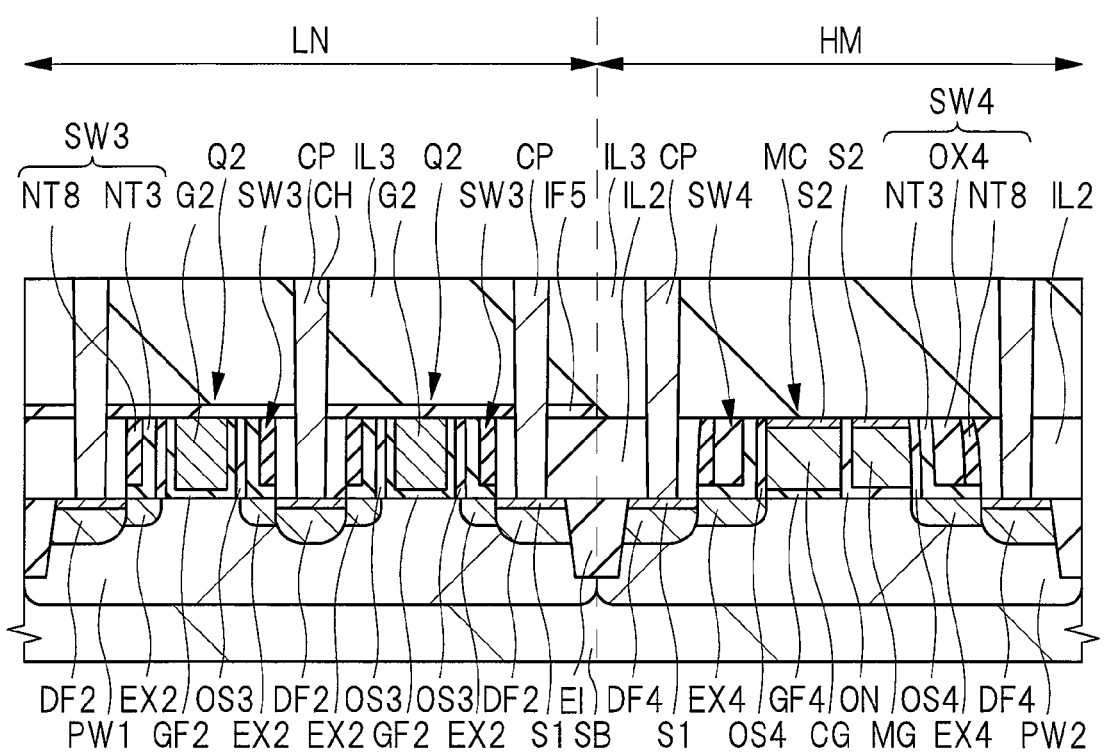
FIG. 58 is a cross-sectional view during a process of manufacturing a modification example 1 of a semiconductor device according to the second embodiment.

Hereinafter, a description will be given regarding a process of manufacturing a semiconductor device according to Modification Example 1 of the second embodiment with reference to FIG. 58. FIG. 58 is a cross-sectional view during the process of manufacturing the semiconductor device according to Modification Example 1. FIG. 58 is the cross-sectional view illustrating the logic circuit region LN and the memory cell region HM similarly to FIG. 20.

Here, the case of forming a metal gate electrode using the gate-last process will be described. In addition, the description will be given here regarding the case of combining the above-described third method of forming the offset spacer that has been described with reference to FIGS. 46 to 50 and the method of forming the sidewall whose outer portion is made of the silicon nitride film which has been described with reference to FIGS. 53 and 54. FIG. 58, used to describe processes after forming the offset spacer, illustrates each of the offset spacers OS3 and OS4 actually having a stacked structure (see FIG. 50) as a single film in order to facilitate understanding of the drawings.

In addition, each manufacturing process in the logic circuit region LP and the I/O region HV (see FIG. 1) will not be described in FIG. 51 and only the logic circuit region LN and the memory cell region HM will be illustrated.

In Modification Example 1, the same processes as the processes that have been described with reference to FIGS. 1 to 3 and 31 to are performed, thereby forming various gate electrodes as illustrated in FIG. 58. Then, the same processes as the processes that have been described with reference to FIGS. 46 to 50 are performed, thereby forming the offset spacers OS3 and OS4. Thereafter, the semiconductor device according to Modification Example 1 is completed by performing the same processes as the processes that have been described with reference to FIGS. 20 to 22 and then the same processes as the processes that have been described with reference to FIGS. 53 to 55.

In Modification Example 1, it is possible to prevent the gap between the dummy gate electrodes DG2 from being completely embedded at the time of forming the silicon nitride film NT3 and the silicon oxide film OX4 by performing the same process as the process that has been described with reference to FIG. 22. Accordingly, the removal failure of the insulating film, which has been described using the comparative example in FIG. 68, does not occur, and thus, it is possible to form a desired diffusion layer in the logic circuit region LN in an ion implantation process which is performed after the process that has been described with reference to FIG. 54.

In addition, it is possible to prevent generation of variation in width of the sidewall SW3 beside the gate electrode G2. In addition, it is possible to prevent the recess of the main surface of the semiconductor substrate SB in the process of removing the silicon nitride film NT3 (see FIG. 54) that is caused when a part of the silicon nitride film NT3 is excessively removed in the process of removing the silicon oxide film OX4 (see FIG. 22). Accordingly, it is possible to improve the reliability of the semiconductor device.

In addition, it is possible to secure the breakdown voltage of the high breakdown voltage MISFET and to narrow the interval between the source and drain regions of the low breakdown voltage MISFET by forming the sidewalls SW3 and SW4 having different widths. Thus, it is possible to realize the improvement in integration degree, the low power consumption, and the high-speed operation of the low breakdown voltage MISFET.

Figure 59:
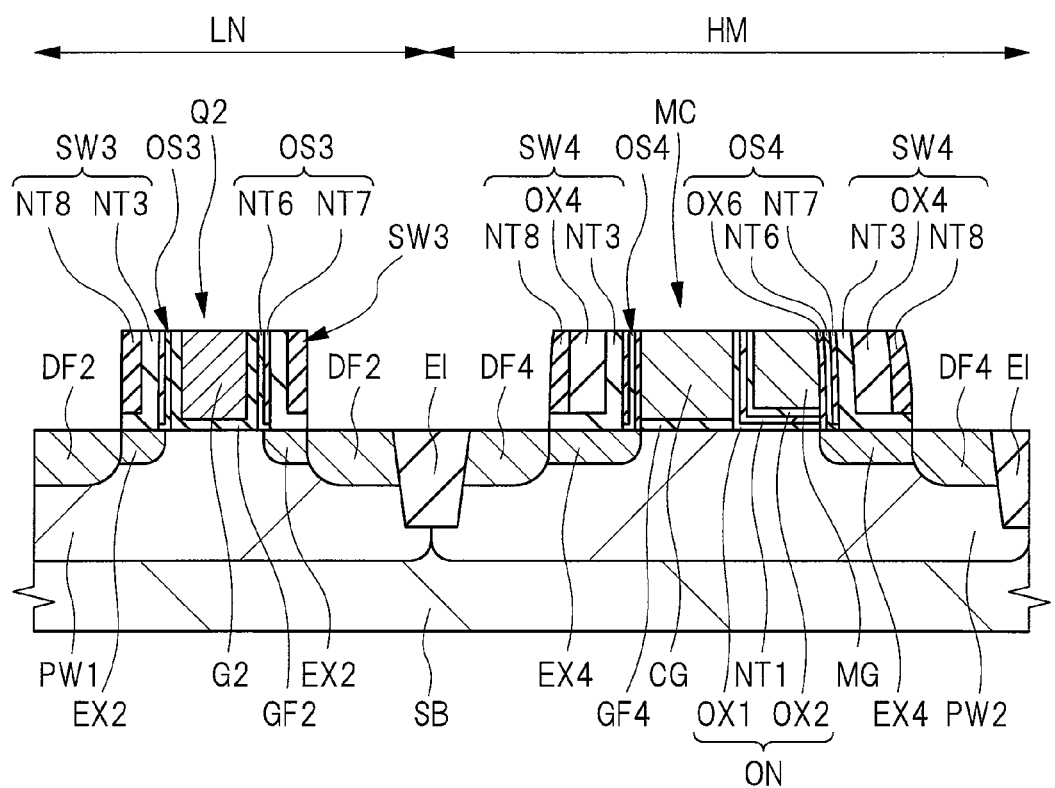
FIG. 59 is a cross-sectional view illustrating a part of FIG. 58 in an enlarged manner.

Here, FIG. 59 illustrates a cross-sectional view of the MISFET Q2 and the memory cell MC formed through the above-described manufacturing process in an enlarged manner. That is, FIG. 59 is the cross-sectional view illustrating a part of FIG. 58 in an enlarged manner. FIG. 59 illustrates the stacked structure of the ONO film ON and each stacked structure of the offset spacers OS3 and OS4 in detail. In addition, FIG. 59 does not illustrate the silicide layers S1 and S2, the interlayer insulating films IL2 and IL3, and the contact plug CP. As illustrated in FIG. 59, the sidewall SW3, formed of the silicon nitride films NT3 and NT8, is formed over sidewalls of the stacked film including the insulating film HK and the metal film MF with the offset spacer OS3, formed of the silicon nitride films NT6 and NT7, interposed therebetween in the logic circuit region LN.

That is, the offset spacer OS3, which is adjacent to the insulating film HK serving as the high-k film and the metal film MF forming the metal gate electrode, is formed only of the silicon nitride films NT6 and NT7. In addition, the sidewall SW3, which covers the sidewall of the stacked film formed of the insulating film HK and the metal film MF, is formed only of the silicon nitride films NT3 and NT8. That is, the offset spacer OS3 and the sidewall SW3 do not include the silicon oxide film. Thus, it is possible to prevent oxygen from intruding into the insulating film HK and the metal film MF from the offset spacer OS3 and the sidewall SW3, and thus, it is possible to prevent the change in properties of the element due to the reaction between the oxygen and the insulating film HK or the metal film MF. Accordingly, it is possible to improve the reliability of the semiconductor device.

In addition, the sidewalls of the silicon nitride film NT1 forming the ONO film ON is in contact with the silicon oxide film OX6 forming the offset spacer OS4 and is not in contact with the silicon nitride film as illustrated in FIG. 59. Accordingly, it is possible to obtain the effect which is obtained when the silicon nitride film is not in contact with the ONO film. That is, it is possible to prevent the threshold voltage of the MISFET, which forms the memory cell MC, from abnormally increasing due to the storage of the charge inside the offset spacer OS4 in the vicinity of the ONO film ON during the programming operation of the memory cell MC since the sidewall of the silicon nitride film NT1 forming the ONO film ON is in contact only with the silicon oxide film OX6 covering the sidewall.

<Modification Example 2>

Figure 60:
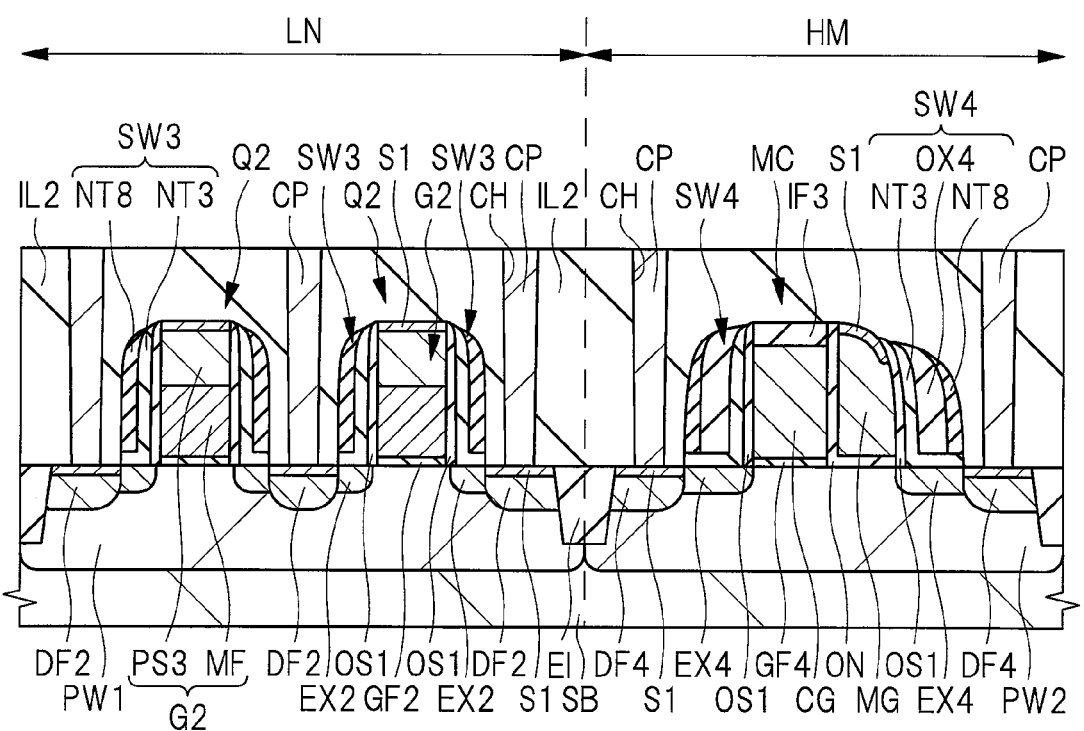
FIG. 60 is a cross-sectional view during a process of manufacturing a modification example 2 of a semiconductor device according to the second embodiment.

Hereinafter, a description will be given regarding a process of manufacturing a semiconductor device according to Modification Example 2 of the second embodiment with reference to FIG. 60. FIG. 60 is a cross-sectional view during the process of manufacturing the semiconductor device according to Modification Example 2. FIG. 60 is the cross-sectional view illustrating the logic circuit region LN and the memory cell region HM similarly to FIG. 20.

Here, the case of forming a metal gate electrode using the gate-first process will be described. In addition, the description will be given here regarding the case of combining the above-described first method of forming the offset spacer that has been described with reference to FIGS. 13 to 19 and the method of forming the sidewall whose outer portion is made of the silicon nitride film which has been described with reference to FIGS. 53 and 54.

FIG. 60, used to describe processes after forming the offset spacer, illustrates the offset spacer OS1 actually having a stacked structure (see FIG. 19) as a single film in order to facilitate understanding of the drawings. In addition, each manufacturing process in the logic circuit region LP and the I/O region HV will not be described in FIG. 60 and only the logic circuit region LN and the memory cell region HM will be illustrated.

In Modification Example 2, various gate electrodes and the offset spacer OS1 are formed by performing the same processes as the processes that have been described with reference to FIGS. 1 to 19, and the sidewalls SW3 and SW4 are formed by performing the same processes as the processes that have been described with reference to FIGS. 20 to 22, 53 and 54 as illustrated in FIG. 60. Subsequently, the semiconductor device according to Modification Example 2 illustrated in FIG. 60 is completed by performing the processes that have been described with reference to FIGS. 25 to 28.

In Modification Example 2, it is possible to prevent the gap between the dummy gate electrodes DG2 from being completely embedded at the time of forming the silicon nitride film NT3 and the silicon oxide film OX4 by performing the same process as the process that has been described with reference to FIG. 22. Accordingly, the removal failure of the insulating film, which has been described using the comparative example in FIG. 68, does not occur, and thus, it is possible to form a desired diffusion layer in the logic circuit region LN in an ion implantation process which is performed after the process that has been described with reference to FIG. 54.

In addition, it is possible to prevent generation of variation in width of the sidewall SW3 beside the gate electrode G2. In addition, it is possible to prevent the recess of the main surface of the semiconductor substrate SB in the process of removing the silicon nitride film NT3 (see FIG. 54) that is caused when a part of the silicon nitride film NT3 is excessively removed in the process of removing the silicon oxide film OX4 (see FIG. 22). Accordingly, it is possible to improve the reliability of the semiconductor device.

In addition, it is possible to secure the breakdown voltage of the high breakdown voltage MISFET and to narrow the interval between the source and drain regions of the low breakdown voltage MISFET by forming the sidewalls SW3 and SW4 having different widths. Thus, it is possible to realize the improvement in integration degree, the low power consumption, and the high-speed operation of the low breakdown voltage MISFET.

Figure 61:
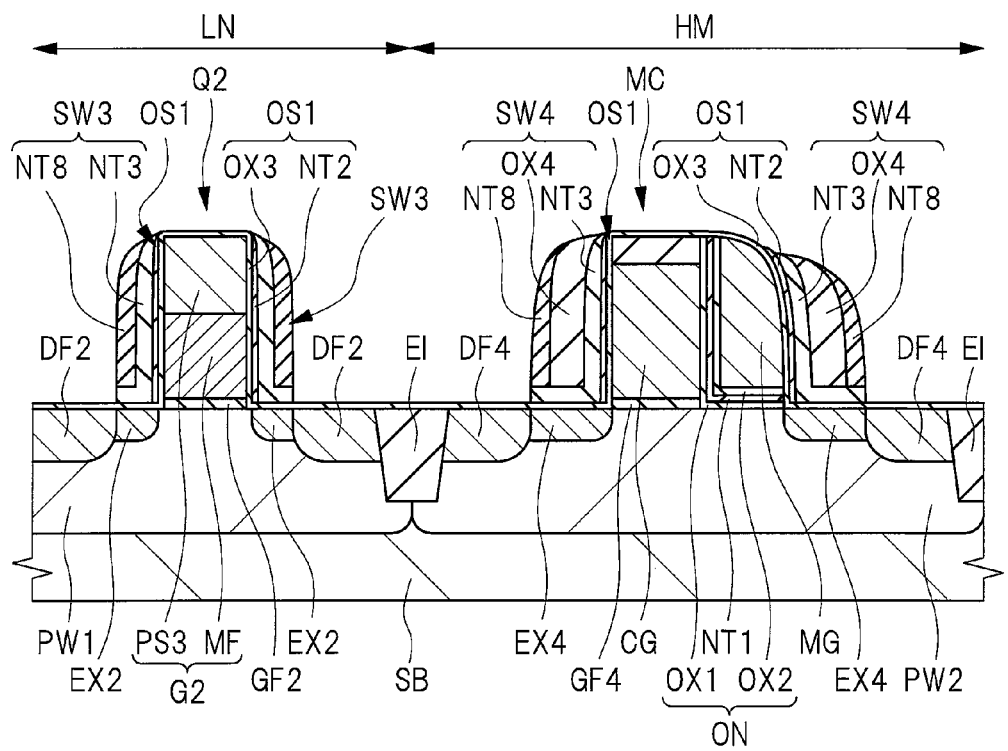
FIG. 61 is a cross-sectional view illustrating a part of FIG. 60 in an enlarged manner.

Here, FIG. 61 illustrates a cross-sectional view of the MISFET Q2 and the memory cell MC formed through the above-described manufacturing process in an enlarged manner. That is, FIG. 61 is the cross-sectional view illustrating a part of FIG. 60 in an enlarged manner. FIG. 61 illustrates the stacked structure of the ONO film ON and the stacked structure of the offset spacer OS1 in detail. In addition, FIG. 61 does not illustrate the silicide layer S1, the interlayer insulating film IL2, and the contact plug CP.

Here, it is possible to obtain the effect that is obtained when the silicon nitride film is not in contact with the ONO film. That is, it is possible to prevent the threshold voltage of the MISFET, which forms the memory cell MC, from abnormally increasing due to the storage of the charge inside the offset spacer OS1 in the vicinity of the ONO film ON during the programming operation of the memory cell MC since the sidewall of the silicon nitride film NT1 forming the ONO film ON is in contact only with the silicon oxide film OX3 covering the sidewall.

In addition, it is possible to use a part of the silicon oxide film OX3 (see FIG. 61), whose film type is different from the silicon nitride film NT3, as the etching stopper film in the etchback process of the silicon nitride film NT3 that has been described with reference to FIG. 54, and thus, it is possible to perform the highly accurate etching.

In the foregoing, the invention made by the present inventor has been concretely described based on the embodiments. However, it is needless to say that the present invention is not limited to the foregoing embodiments and various modifications and alterations can be made within the scope of the present invention.

Although the description has been given regarding the case of forming the gate insulating film including the high-k film and the metal gate in the logic circuit region in the first and second embodiments, for example, the gate insulating film does not necessarily include the high-k film and the gate electrode may be formed only using polysilicon. In this case, however, it is difficult to obtain the effect of preventing the intrusion of oxygen into the high-k film and the metal gate electrode in the structure that has been described with reference to FIG. 56 in the second embodiment.

It is possible to form the gate insulating film that does not include the high-k film and the polysilicon gate electrode using the method of forming the dummy gate electrode that has been described with reference to FIGS. 31 to 33, for example. Thereafter, a semiconductor device is completed by performing the processes that have been described with reference to FIGS. 13 to 28.

What is claimed is:

1. A method of manufacturing a semiconductor device comprising:
    (a) preparing a semiconductor substrate;
    (b) forming a plurality of first gate electrodes on the semiconductor substrate in a first region with a first insulating film interposed therebetween, and forming a second gate electrode on the semiconductor substrate in a second region with a second insulating film interposed therebetween;

(c) forming a third insulating film and a fourth insulating film, which cover the plurality of first gate electrodes and the second gate electrode, sequentially on the semiconductor substrate;

(d) removing a part of the fourth insulating film by etchback to expose an upper surface of the third insulating film from the fourth insulating film and to leave the fourth insulating film which covers each sidewall of the plurality of first gate electrodes and the second gate electrode;

(e) removing the fourth insulating film which covers the respective sidewalls of the plurality of first gate electrodes after the operation (d);

(f) forming a fifth insulating film, which covers the plurality of first gate electrodes, the second gate electrode, and the fourth insulating film in the second region, on the semiconductor substrate after the operation (e);

(g) removing each part of the fifth insulating film and the third insulating film by etchback to expose the semiconductor substrate from the third insulating film, and forming a first sidewall, which includes the third insulating film and the fifth insulating film in the first region, and a second sidewall which includes the third insulating film, the fourth insulating film, and the fifth insulating film in the second region;

(h) forming first source and drain regions on a main surface of the semiconductor substrate in the first region by performing ion implantation using the first sidewall as a mask, and forming a first transistor which includes the first source and drain regions and the first gate electrode; and (i) forming second source and drain regions on the main surface of the semiconductor substrate in the second region by performing ion implantation using the second sidewall as a mask, and forming a second transistor which includes the second source and drain regions and the second gate electrode, wherein the first transistor is driven with a lower voltage than the second transistor, wherein the first insulating film, the second insulating film, the plurality of first gate electrodes, and the second gate electrode are formed in the operation (b), and a third gate electrode is formed on the semiconductor substrate in the second region with the third insulating film including a charge storage film interposed therebetween, the second gate electrode and the third gate electrode are adjacent to each other with the third insulating film interposed therebetween, the third insulating film and the fourth insulating film which cover the third gate electrode are formed in the operation (c), a part of the fourth insulating film is removed to leave the fourth insulating film, which covers the respective sidewalls of the plurality of first gate electrodes and one of the sidewalls of the second gate electrode, and to leave the fourth insulating film, which covers the other of sidewalls of the second gate electrode with the third gate electrode interposed therebetween, in the operation (d), the fifth insulating film, which covers the third gate electrode, is formed in the operation (f), a third transistor including the second transistor, the second source and drain regions, and the third gate electrode is formed in operation (i), the second transistor and the third transistor form a memory cell, wherein the method of manufacturing the semiconductor device further comprises:

(b1) forming a first silicon oxide film and a first silicon nitride film, which cover the plurality of first gate electrodes and the second gate electrode, sequentially on the semiconductor substrate after the operation (b); and (b2) removing a part of the first silicon nitride film by etchback before the operation (c) to expose the first silicon oxide film, and forming a first offset spacer including the first silicon oxide film and the first silicon nitride film, which cover the respective sidewalls of the plurality of first gate electrodes and the second gate electrode.

2. The method of manufacturing a semiconductor device according to claim 1,
wherein a distance between neighboring first gate electrodes is larger than twice of a total film thickness of the third insulating film and the fourth insulating film.

3. The method of manufacturing a semiconductor device according to claim 2,
wherein a width dimension of the second sidewall in a direction along the main surface of the semiconductor substrate is equal to or larger than a half of the distance between the neighboring first gate electrodes.

4. The method of manufacturing a semiconductor device according to claim 1,
wherein the third insulating film is a silicon nitride film, and the fourth insulating film and the fifth insulating film are silicon oxide films.

5. The method of manufacturing a semiconductor device according to claim 1,
wherein the third insulating film and the fifth insulating film are silicon nitride films, and the fourth insulating film is a silicon oxide film.

6. The method of manufacturing a semiconductor device according to claim 1,
wherein the first insulating film has a higher dielectric constant than silicon nitride or the first gate electrode contains metal.

7. The method of manufacturing a semiconductor device according to claim 6,
wherein the third insulating film and the fifth insulating film are silicon nitride films, and the fourth insulating film is a silicon oxide film.

8. A method of manufacturing a semiconductor device comprising:

(a) preparing a semiconductor substrate;

(b) forming a plurality of dummy gate electrodes on the semiconductor substrate in a first region with a first insulating film interposed therebetween, and forming a first gate electrode on the semiconductor substrate in a second region with a second insulating film interposed therebetween;

(c) forming a third insulating film and a fourth insulating film, which cover the plurality of dummy gate electrodes and the first gate electrode, sequentially on the semiconductor substrate;

(d) removing a part of the fourth insulating film by etchback to expose an upper surface of the third insulating film from the fourth insulating film and to leave the fourth insulating film which covers each sidewall of the plurality of dummy gate electrodes and the first gate electrode;

(e) removing the fourth insulating film which covers the respective sidewalls of the plurality of dummy gate electrodes after the operation (d);
(f) forming a fifth insulating film, which covers the plurality of dummy gate electrodes, the first gate electrode, and the fourth insulating film in the second region, on the semiconductor substrate after the operation (e);
(g) removing each part of the fifth insulating film and the third insulating film by etchback to expose the semiconductor substrate from the third insulating film, and forming a first sidewall, which includes the third insulating film and the fifth insulating film in the first region, and a second sidewall which includes the third insulating film, the fourth insulating film, and the fifth insulating film in the second region;
(h) forming first source and drain regions on a main surface of the semiconductor substrate in the first region by performing ion implantation using the first sidewall as a mask; and
(i) forming second source and drain regions on the main surface of the semiconductor substrate in the second region by performing ion implantation using the second sidewall as a mask, and forming a first transistor which includes the second source and drain regions and the first gate electrode,
(j) forming an interlayer insulating film which covers the plurality of dummy gate electrodes and the first gate electrode after the operation (i), and then, polishing an upper surface of the interlayer insulating film to expose the dummy gate electrode;
(k) removing the dummy gate electrode after the operation (j) to form a trench; and
(l) forming a second gate electrode which contains a metal inside the trench to form a second transistor which includes the first source and drain regions and the second gate electrode,
wherein the second transistor is driven with a lower voltage than the first transistor
wherein the first insulating film, the second insulating film, the plurality of dummy gate electrodes, and the first gate electrode are formed in the operation (b), and a third gate electrode is formed on the semiconductor substrate in the second region with the third insulating film including a charge storage film interposed therebetween,
the first gate electrode and the third gate electrode are adjacent to each other with the third insulating film interposed therebetween,
the third insulating film and the fourth insulating film which cover the third gate electrode are formed in the operation (c),
a part of the fourth insulating film is removed in the operation (d) to leave the fourth insulating film, which covers the respective sidewalk of the plurality of dummy gate electrodes and one of the sidewalk of the first gate electrode, and to leave the fourth insulating film, which covers the other of the sidewalls of the first gate electrode with the third gate electrode interposed therebetween,
the fifth insulating film, which covers the third gate electrode, is formed in the operation (f),
a third transistor including the first transistor, the second source and drain regions, and the third gate electrode is formed in the operation (i), and
the first transistor and the third transistor form a memory cell,
wherein the method of manufacturing the semiconductor device further comprises:
(b1) forming a first silicon oxide film and a first silicon nitride film, which cover the plurality of dummy gate electrodes and the first gate electrode, sequentially on the semiconductor substrate after the operation(b); and
(b2) removing a part of the first silicon nitride film by etchback before the operation (c) to expose the first silicon oxide film, and forming a first offset spacer including the first silicon oxide film and the first silicon nitride film, which cover the respective sidewalk of the plurality of dummy gate eletrode and the first gate electrode.

9. The method of manufacturing a semiconductor device according to claim 8,
wherein a distance between neighboring dummy gate electrodes is larger than twice of a total film thickness of the third insulating film and the fourth insulating film.

10. The method of manufacturing a semiconductor device according to claim 8,
wherein a width dimension of the second sidewall in a direction along the main surface of the semiconductor substrate is equal to or larger than a half of a distance between the neighboring dummy gate electrodes.

11. The method of manufacturing a semiconductor device according to claim 8,
wherein the third insulating film is a silicon nitride film, and the fourth insulating film and the fifth insulating film are silicon oxide films.

12. The method of manufacturing a semiconductor device according to claim 8,
wherein the third insulating film and the fifth insulating film are silicon nitride films, and the fourth insulating film is a silicon oxide film.

13. A method of manufacturing a semiconductor device comprising:
(a) preparing a semiconductor substrate;
(b) forming a plurality of first gate electrodes on the semiconductor substrate in a first region with a first insulating film interposed therebetween, and forming a second gate electrode on the semiconductor substrate in a second region with a second insulating film interposed therebetween;
(c) forming a third insulating film and a fourth insulating film, which cover the plurality of first gate electrodes and the second gate electrode, sequentially on the semiconductor substrate;
(d) removing a part of the fourth insulating film by etchback to expose an upper surface of the third insulating film from the fourth insulating film and to leave the fourth insulating film which covers each sidewall of the plurality of first gate electrodes and the second gate electrode;
(e) removing the fourth insulating film which covers the respective sidewalls of the plurality of first gate electrodes after the operation (d);
(f) forming a fifth insulating film, which covers the plurality of first gate electrodes, the second gate electrode, and the fourth insulating film in the second region, on the semiconductor substrate after the operation (e);
(g) removing each part of the fifth insulating film and the third insulating film by etchback to expose the semiconductor substrate from the third insulating film, and forming a first sidewall, which includes the third insulating film and the fifth insulating film in the first region, and a second sidewall which includes the third insulating film, the fourth insulating film, and the fifth insulating film in the second region;
- (h) forming first source and drain regions on a main surface of the semiconductor substrate in the first region by performing ion implantation using the first sidewall as a mask, and forming a first transistor which includes the first source and drain regions and the first gate electrode; and
- (i) forming second source and drain regions on the main surface of the semiconductor substrate in the second region by performing ion implantation using the second sidewall as a mask, and forming a second transistor which includes the second source and drain regions and the second gate electrode, wherein the first transistor is driven with a lower voltage than the second transistor, wherein the first insulating film, the second insulating film, the plurality of first gate electrodes, and the second gate electrode are formed in the operation (b), and a third gate electrode is formed on the semiconductor substrate in the second region with the third insulating film including a charge storage film interposed therebetween, the second gate electrode and the third gate electrode are adjacent to each other with the third insulating film interposed therebetween, the third insulating film and the fourth insulating film which cover the third gate electrode are formed in the operation (c), a part of the fourth insulating film is removed to leave the fourth insulating film, which covers the respective sidewalls of the plurality of first gate electrodes and one of the sidewalls of the second gate electrode, and to leave the fourth insulating film, which covers the other of sidewalls of the second gate electrode with the third gate electrode interposed therebetween, in the operation (d), the fifth insulating film, which covers the third gate electrode, is formed in the operation (f), a third transistor including the second transistor, the second source and drain regions, and the third gate electrode is formed in operation (i), the second transistor and the third transistor form a memory cell, wherein the method of manufacturing the semiconductor device further comprises:
- (b1) forming a sidewall-shaped second silicon oxide film which covers the respective sidewalls of the plurality of first gate electrodes and the second gate electrode after the operation (b);
- (b2) removing the second silicon oxide film which covers the respective sidewalls of the plurality of first gate electrodes;
- (b3) forming a second silicon nitride film and a third silicon nitride film, which cover the plurality of first gate electrodes, the second gate electrode, and the second silicon oxide film, sequentially on the semiconductor substrate after the operation (b2); and
- (b4) removing each part of the third silicon nitride film and the second silicon nitride film by etchback before the operation (c) to expose the semiconductor substrate from the second silicon nitride film, and forming a second offset spacer and a third offset spacer, the second offset spacer including the second silicon nitride film and the third silicon nitride film, which cover the respective sidewalls of the plurality of first gate electrodes, and the third offset spacer including the second silicon oxide film, the second silicon nitride film, and the third silicon nitride film, which covers the sidewalls of the second gate electrode.

14. A method of manufacturing a semiconductor device comprising:
- (a) preparing a semiconductor substrate;
- (b) forming a plurality of first gate electrodes on the semiconductor substrate in a first region with a first insulating film interposed therebetween, and forming a second gate electrode on the semiconductor substrate in a second region with a second insulating film interposed therebetween;
- (c) forming a third insulating film and a fourth insulating film, which cover the plurality of first gate electrodes and the second gate electrode, sequentially on the semiconductor substrate;
- (d) removing a part of the fourth insulating film by etchback to expose an upper surface of the third insulating film from the fourth insulating film and to leave the fourth insulating film which covers each sidewall of the plurality of first gate electrodes and the second gate electrode;
- (e) removing the fourth insulating film which covers the respective sidewalls of the plurality of first gate electrodes after the operation (d);
- (f) forming a fifth insulating film, which covers the plurality of first gate electrodes, the second gate electrode, and the fourth insulating film in the second region, on the semiconductor substrate after the operation (e);
- (g) removing each part of the fifth insulating film and the third insulating film by etchback to expose the semiconductor substrate from the third insulating film, and forming a first sidewall, which includes the third insulating film and the fifth insulating film in the first region, and a second sidewall which includes the third insulating film, the fourth insulating film, and the fifth insulating film in the second region;
- (h) forming first source and drain regions on a main surface of the semiconductor substrate in the first region by performing ion implantation using the first sidewall as a mask, and forming a first transistor which includes the first source and drain regions and the first gate electrode; and
- (i) forming second source and drain regions on the main surface of the semiconductor substrate in the second region by performing ion implantation using the second sidewall as a mask, and forming a second transistor which includes the second source and drain regions and the second gate electrode, wherein the first transistor is driven with a lower voltage than the second transistor, wherein the first insulating film has a higher dielectric constant than silicon nitride or the first gate electrode contains metal, wherein the third insulating film and the fifth insulating film are silicon nitride films, and the fourth insulating film is a silicon oxide film, wherein the method of manufacturing the semiconductor device further comprises:
- (b1) forming a fourth silicon nitride film and a fifth silicon nitride film, which cover the plurality of first gate electrodes and the second gate electrode, sequentially on the semiconductor substrate after the operation (b); and (b2) removing each part of the fifth silicon nitride film and the fourth silicon nitride film by etchback before the operation (c) to expose the semiconductor substrate from the fourth silicon nitride film, and forming a fourth offset spacer including the fourth silicon nitride film and the fifth silicon nitride film, which cover the respective sidewalls of the plurality of first gate electrodes and the second gate electrode.

15. A method of manufacturing a semiconductor device comprising:

(a) preparing a semiconductor substrate;

(b) forming a plurality of dummy gate electrodes on the semiconductor substrate in a first region with a first insulating film interposed therebetween, and forming a first gate electrode on the semiconductor substrate in a second region with a second insulating film interposed therebetween;

(c) forming a third insulating film and a fourth insulating film, which cover the plurality of dummy gate electrodes and the first gate electrode, sequentially on the semiconductor substrate;

(d) removing a part of the fourth insulating film by etchback to expose an upper surface of the third insulating film from the fourth insulating film and to leave the fourth insulating film which covers each sidewall of the plurality of dummy gate electrodes and the first gate electrode;

(e) removing the fourth insulating film which covers the respective sidewalls of the plurality of dummy gate electrodes after the operation (d);

(f) forming a fifth insulating film, which covers the plurality of dummy gate electrodes, the first gate electrode, and the fourth insulating film in the second region, on the semiconductor substrate after the operation (e);

(g) removing each part of the fifth insulating film and the third insulating film by etchback to expose the semiconductor substrate from the third insulating film, and forming a first sidewall, which includes the third insulating film and the fifth insulating film in the first region, and a second sidewall which includes the third insulating film, the fourth insulating film, and the fifth insulating film in the second region;

(h) forming first source and drain regions on a main surface of the semiconductor substrate in the first region by performing ion implantation using the first sidewall as a mask; and (i) forming second source and drain regions on the main surface of the semiconductor substrate in the second region by performing ion implantation using the second sidewall as a mask, and forming a first transistor which includes the second source and drain regions and the first gate electrode, (j) forming an interlayer insulating film which covers the plurality of dummy gate electrodes and the first gate electrode after the operation (i), and then, polishing an upper surface of the interlayer insulating film to expose the dummy gate electrode;

(k) removing the dummy gate electrode after the operation (j) to form a trench; and (l) forming a second gate electrode which contains a metal inside the trench to form a second transistor which includes the first source and drain regions and the second gate electrode, wherein the second transistor is driven with a lower voltage than the first transistor, wherein the third insulating film and the fifth insulating film are silicon nitride films, and the fourth insulating film is a silicon oxide film, wherein the method of manufacturing a semiconductor device further comprises:

(b1) forming a second silicon nitride film and a third silicon nitride film, which cover the plurality of dummy gate electrodes and the first gate electrode, sequentially on the semiconductor substrate after the operation (b); and (b2) removing each part of the third silicon nitride film and the second silicon nitride film by etchback before the operation (c) to expose the semiconductor substrate from the second silicon nitride film, and forming a second offset spacer including the second silicon nitride film and the third silicon nitride film, which cover the respective sidewalls of the plurality of dummy gate electrodes and the first gate electrode.

* * * * *